US009748663B2

(12) United States Patent
Wong

(10) Patent No.: US 9,748,663 B2
(45) Date of Patent: Aug. 29, 2017

(54) METAMATERIAL SUBSTRATE FOR CIRCUIT DESIGN

(71) Applicant: TransSiP, Inc., Irvine, CA (US)

(72) Inventor: Chih Wei Wong, Irvine, CA (US)

(73) Assignee: TRANSSIP, INC., Irvine, CA (US)

( * ) Notice: Subject to any disclaimer, the term of this patent is extended or adjusted under 35 U.S.C. 154(b) by 0 days.

(21) Appl. No.: 15/294,048

(22) Filed: Oct. 14, 2016

(65) Prior Publication Data

US 2017/0033468 A1    Feb. 2, 2017

Related U.S. Application Data

(63) Continuation of application No. PCT/US2015/026733, filed on Apr. 20, 2015.
(Continued)

(51) Int. Cl.
*H01Q 15/02* (2006.01)
*H01Q 21/06* (2006.01)
(Continued)

(52) U.S. Cl.
CPC ....... *H01Q 15/0086* (2013.01); *H01P 1/2005* (2013.01); *H01Q 1/38* (2013.01); *H01Q 19/005* (2013.01)

(58) Field of Classification Search
CPC .... H01Q 15/0086; H01Q 1/38; H01Q 19/005; H01Q 15/02; H01Q 21/06
(Continued)

(56) References Cited

U.S. PATENT DOCUMENTS 6,391,082 B1    5/2002  Holl
6,545,647 B1 *  4/2003  Sievenpiper ......... H01Q 21/245
                                                343/756

(Continued)

FOREIGN PATENT DOCUMENTS

WO    2012/177946 A2    12/2012

OTHER PUBLICATIONS

International Search Report in PCT/US15/26733, dated Aug. 11, 2015, 2 pgs.
(Continued)

*Primary Examiner* — Tho G Phan
(74) *Attorney, Agent, or Firm* — Servilla Whitney LLC

(57) ABSTRACT

This invention enables Frequency Selective Surface ("FSS") and Artificial Magnetic Conductor ("AMC") which exhibits Electromagnetic Band Gap ("EBG") in any of the substrate's layer from a small and thin systems and sub-systems in package to a large-format PCBs. The metamaterial substrate may be integrated with electronic circuit components or buried in PCBs for circuit designs capable of transmitting, receiving and reflecting electromagnetic energy, altering electromagnetic properties of natural circuit materials, enhancing electrical characteristics of electrical components (such as filters, antennas, baluns, power dividers, transmission lines, amplifiers, power regulators, and printed circuits elements) in systems and sub-systems circuit designs. The metamaterial substrate creates new electrical characteristics, properties and systems, sub-systems or component's specification not readily available with conventional circuit materials, substrates, and PCBs. The metamaterial substrate can be less than 70 μm thick and buried into any PCB layer.

57 Claims, 41 Drawing Sheets

Related U.S. Application Data

(60) Provisional application No. 61/981,680, filed on Apr. 18, 2014.

(51) Int. Cl.
*H01Q 15/00* (2006.01)
*H01Q 1/38* (2006.01)
*H01P 1/20* (2006.01)
*H01Q 19/00* (2006.01)

(58) Field of Classification Search
USPC ......... 343/700 MS, 753, 754, 756, 846, 853, 343/909
See application file for complete search history.

(56) References Cited

U.S. PATENT DOCUMENTS

| | | | |
|---|---|---|---|
| 6,567,048 B2 | 5/2003 | McKinzie, III | |
| 6,952,190 B2 * | 10/2005 | Lynch | H01Q 1/28 343/700 MS |
| 7,145,518 B2 * | 12/2006 | Tanaka | H01Q 9/42 343/700 MS |
| 7,855,689 B2 * | 12/2010 | Fukui | H01Q 1/241 343/731 |
| 7,982,673 B2 * | 7/2011 | Orton | H01Q 15/006 343/700 MS |
| 8,242,970 B2 * | 8/2012 | Fukui | H01Q 1/38 343/700 MS |
| 8,981,998 B2 * | 3/2015 | Orime | G01S 7/032 343/700 MS |
| 2010/0109958 A1 | 5/2010 | Haubrich | |
| 2010/0194657 A1 | 8/2010 | Maruyama | |
| 2012/0057616 A1 | 3/2012 | Padilla | |
| 2013/0027848 A1 | 1/2013 | Said | |
| 2013/0050043 A1 | 2/2013 | Gross, III | |
| 2014/0002852 A1 | 1/2014 | Fallon et al. | |

OTHER PUBLICATIONS

Katsuhara, et al., "Novel GPS SiP module with miniaturized substrate by using RF sub-circuit embedding technology", ICIEP 2013 Proceedings, 221-226.

* cited by examiner

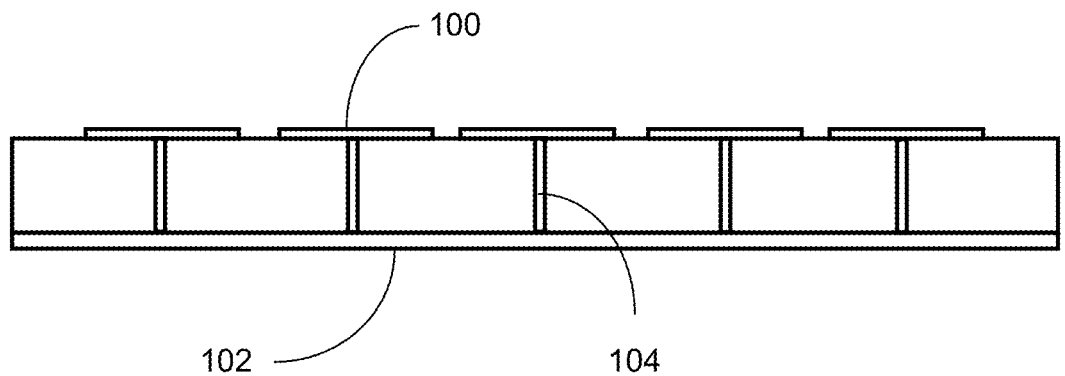
*Prior Art FIG. 1*
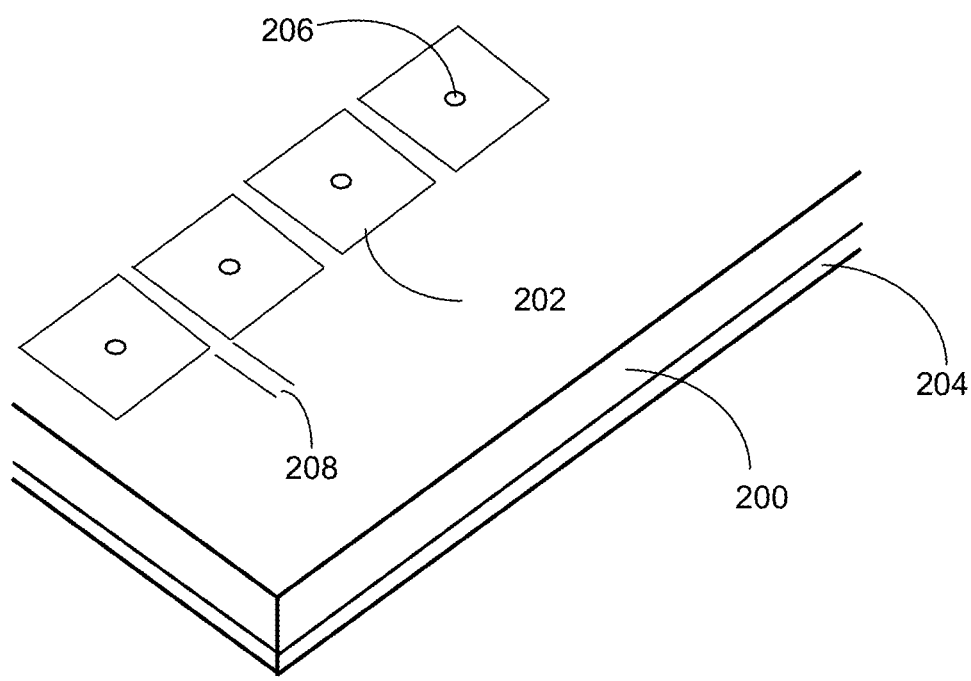
*Prior Art FIG. 2*

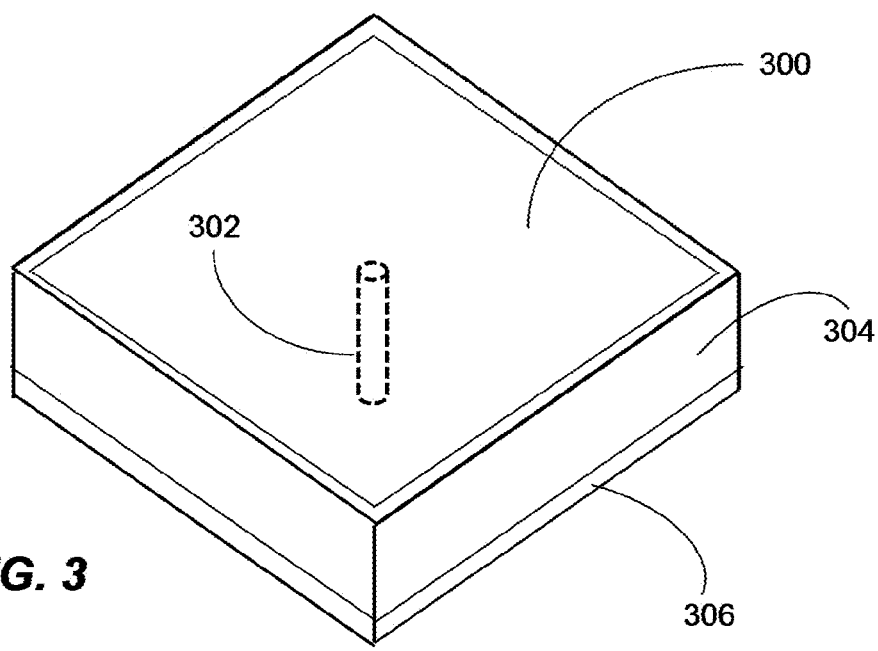
Prior Art FIG. 3
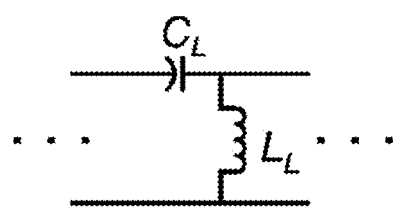
Prior Art FIG. 4
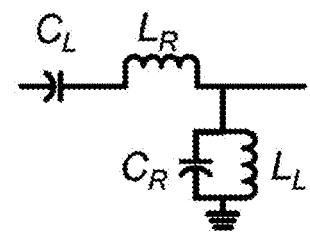
Prior Art FIG. 5

1100
Define a predetermined band gap frequency band of a EBG structure 1000 comprising a periodically arrayed coiled UE 1002, such that a sufficient resonance circuit is formed by a left-handed shunt inductance $L_L$ 1019 and a left-handed series capacitance $C_L$ 1017 along each adjacent UE 1002

1102
First miniaturization to the dielectric thickness $h_r$ 1026 of the EBG structure 1000 by constructing a coplanar inductive element 1018 in the opening 1014 in each of the coiled UE 1002, such that the left-handed shunt inductance $L_L$ 1019 is substantially increased (refer to table 2, paragraphs [085] ~ [095] )

1104
Obtain a first ratio, alpha (refer to table 2)

alpha = $h_r/\lambda o$ where $\lambda o$ is the free space wavelength of at least one use frequency falling within the predetermined band gap frequency band

1106
Second miniaturization to the length L 1010 and width W 1012 with each of the coiled UE 1002 by increasing the relative dielectric permittivity $\varepsilon_r$ of the dielectric 1004 and reducing the distance d 1008 between each adjacent coiled UE 1002, such that the left-handed series capacitance $C_L$ 1017 is substantially increased (refer to table 2, paragraphs [085]~[095])

1108
Obtain a second ratio, beta; and a third ratio, gamma (refer to table 2)

beta = $L/\lambda o$ or $W/\lambda o$ gamma = $d/\lambda o$ where $\lambda o$ is the free space wavelength of at least one use frequency falling within the predetermined band gap frequency band

1110
Third miniaturization feature by obtaining a fourth ratio, delta ,where as delta satisfies the following relationship delta = $d/h_r$ > 1 (refer to table 2)

1112
A substantially small sized and thinner electromagnetic band gap (EBG) structure 1000 for the predetermined band gap frequency band is achieved

*FIG. 11*

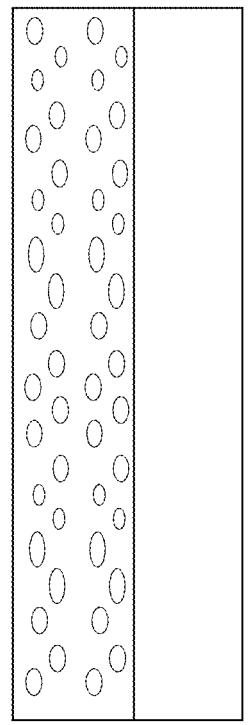
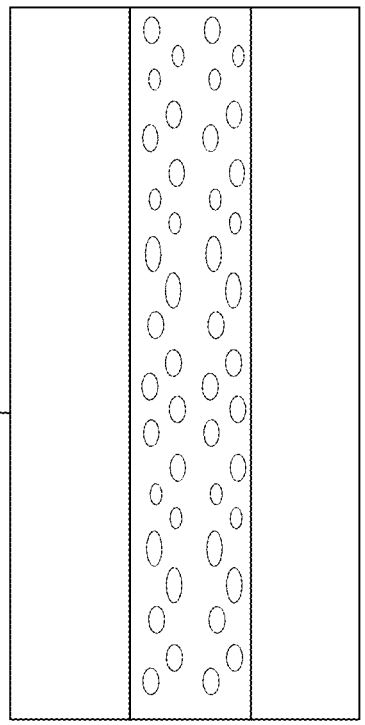
FIG. 47

METAMATERIAL SUBSTRATE FOR CIRCUIT DESIGN

CROSS REFERENCE TO RELATED APPLICATIONS

This application is a continuation of International Application Serial No. PCT/US2015/026733 filed Apr. 20, 2015, which claims the benefit of priority under 35 USC §119(e) to U.S. Provisional Patent Application No. 61/981,680 filed Apr. 18, 2014, the disclosures of which are incorporated herein by reference in their entireties.

BACKGROUND OF THE INVENTION

1. Field of the Invention

This invention provides a metamaterial substrate which may be integrated with electronic circuit components and/or employed as a circuit layer in Printed Circuit Board and Wiring Board (collectively, "PCBs") capable of transmitting, receiving and reflecting electromagnetic energy, altering electromagnetic properties of natural circuit materials, enhancing electrical characteristics of electronic components (such as filters, antennas, baluns, power dividers, transmission lines, amplifiers, power regulators, and printed circuit elements) in systems and sub-systems circuit designs.

2. Related Art

Metamaterials are realized by repeating a basic building block in a specific periodic pattern. The basic building block is known as the Unit Element ("UE"), and it defines the fundamental properties of the metamaterial. Several different designs are possible for UE. For example, one UE is the Sievenpiper mushroom UE, as shown in FIG. 1. The top conductive patch 100 may be connected to the bottom ground plane 102 by a shorting post 104 also known as a via. This configuration can be shown in FIG. 2 where the dielectric material 200 forms a support structure for conductive patches 202 with the bottom ground plane 204. The top conductive patches 202 may be connected to the bottom ground plane 204 by a shorting post 206 also known as a via. Sievenpiper also indicates that when there is a thin structure in the mushroom UE, the bandwidth is also reduced.

FIG. 3 is a prior art perspective view of a mushroom UE having a top conductive patch 300, a via 302, a dielectric substrate 304 and a ground plane 306. FIG. 4 is a simplified electrical model illustrating a left-handed shunt inductance $L_L$ and left-handed series capacitance $C_L$ created by the shorting post 104 or 206 and the gap between each mushroom UE 100 or 202, respectively. The shorting post 104 or 206 provides the inductance $L_L$ which at least in part creates the Electromagnetic Band Gap ("EBG") ground plane or surface. However, an ideal metamaterial mushroom UE cannot be practically/physically realized due to parasitic effects. Likewise, FIG. 5 depicts a general model comprising a series LC resonance circuit and a shunt LC resonance circuit for a mushroom UE.

Demand for connectivity devices is growing at a fast pace, while antenna integration persists as an unsolved "last mile" problem. Small, discrete antennas are commonly made from ceramic dielectric materials in patch or in chip form. Small, discrete antennas can also be made with sheet metal, wire, and can also be printed on Printed Circuit Boards ("PCB"), e.g., as an inverted-F antenna, Planar Inverted-F Antennas ("PIFA") and the like. The size of such antennas can be reduced by using higher relative permittivity ($\in_r$) materials. However, higher $\in_r$ increases dielectric loss that lowers overall antenna efficiency.

Small antennas also can require a large ground plane and may be very sensitive to nearby objects. In addition, small antennas may be sensitive to the size of the ground plane. Thus, ground plane design can play a significant role in the performance of small antennas. When the size of the ground plane does not meet the antenna's specification, the antenna efficiency can be significantly reduced from 80% to only a few percent or even less. Such small antennas may also have a very short range of only one (1) to two (2) meters.

In contrast, standard ceramic patch antennas offer improved performance. However, their large and thick volumetric nature makes them impractical for increasingly compact devices. Some antenna designs have trimmed their sizes down to 9×9 mm. However, such designs suffer from poor efficiency, gain, and narrow bandwidth. Moreover, miniaturized patch antennas behave like capacitors, needing a large ground plane, thus defeating the goal of miniaturization.

Increasingly small size end-products employ radio "cohabitation"—that is, more than one transmitter and receiver. These designs mix and match of multiple wireless connectivity technologies in one design. Cohabitation can suffer from inadequate receive signal level, high coupling between antennas, and increased signal errors, in addition to undesirable and unintentional interference within the design.

Active integrated electronic antennas with embedded electronic circuits (e.g., LNA, filters, etc.) attempt to mitigate the degradation caused by radio cohabitation. Many active integrated electronic antenna modules are made with a patch antenna(s) on one side of a PCB and the electronic circuits on the other side, shielded with a metal lid. Such antennas can be assembled with a coaxial cable and RF connector for external connection and antenna separation. However, the results are large, bulky, and expensive antenna systems.

Other challenges associated with multiple antennas spaced closely in a small device include strong mutual coupling and cross polarization distortion that result in a distorted radiation pattern(s) and decreased channel capacity. Achieving high isolation between closely-packed antenna elements can be difficult in small devices and impractical in antenna modules.

Mushroom UE can be fabricated as a planar 2-dimensional periodic array of elements, to form a Frequency Selective Surface ("FSS") or Artificial Magnetic Conductor ("AMC") based metamaterial. FSS-based or AMC-based metamaterials can be modelled with an equivalent LC circuit similar to the FIG. 5. At higher frequencies such as those in the microwave and radio frequency bands, distribution characteristics of the L & C for the UEs can be engineered to create an Electromagnetic Band Gap ("EBG") at a defined range of frequencies thereby suppressing surface wave propagation within a prescribed range. These "forbidden operating frequencies" are frequencies at which surface waves generated between the antenna and the ground plane are formed inside the dielectric. Surface waves may be 180° out of phase with the desired radiation of the antenna, and the resulting destructive interference may impair antenna efficiency, gain, and bandwidth.

As an improvement over a conventional metal ground plane, the FSS or AMC surface exhibits EBG characteristics (collectively, EBG surface or EBG ground plane) may be operated as a new type of ground plane for low-profile integration of wire antennas. For example, even when a horizontal wire antenna is extremely close to an EBG surface, the current through the antenna and its image current through the ground plane are in-phase (rather than out-of phase), thereby advantageously strengthening the radiation. The useful bandwidth of an EBG ground plane or surface is generally defined as +90° to −90° phase difference on either side of the central frequency. The structure may be used in applications such as microwave circuits and antennas.

For antenna applications in the Industrial, Scientific and Medical ("ISM") band of 2.4 GHz an EBG ground plane may be made to cover a frequency range from about 2 GHz to 3 GHz. Typical sizes of the mushroom UE made with microwave grade dielectric material according to the characteristics are shown in Table 1.

TABLE 1

| | Mushroom Patch Size (mm) | Gap (d) (mm) | Thickness (h) (mm) | Band-gap (GHz) |
|---|---|---|---|---|
| | 15 | 1.5 | 3 | 2~3 |
| Compare to free space wavelength | $0.1 \lambda_o$ ($\frac{1}{8} \lambda_o$) | $0.01 \lambda_o$ ($\frac{1}{80} \lambda_o$) | $0.02 \lambda_o$ ($\frac{1}{40} \lambda_o$) | |

A need exists to overcome the electric and magnetic limits imposed on System in Package ("SiP") designers by natural dielectric materials thereby transcending the limitations of the electric and magnetic properties that are inherent in small package designs. UEs as described above may be used to create metamaterials layers suitable for use in SIP designs integrating antennas, power lines, noise suppression filters, radio frequency ("RF") power splitters, inductors, Surface Acoustic Wave ("SAW") filters, oscillators, and other electronic circuits more easily, at lower cost, and with increased functionality and reliability. Overcoming the challenges presented by the limitations of electric and magnetic properties of small package designs will lead to the development of active integrated electronic antenna and filter technologies for SiP designers and enable massive participation for the rapid growth of wireless connectivity technologies such as Bluetooth v4.0, Wi-Fi, Near Field Communications, GPS, Ultra-Wide Band ("UWB"), ISM wireless modems, 802.15.4/ZigBee and wireless charging (e.g., Qi/A4WP), and future derivatives of these technologies and standards.

SUMMARY

This invention provides a metamaterial substrate which may be integrated with electronic circuit components or embedded in PCBs for circuit designs capable of transmitting, receiving and reflecting electromagnetic energy, altering electromagnetic properties of natural circuit materials, enhancing electrical characteristics of electrical components (such as filters, antennas, baluns, power dividers, transmission lines, amplifiers, power regulators, and printed circuit elements) in systems and sub-systems circuit designs.

This metamaterial substrate is generally as thin or thinner than conventional printed circuit dielectric layers and therefore can be incorporated in the buildup of a device's substrate as well as used as a discrete layer in multi-layer, large format Printed Circuit Boards ("PCB") built by sequentially laminating and patterning or mass-laminating pre-patterned dielectric layers. The metamaterial substrate can also be made small enough to be combined with small electronic components, modules and System-in-Package ("SiP") devices to create new electrical characteristics, properties and systems, sub-systems or component specifications not readily available with conventional circuit materials, substrates, and PCBs. The metamaterial substrate can be less than 70 µm thick and located on any layer of a printed circuit board. Specifically, this invention creates a Frequency Selective Surface ("FSS") and Artificial Magnetic Conductor ("AMC") which generates an Electromagnetic Band Gap ("EBG") on one or more layers of an interconnecting substrate used in small and thin electronic systems and subsystems, as well as systems-in-package and large-format PCBs.

Other systems, methods, features, and advantages of the invention will be or will become apparent to one with skill in the art upon examination of the following figures and detailed description. It is intended that all such additional systems, methods, features and advantages be included within this description, be within the scope of the invention, and be protected by the accompanying claims.

DETAILED DESCRIPTION OF THE DRAWINGS

The components in the figures are not necessarily to scale, emphasis being placed instead upon illustrating the principles of the invention. In the figures, like reference numerals designate corresponding parts throughout the different views.

FIG. 1 is a prior art side view of a mushroom type UE.

FIG. 2 is a prior art FSS illustrating a plurality of mushroom type UE.

FIG. 3 is a prior art perspective view of a mushroom type UE.

FIG. 4 is a simplified electrical model of a mushroom type UE.

FIG. 5 is a composite electrical model of a mushroom type UE.

FIG. 11 summarizes steps taken in miniaturizing the EBG structure demonstrated in FIGS. 10A-10D and Table 2 in accordance with the invention.

Figure 10A:
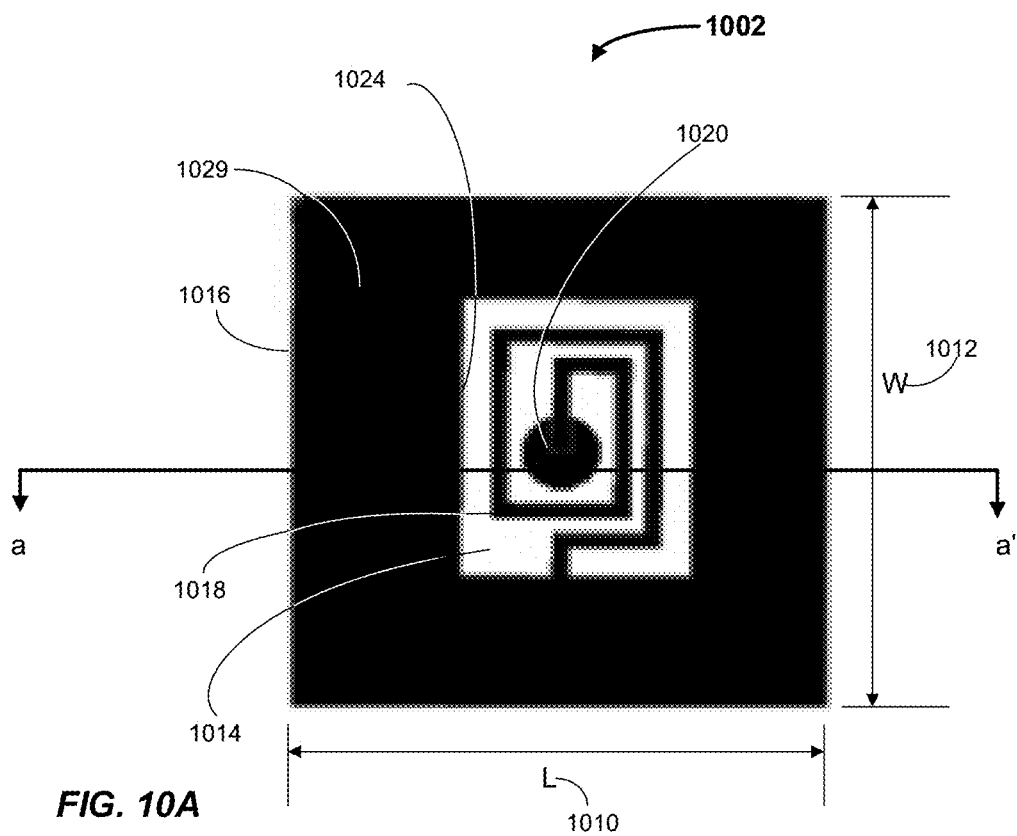
FIGS. 10A and 10B are respectively a top view and cross-sectional view illustrating an embodiment of the present invention of a substantially small sized and thinner coiled UE structure.
Figure 10B:
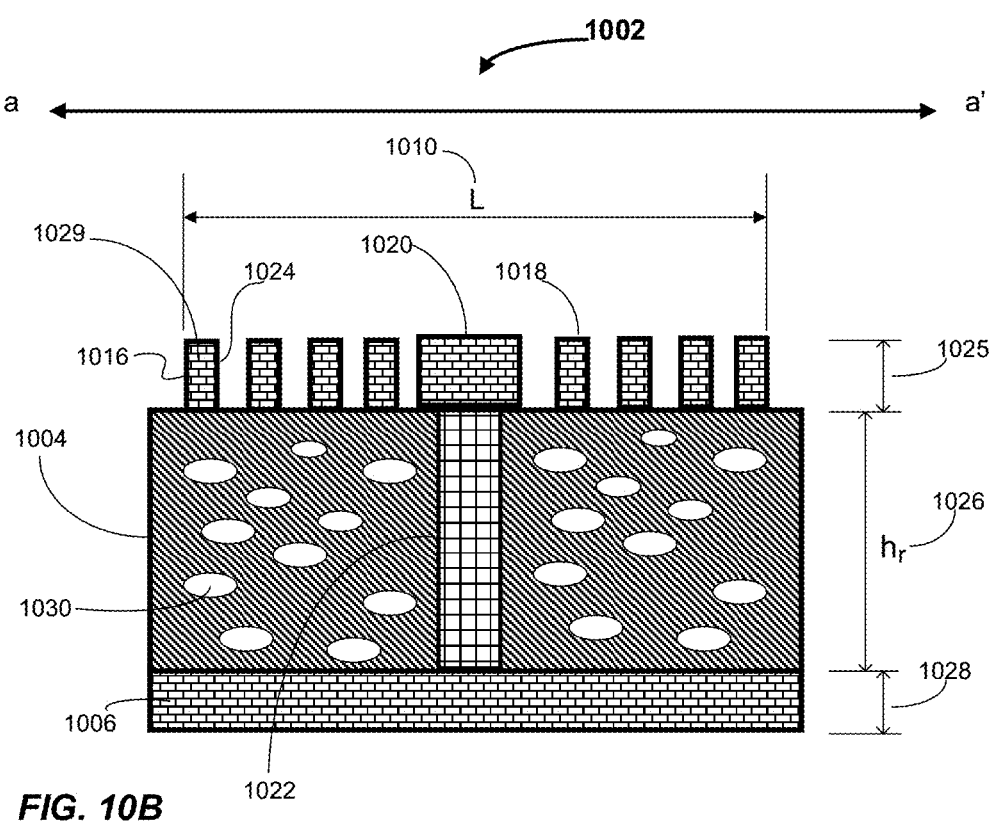
Figure 12:
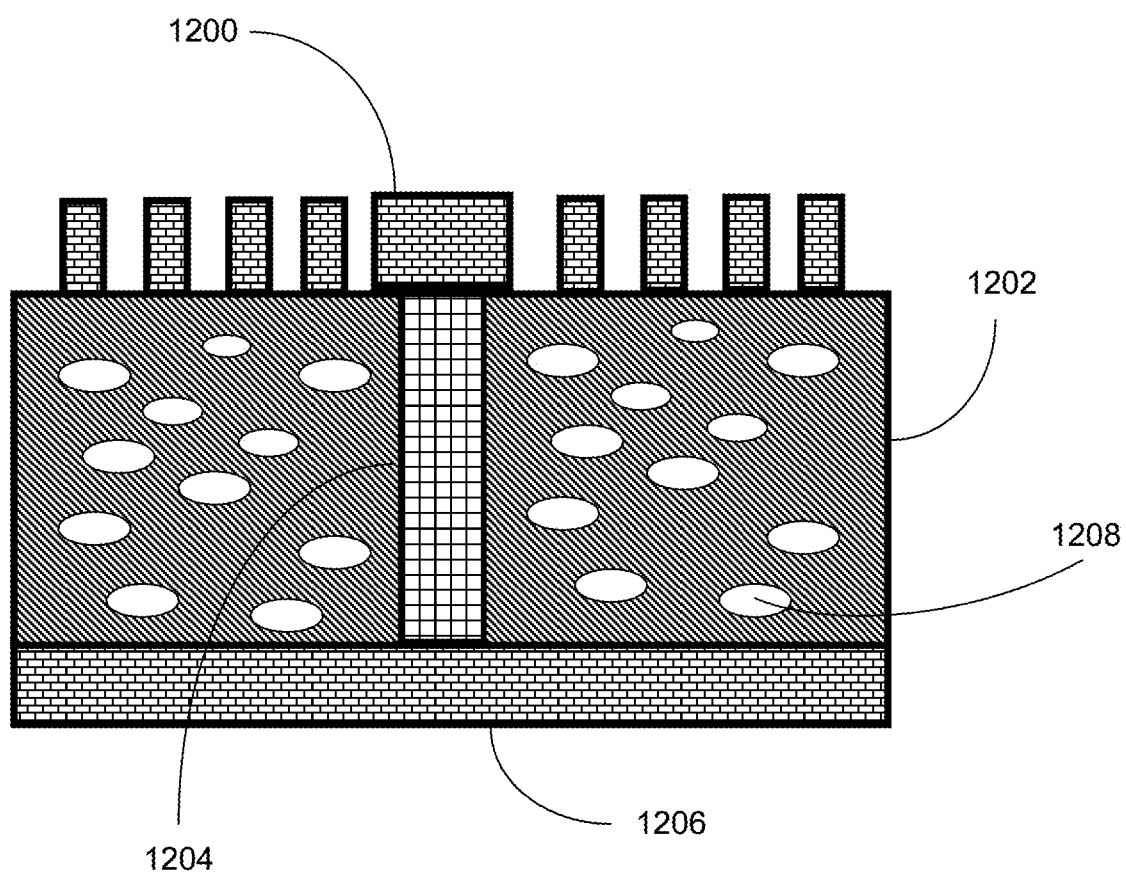

FIG. 12 has been moved to FIG. 10B and the previous legend FIG. 12 has been deleted.

Figure 13:
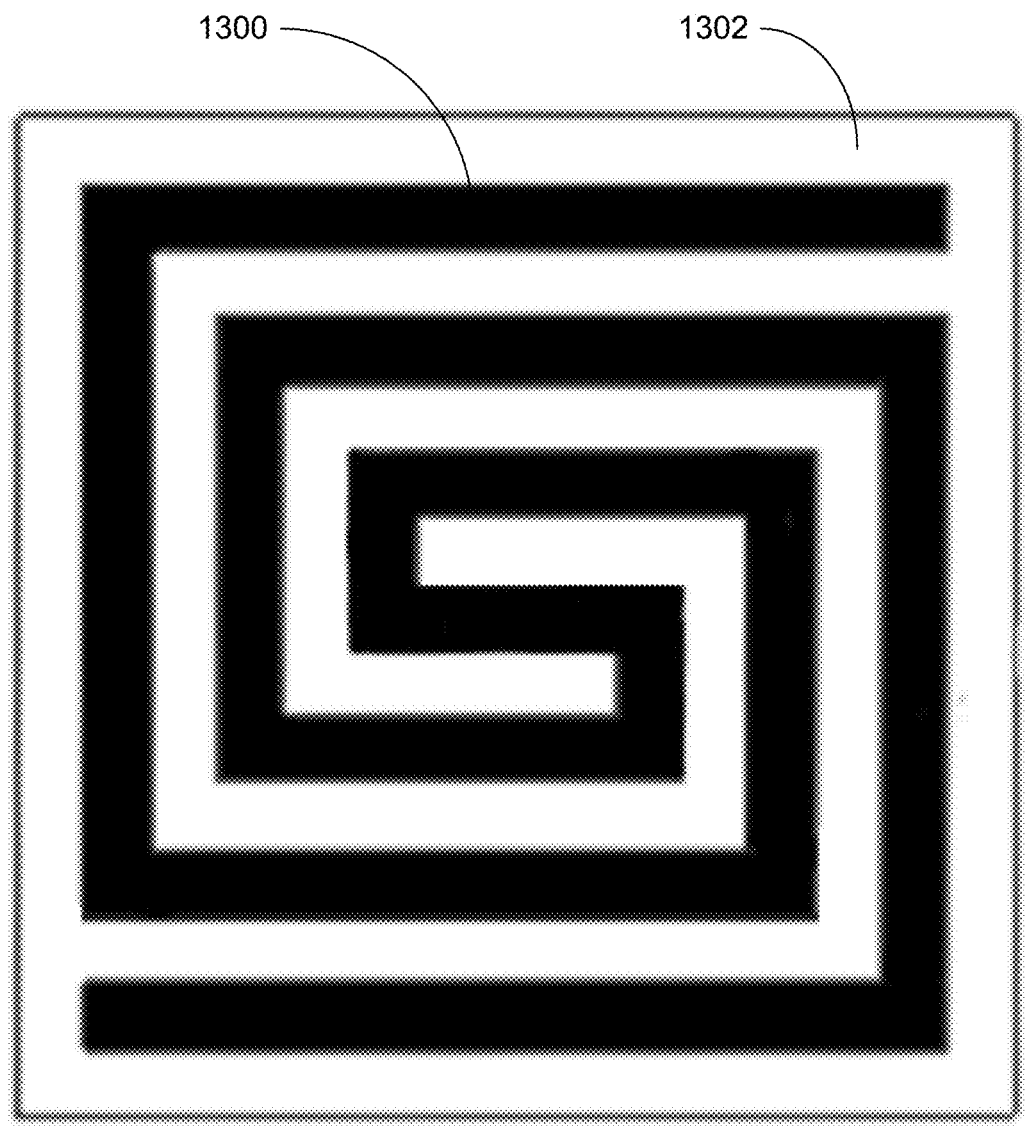

FIG. 13 is a top view of two coils turning in the opposite direction for the UE.

Figure 14:
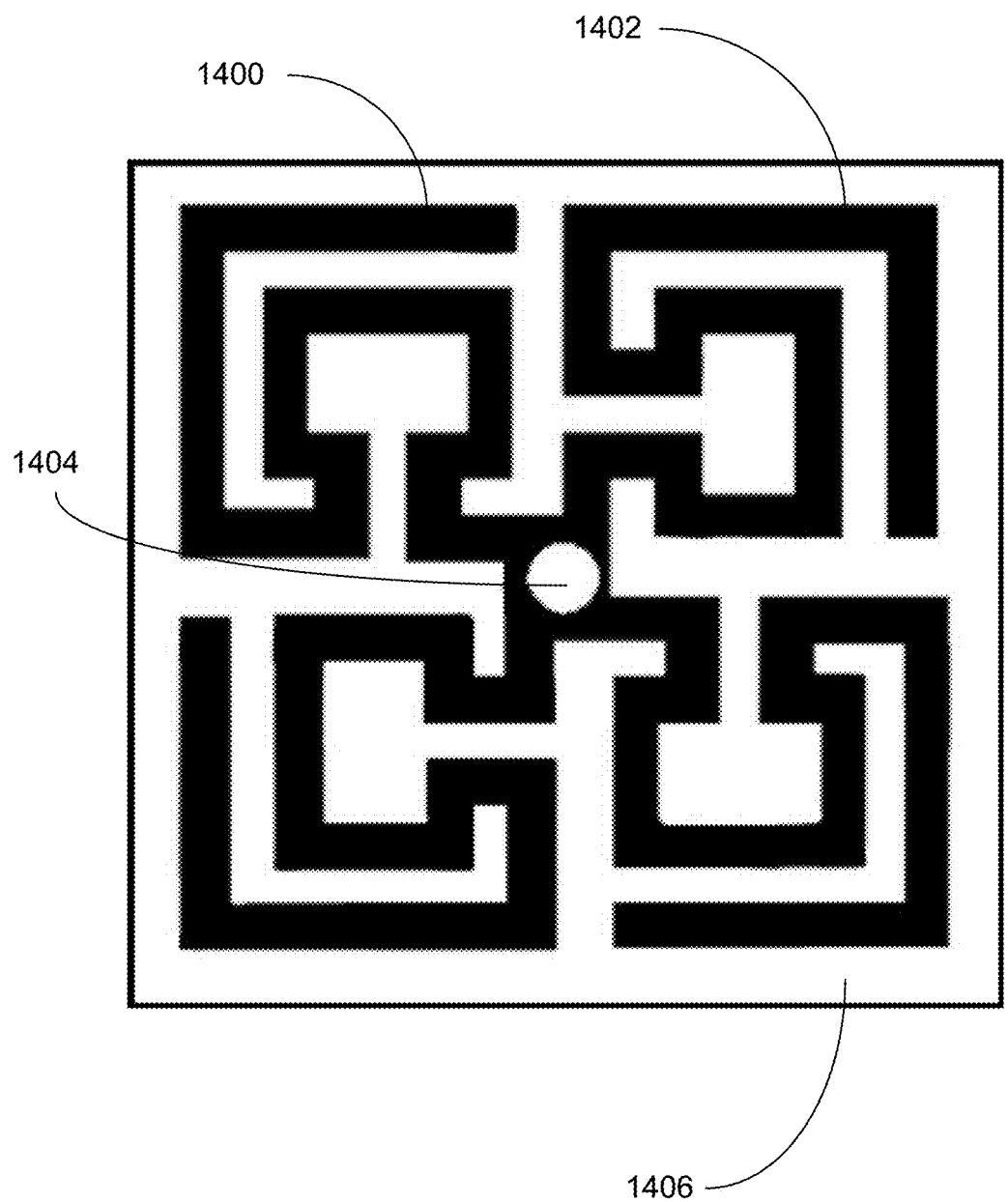

FIG. 14 is a top view of a symmetric four arm looped coil UE.

Figure 15:
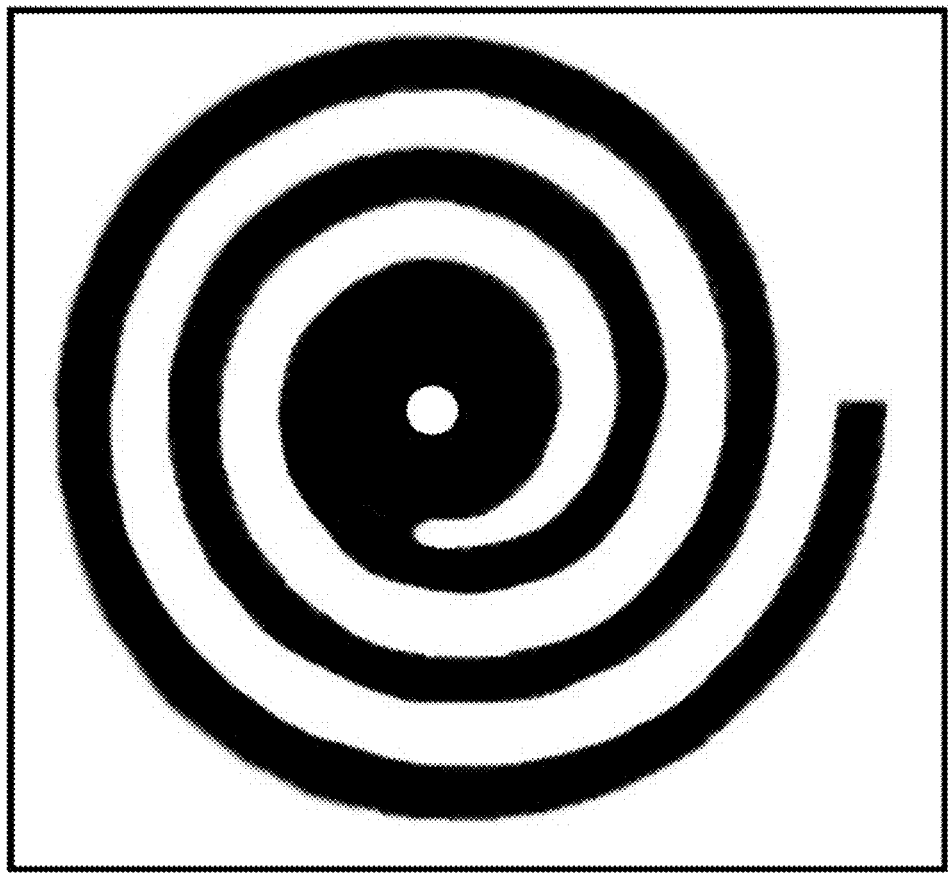

FIG. 15 is a top view of a curved spiral coil UE.

Figure 16:
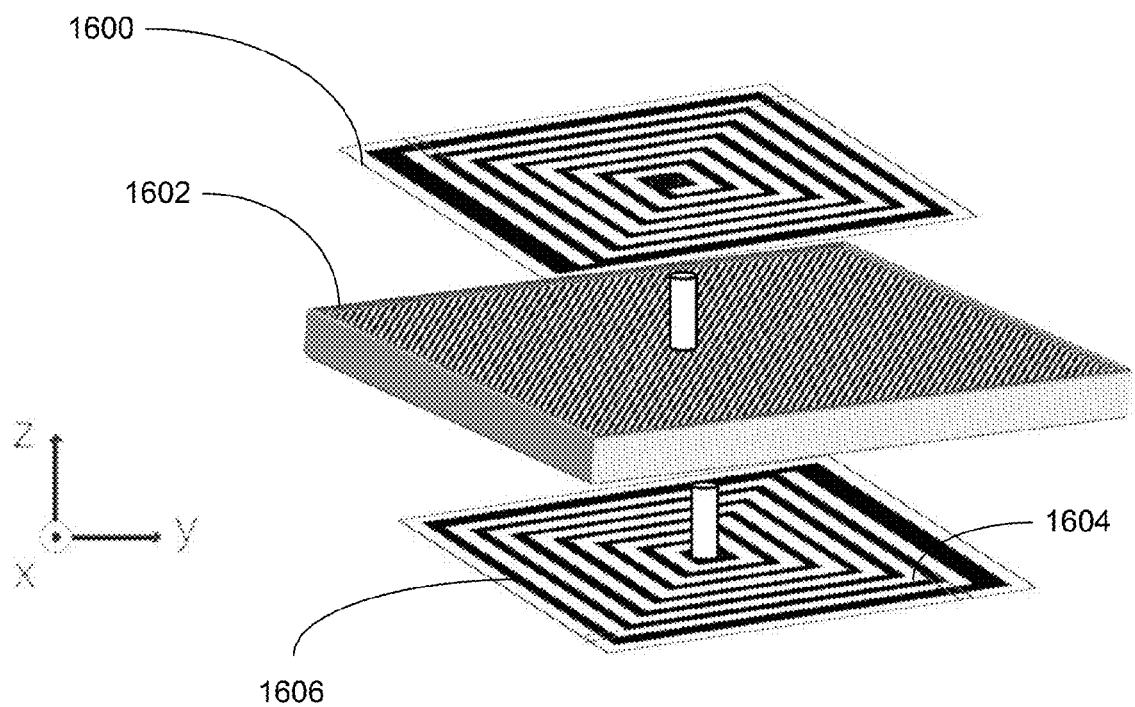

FIG. 16 is a perspective view of a double layered coil UE.

Figure 17:
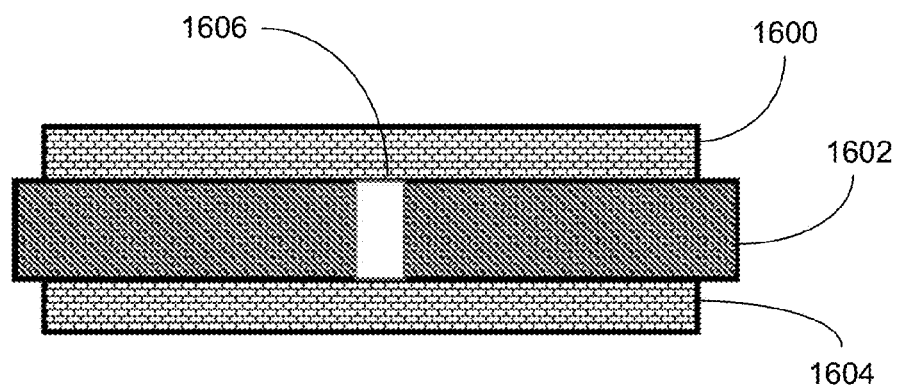

FIG. 17 is a cross sectional side view of a double layered coil UE.

Figure 18:
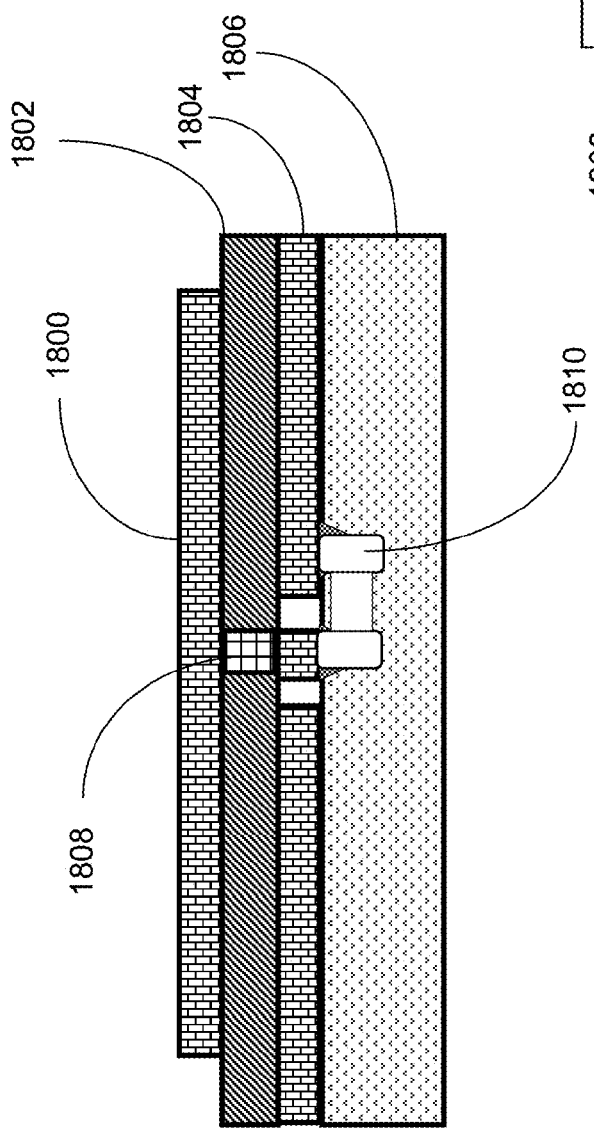

FIG. 18 is a cross sectional side view of a mushroom type UE that is constructed with a substrate embedded chip inductor.

Figure 19:
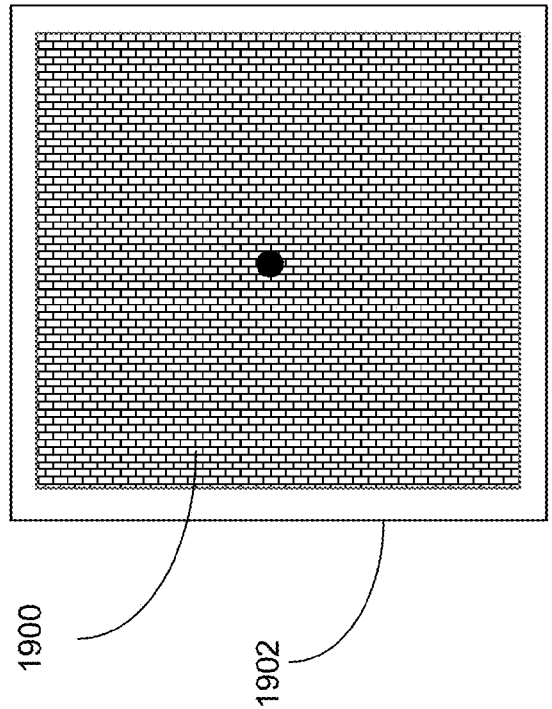

FIG. 19 is a top view of a coiled element pattern that is replaced by a square patch pattern.

Figure 20:
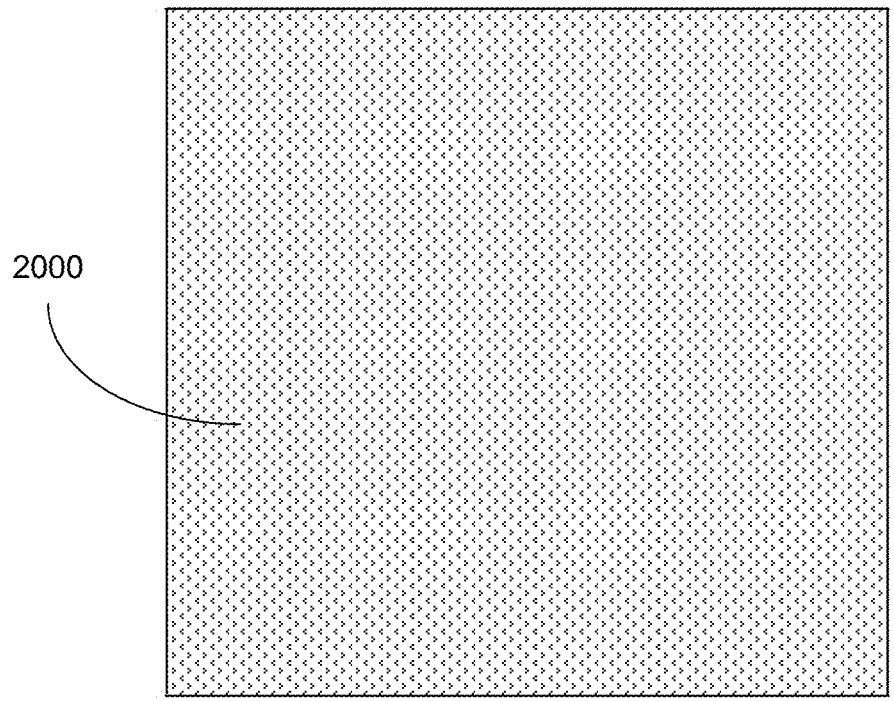

FIG. 20 is a top view of a small antenna.

Figure 21:
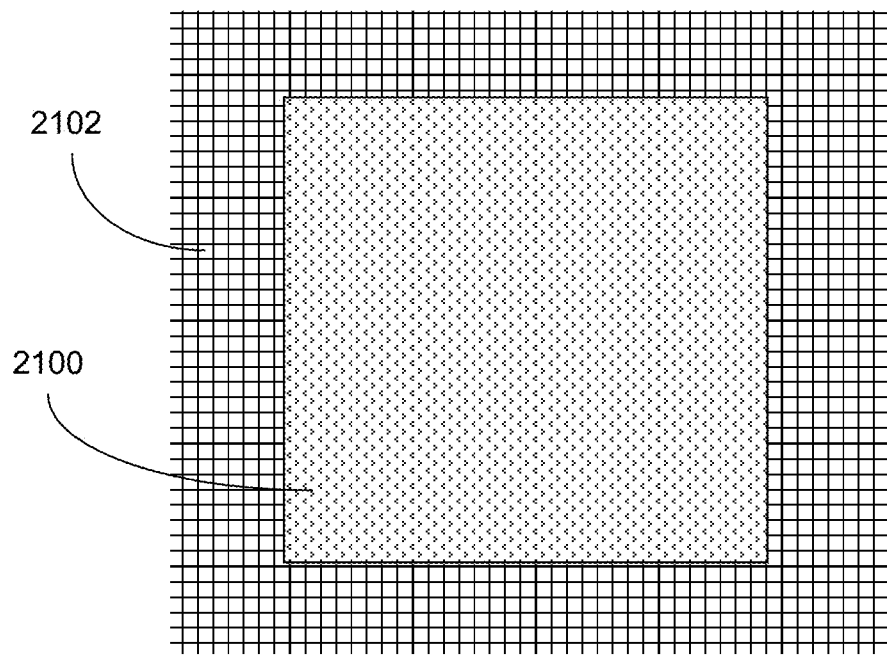

FIG. 21 is a top view of a small antenna with an EBG ground plane underneath the small antenna.

Figure 22:
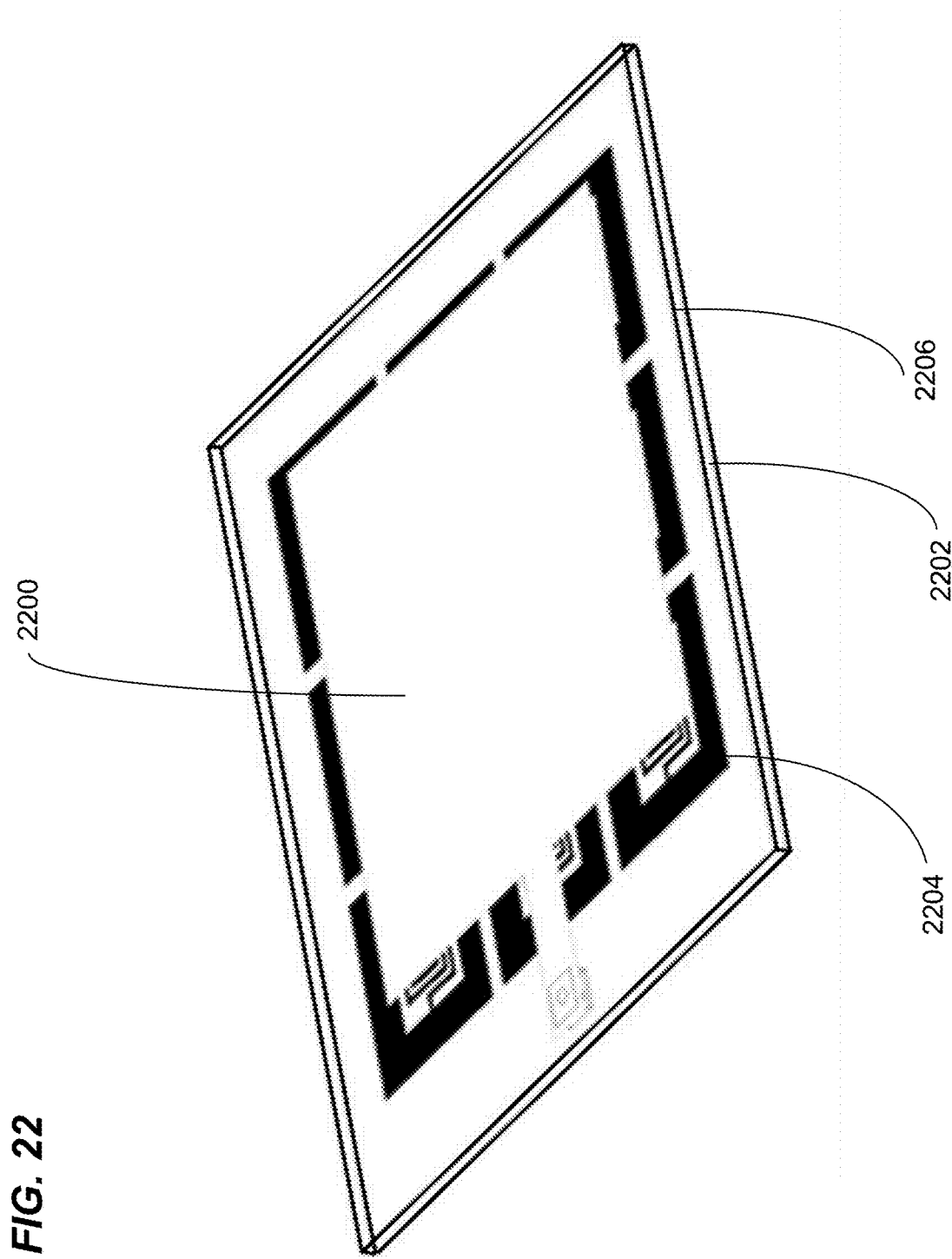

FIG. 22 is a perspective view of a miniature antenna that is overlaid on a substantially small sized and thinner EBG structure according to the invention.

Figure 23:
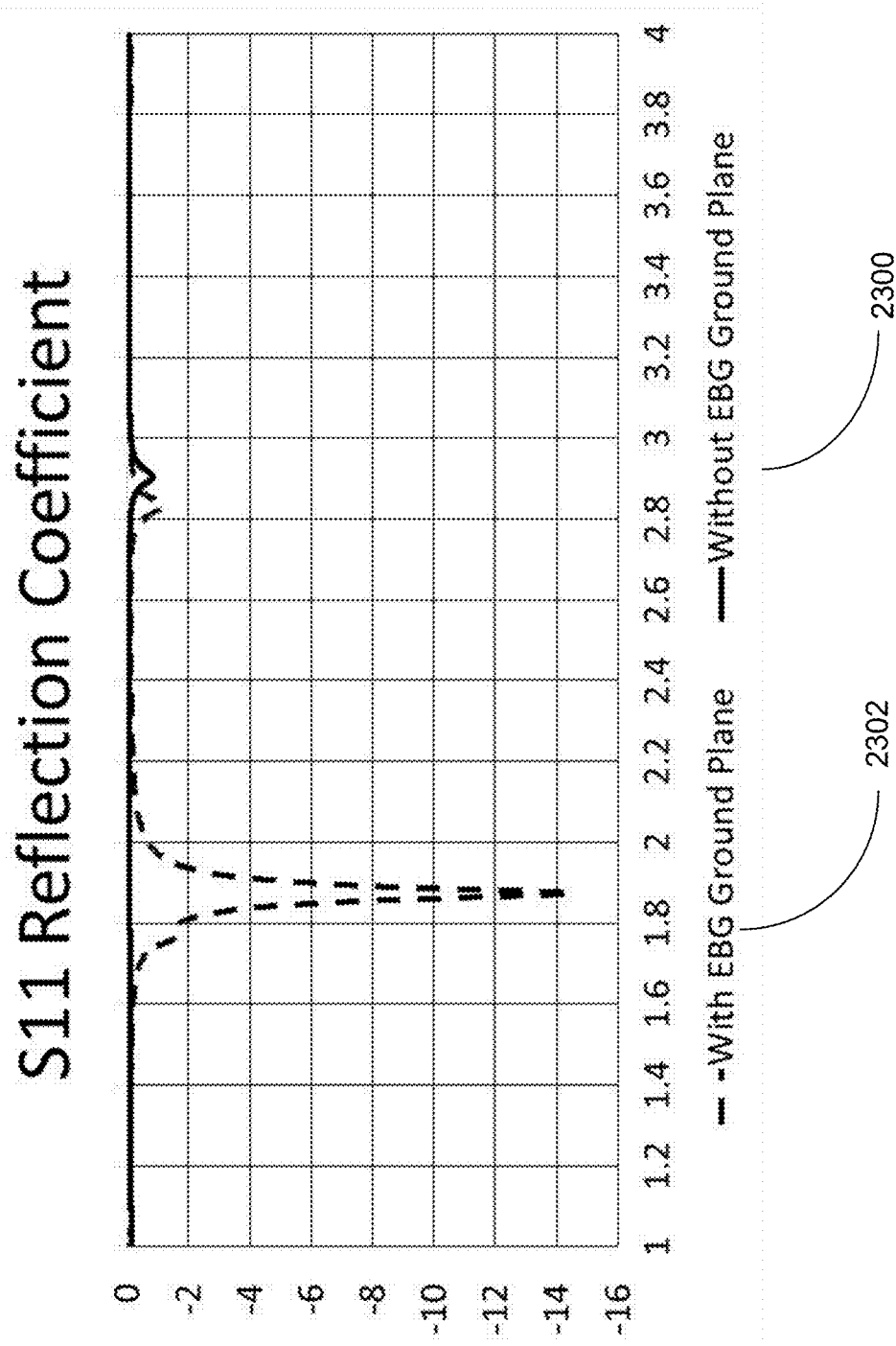

FIG. 23 is a graph of a miniature antenna that is constructed using an EBG ground plane and with a conventional ground plane.

Figure 24:
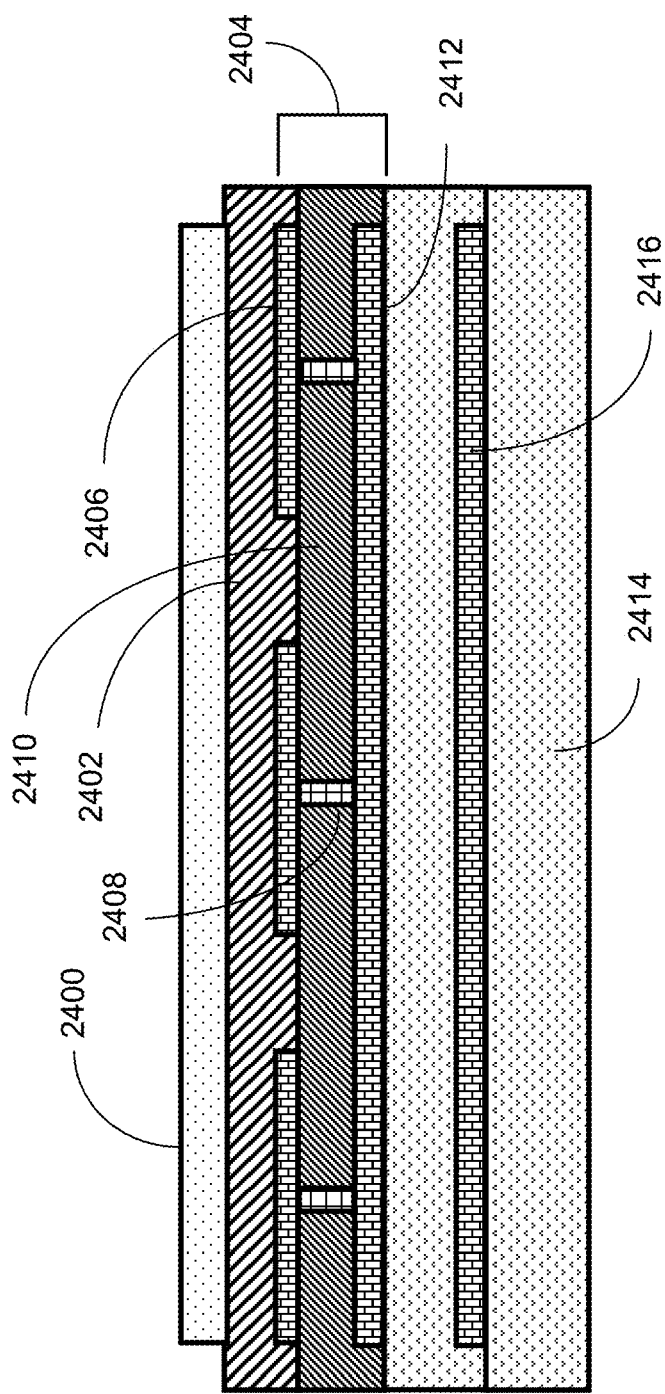

FIG. 24 is a cross sectional side view of the metamaterial substrate antenna made with a coiled EBG.

Figure 25:
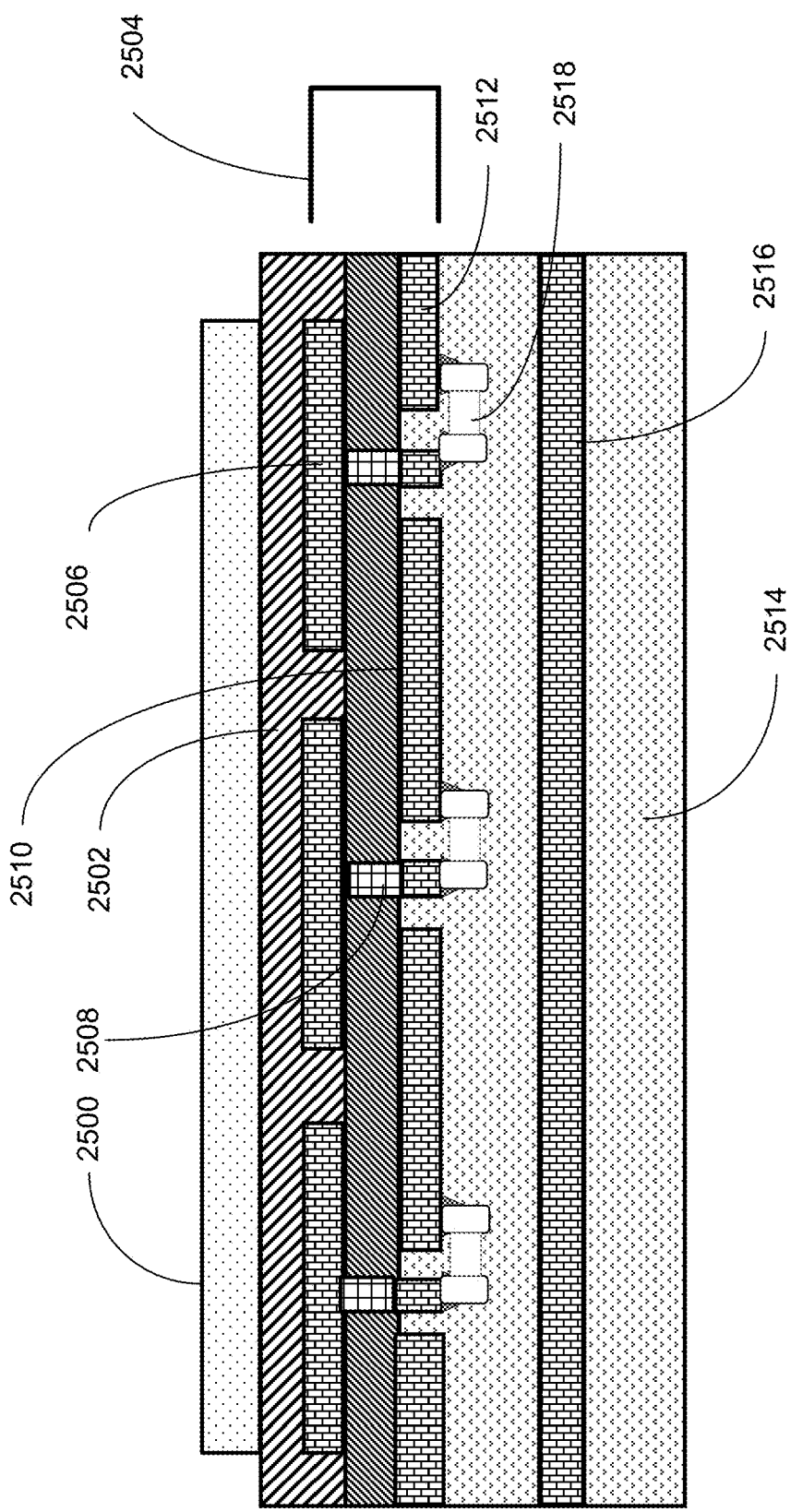

FIG. 25 is a cross sectional side view of the metamaterial substrate antenna made with embedded chip inductor EBG.

Figure 26:
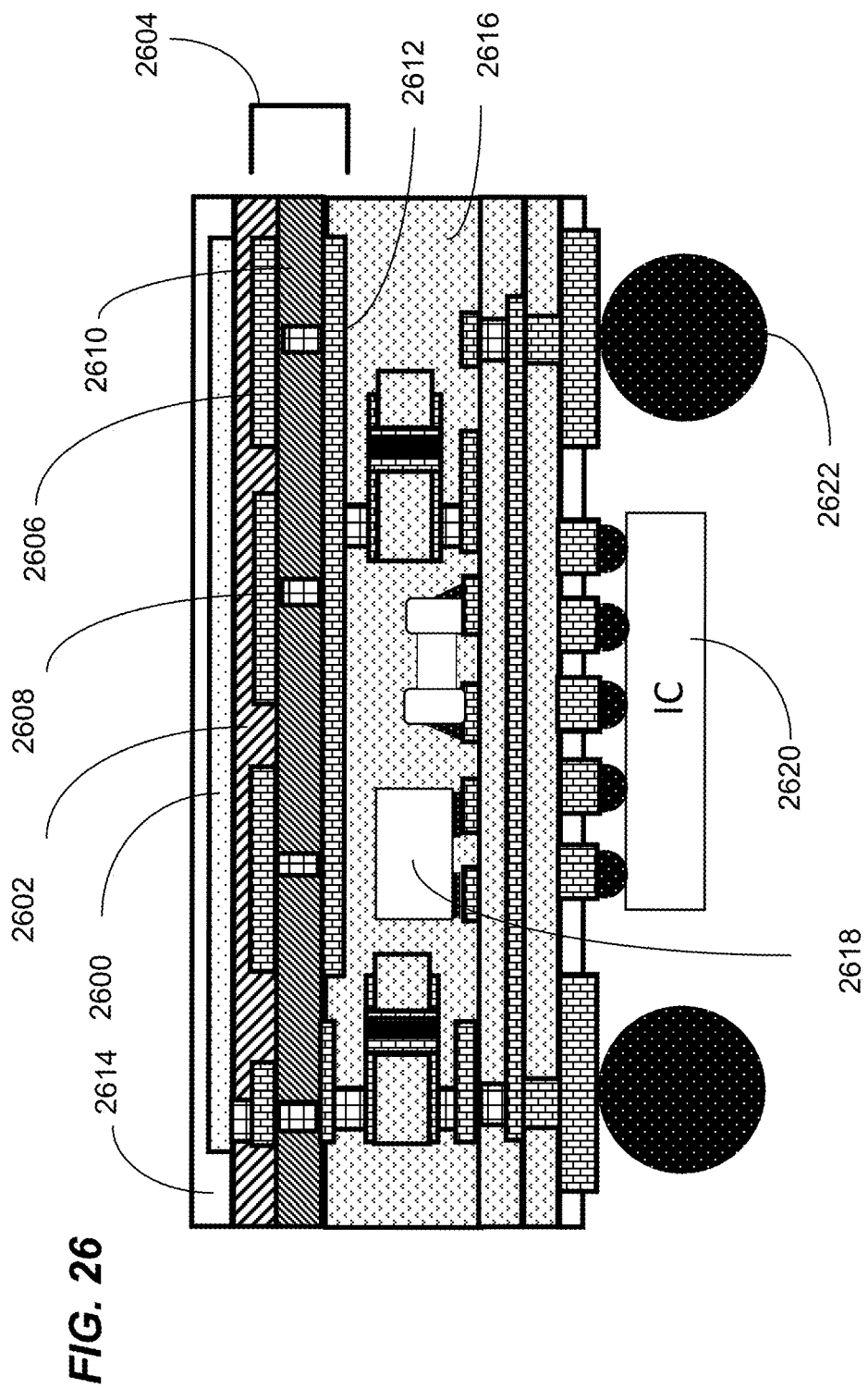

FIG. 26 is a cross sectional side view of an inverted BGA Antenna-in-Package ("AiP") module with integrated metamaterial substrate antenna and substrate embedded components (collectively, 3D AiP).

Figure 27:
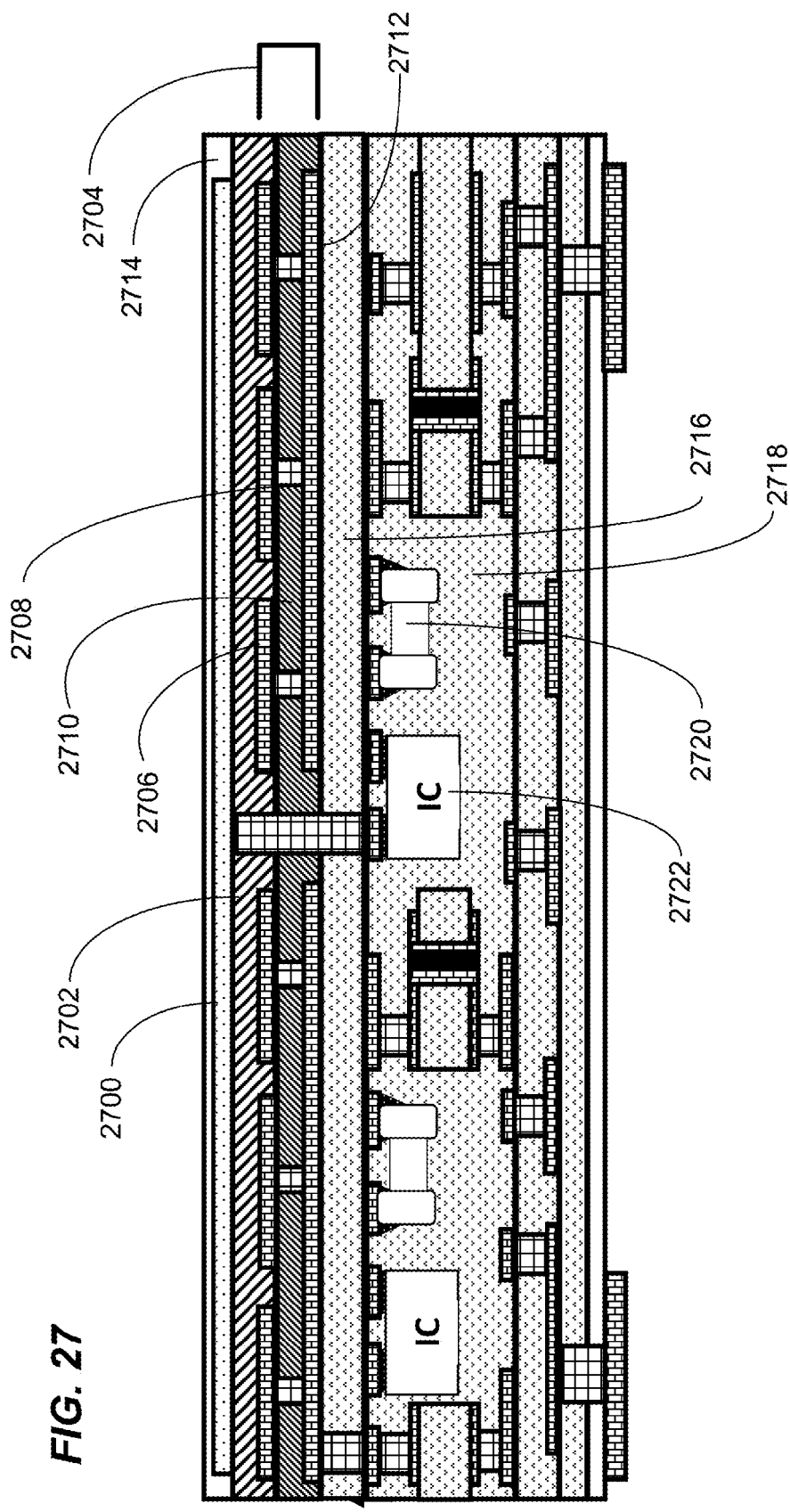

FIG. 27 is a cross sectional side view of a LGA AiP module with integrated metamaterial substrate antenna and substrate embedded components (collectively, 3D AiP).

Figure 28:
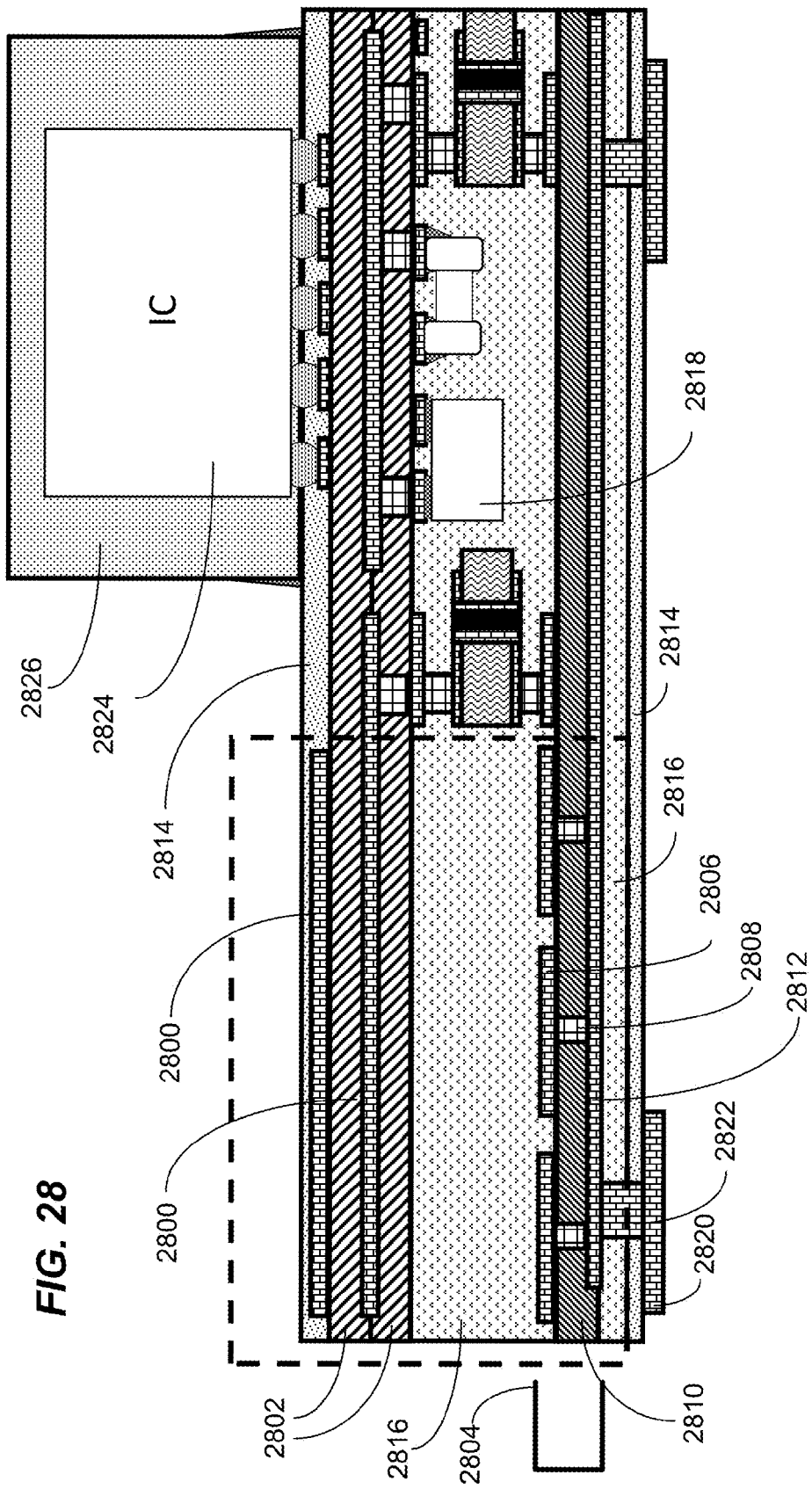

FIG. 28 is a cross sectional side view of a hybrid LGA AiP module with a lateral metamaterial substrate antenna structure with components on the top layer and substrate embedded components (collectively, 3D AiP).

Figure 29:
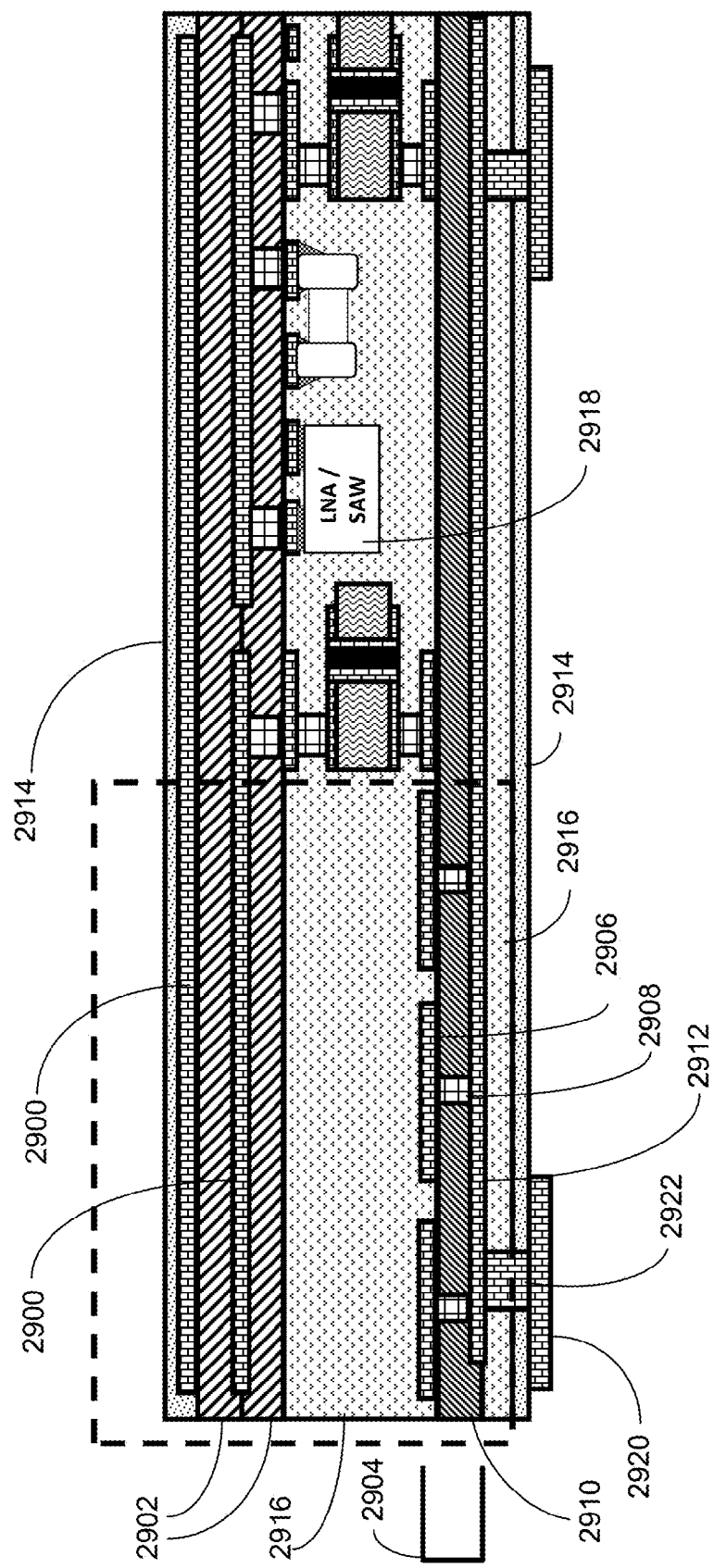

FIG. 29 is a cross sectional side view of a hybrid LGA AiP module with a lateral metamaterial antenna structure without components on the top layer and substrate embedded components (collectively, 3D AiP).

Figure 30:
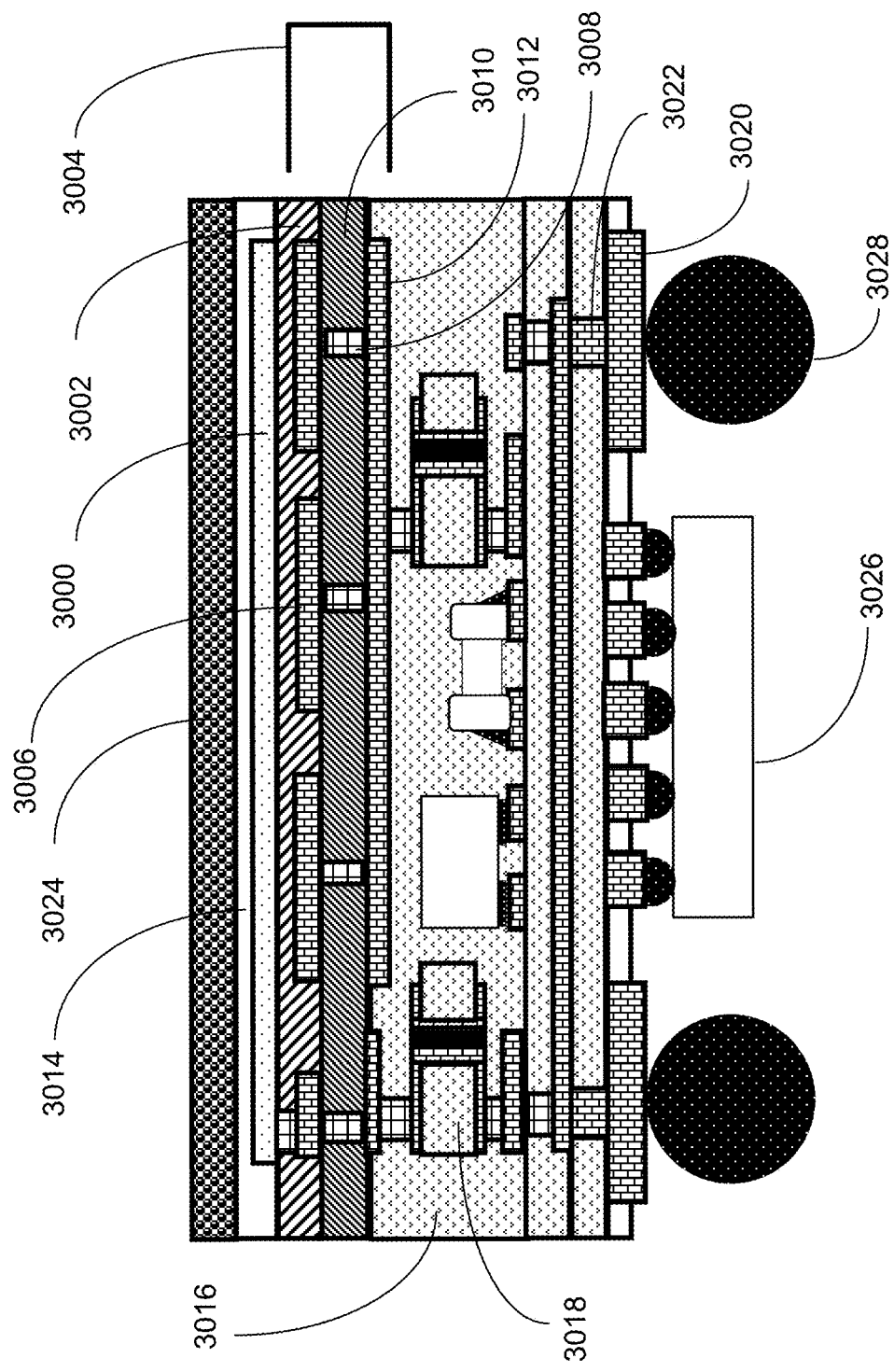

FIG. 30 is a cross sectional side view of an inverted BGA meta-AiP module integrated with a magneto dielectric superstrate structure on the top of a metamaterial substrate antenna and substrate embedded components (collectively, 3D AiP).

Figure 31:
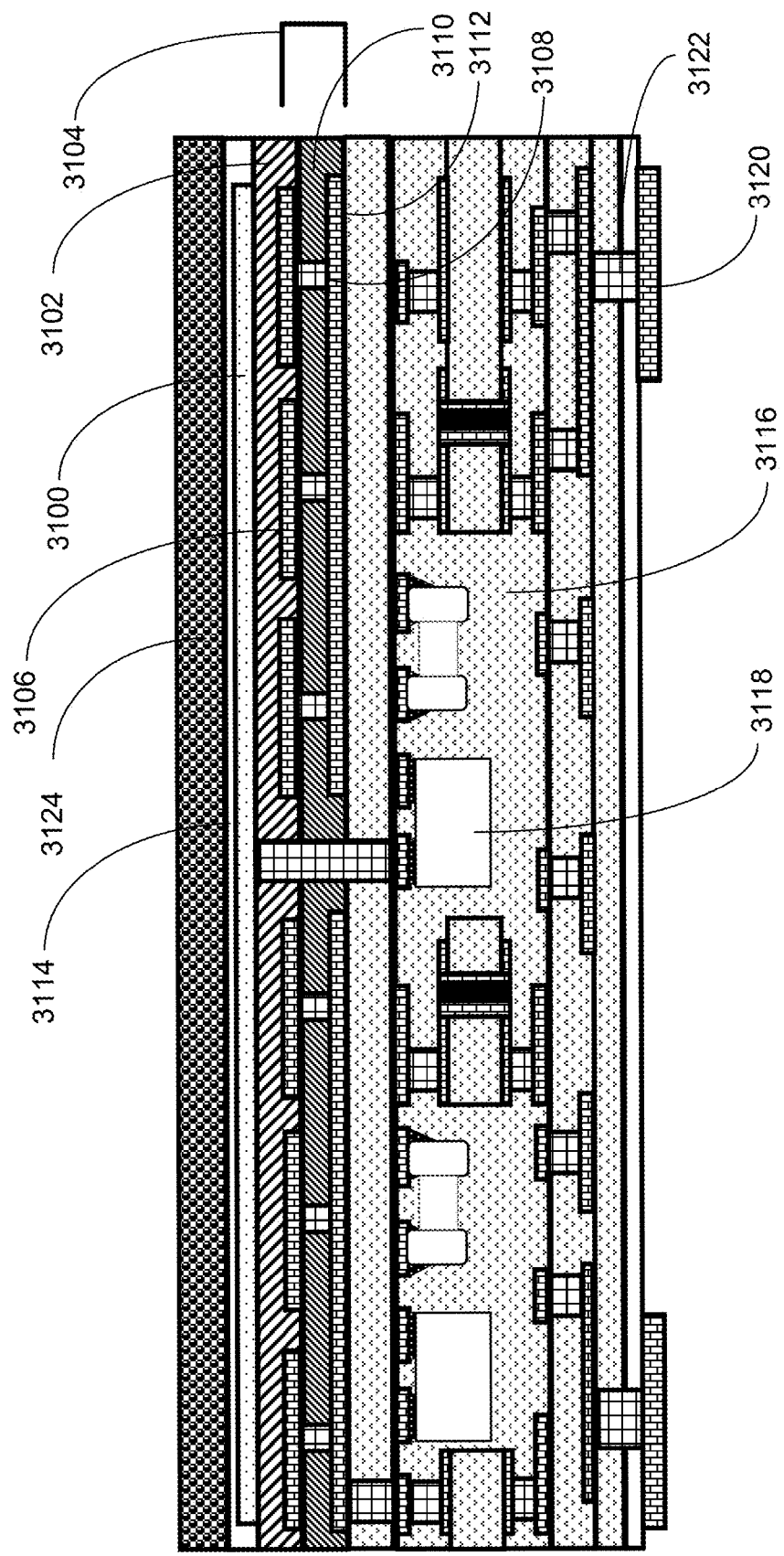

FIG. 31 is a cross sectional side view of a LGA AiP module integrated with magneto dielectric superstrate structure on the top of a metamaterial substrate antenna and substrate embedded components (collectively, 3D AiP).

Figure 32:
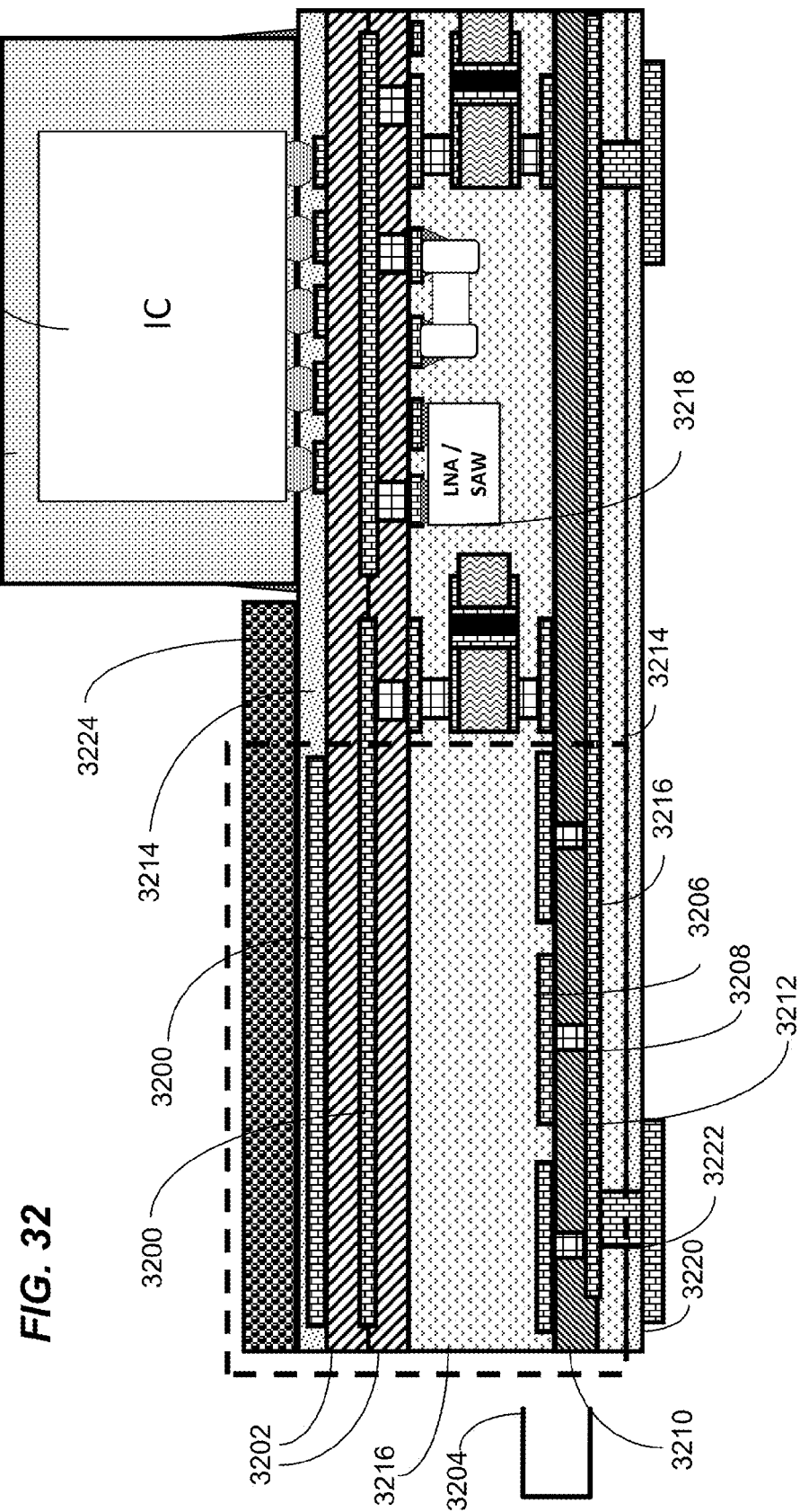

FIG. 32 is a cross sectional side view of a hybrid LGA AiP module with magneto dielectric superstrate structure on the top of a lateral metamaterial substrate antenna structure and with components on the top layer and substrate embedded components (collectively, 3D AiP).

Figure 33:
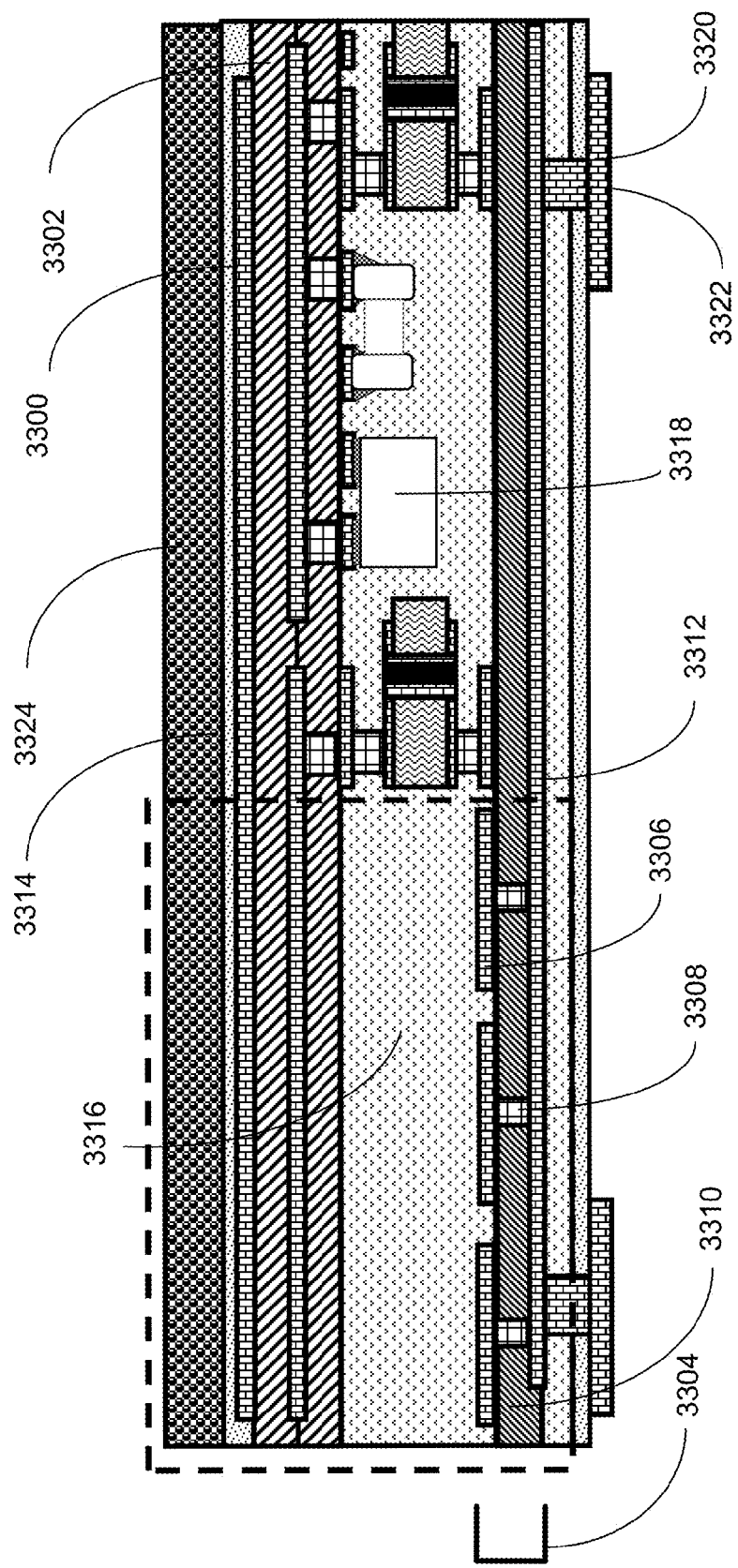

FIG. 33 is a cross sectional side view of a hybrid LGA AiP module with magneto dielectric superstrate structure on the top of a lateral metamaterial substrate antenna structure without components on the top layer and substrate embedded components (collectively, 3D AiP).

Figure 34:
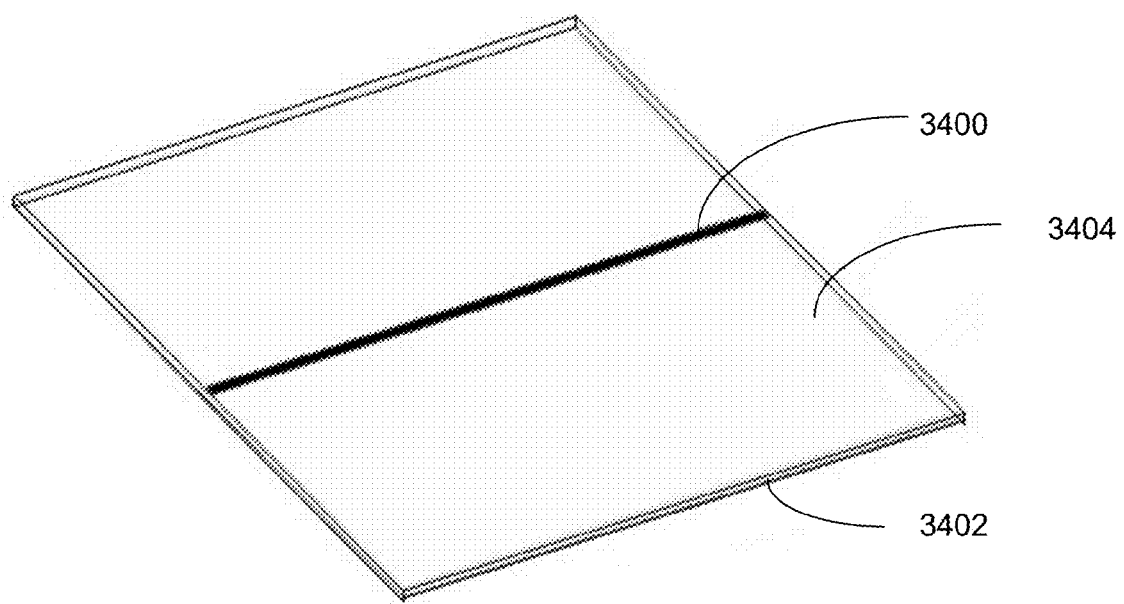

FIG. 34 is a perspective view of a microstrip transmission line that carries 1 GHz to 6 GHz constructed on a ground plane.

Figure 35:
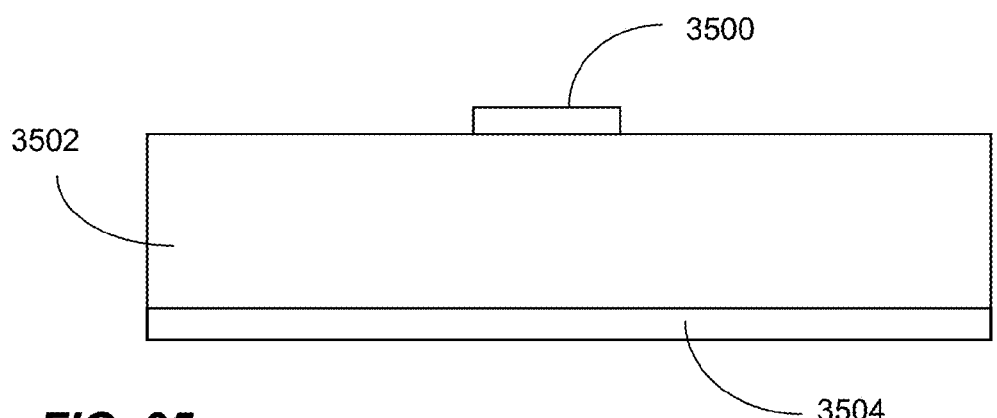

FIG. 35 is a cross sectional view of the microstrip transmission line that carries 1 GHz to 6 GHz constructed on a ground plane.

Figure 36:
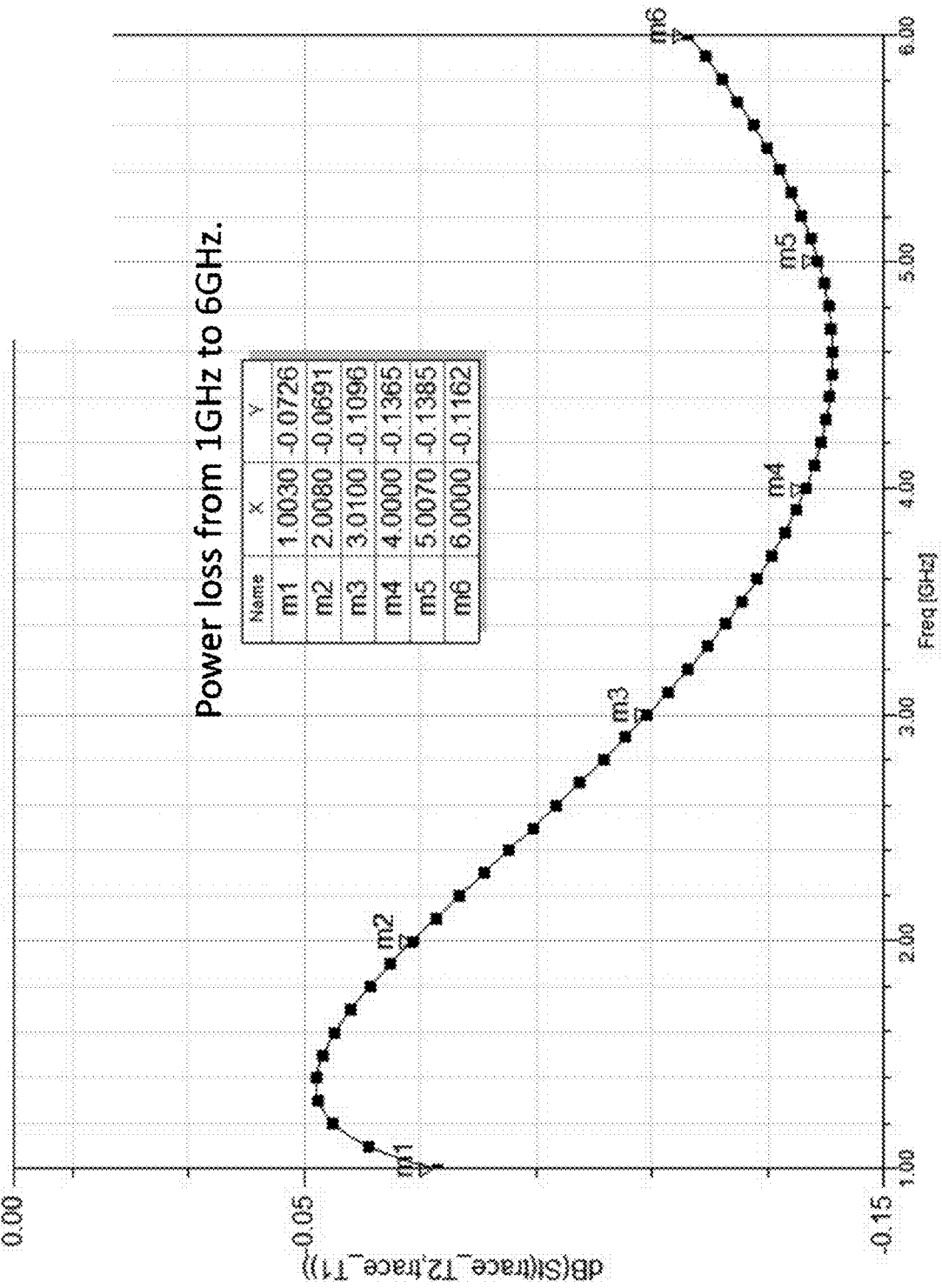

FIG. 36 is a graphical plot of S21 transmission coefficient of the regular microstrip transmission line ranging from −0.07 dB to −0.14 dB of power loss.

Figure 37:
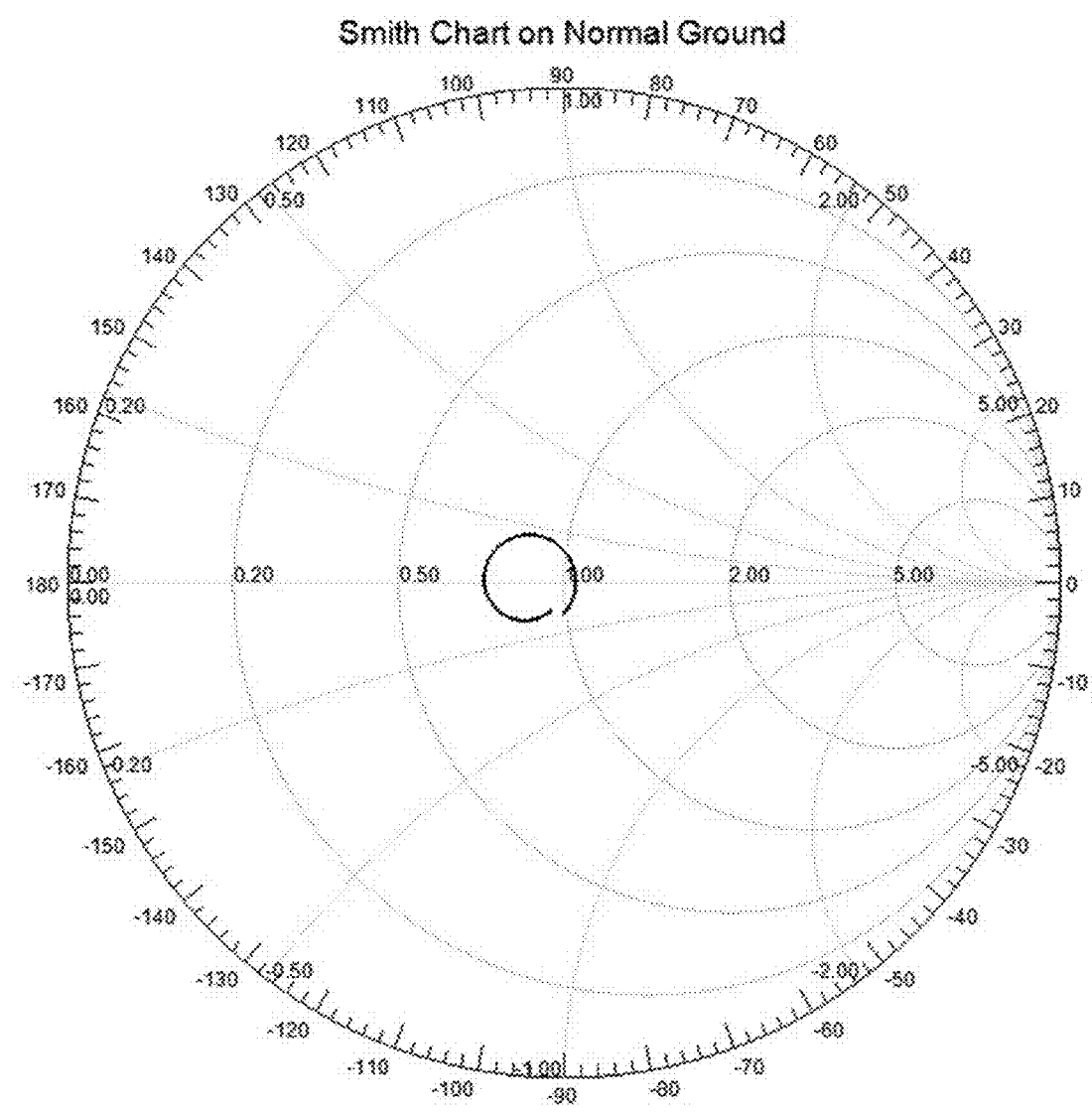
Figure 38:
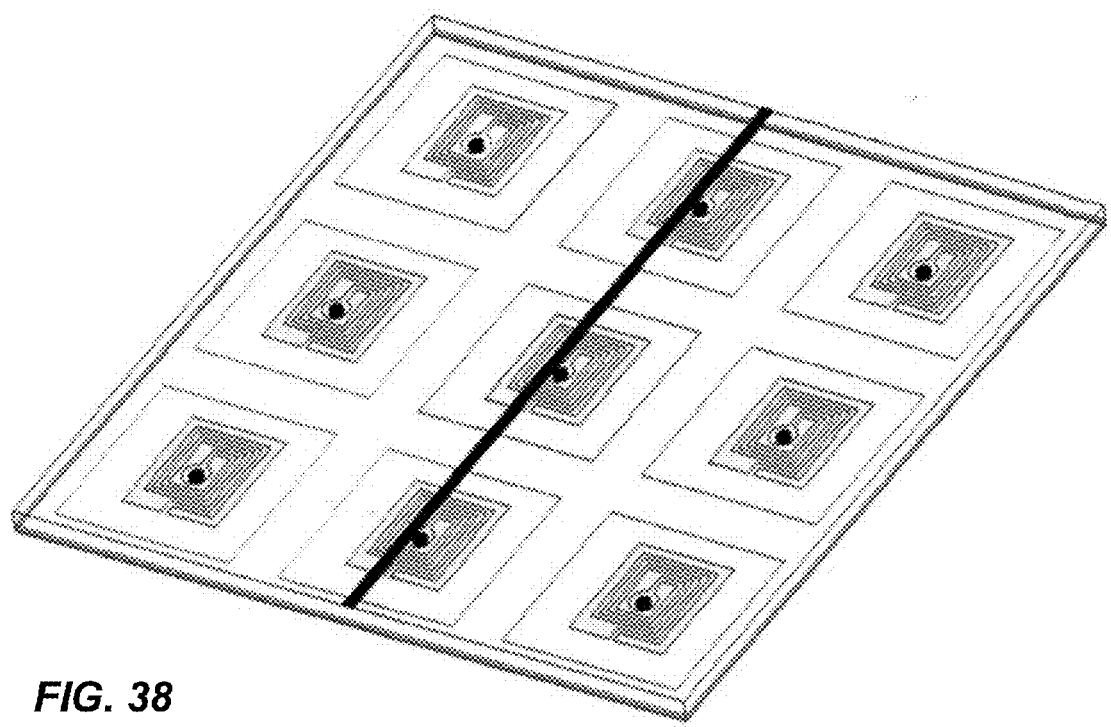

FIG. 37 is a Smith Chart of the S11 reflection coefficient of the regular microstrip transmission line that the S11 has a dispersion of impedance near the center of 50 Ohm across the frequencies range from 1 GHz to 6 GHz FIG. 38 is a perspective view of a five-layer structure of microstrip transmission line constructed on a substantially small sized and thinner EBG structure that carries 1 GHZ to 6 GHz signals according to the invention.

Figure 39:
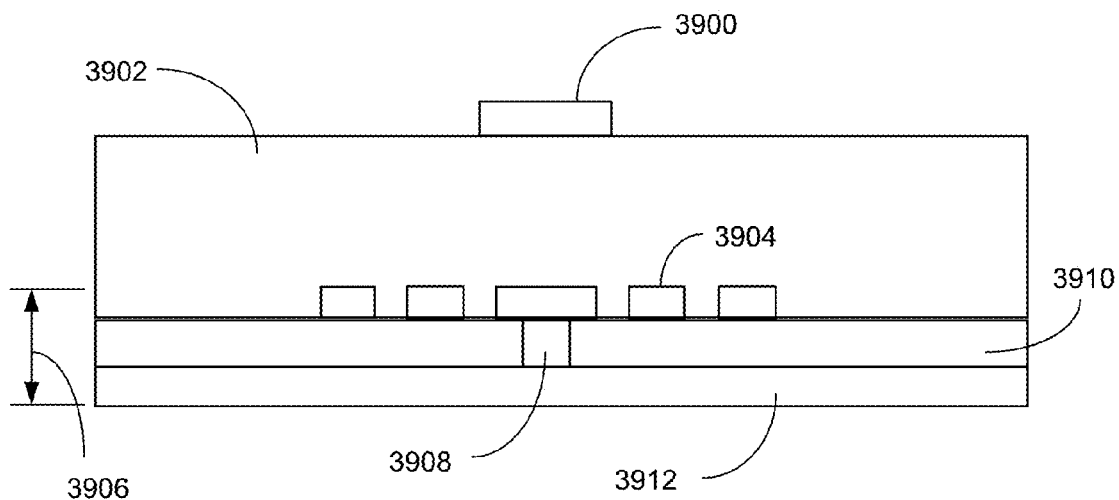

FIG. 39 is a cross sectional view of the five-layer microstrip transmission line constructed on a substantially small sized and thinner EBG structure that carries 1 GHz to 6 GHz signals according to the invention.

Figure 40:
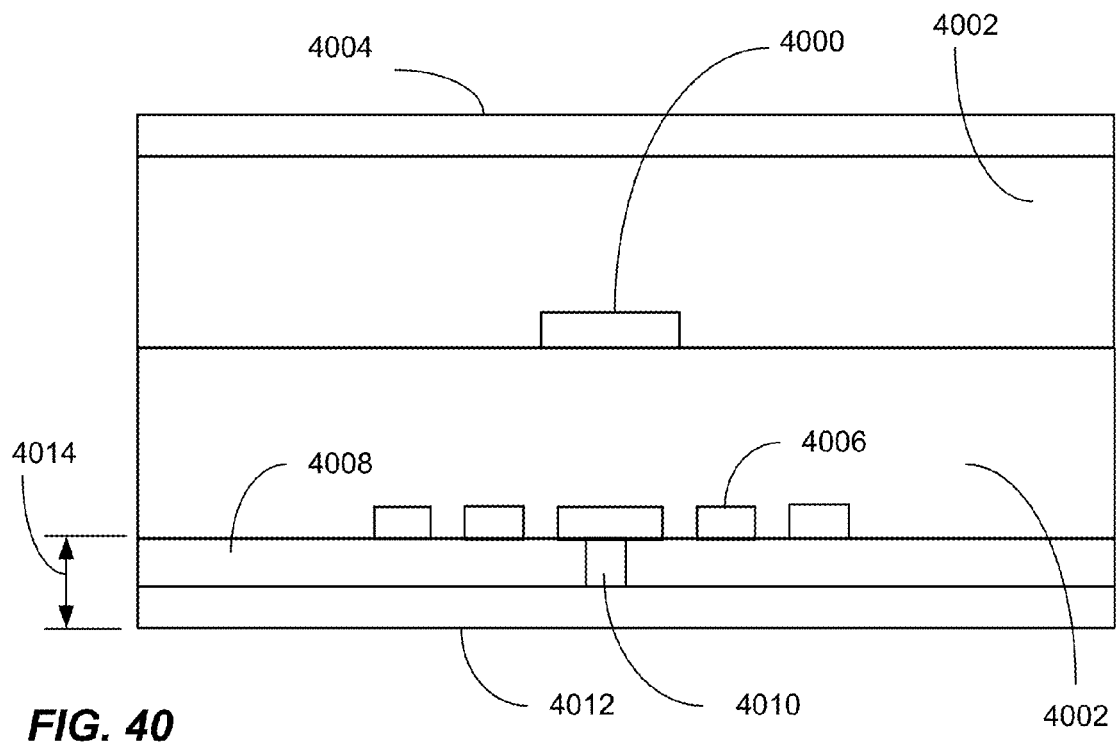

FIG. 40 is a cross sectional view of the single EBG backed seven-layer stripline transmission line according to the invention.

Figure 41:
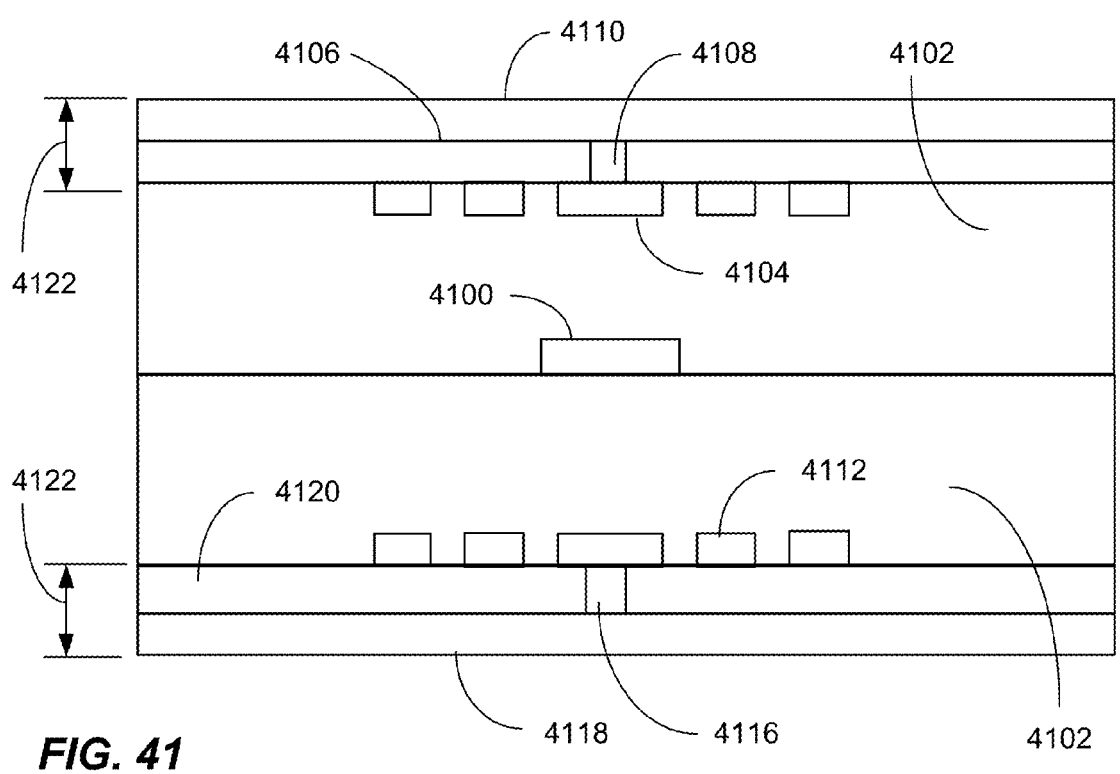

FIG. 41 is a cross sectional view of the double EBG nine-layer stripline transmission line according to the invention.

Figure 42:
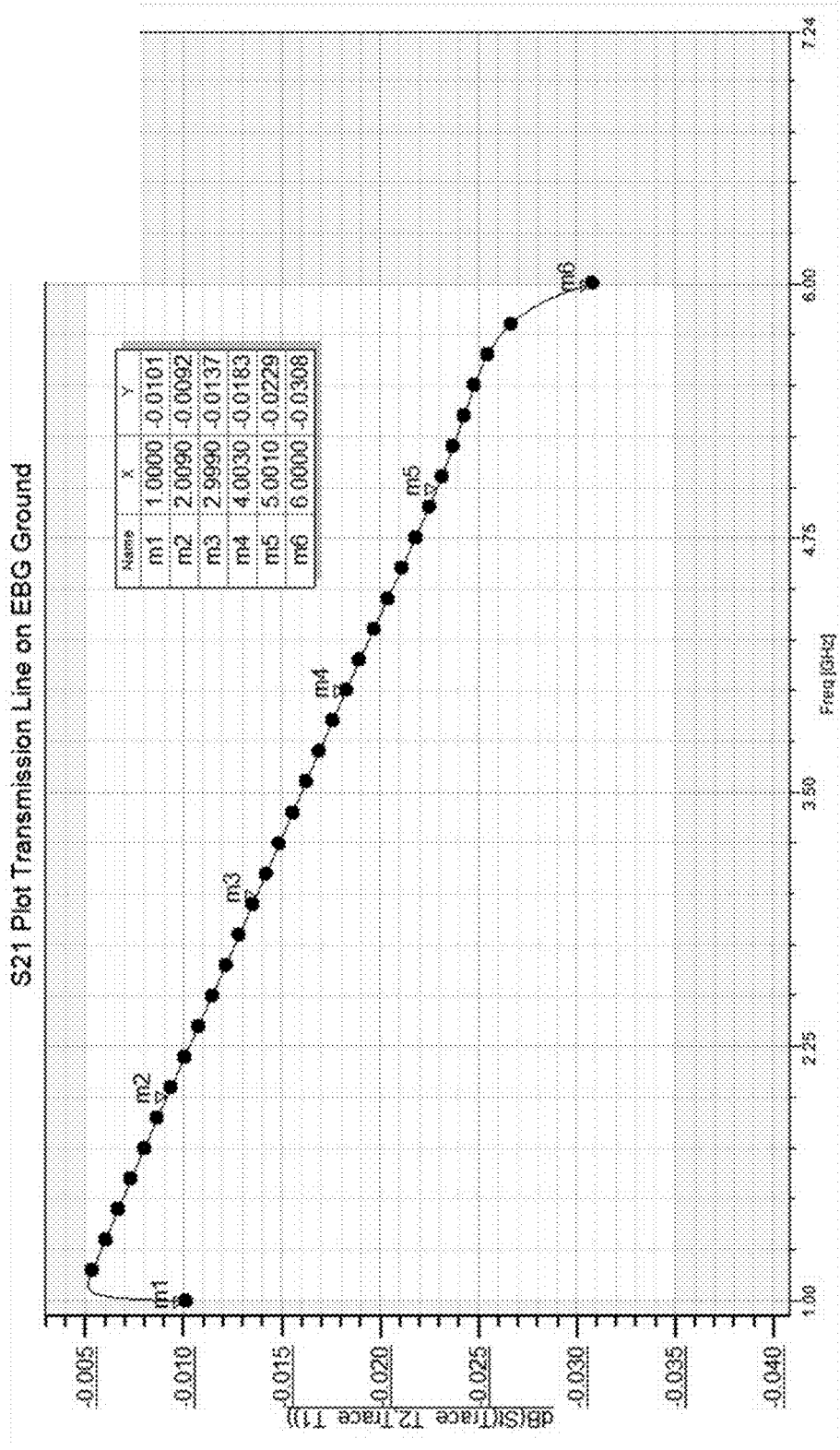

FIG. 42 is a graph of the power loss of the EBG backed transmission line showing almost lossless performance ranging from −0.009 dB to −0.03 dB that carries 1 GHz to 6 GHz signals.

Figure 43:
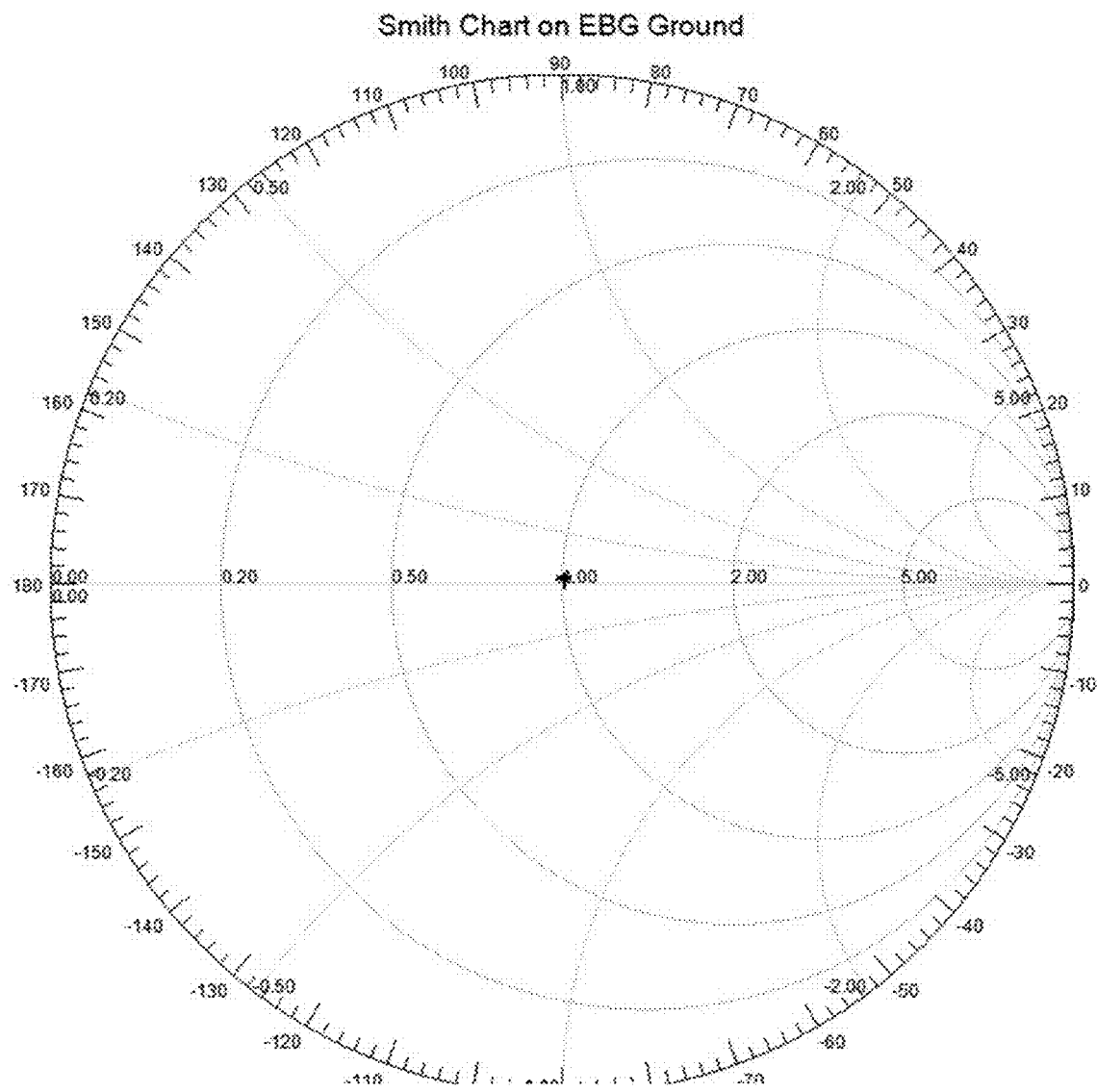

FIG. 43 is a Smith Chart of the S11 reflection coefficient of the three-layer structure of microstrip transmission line that the S11 centered at 50 Ohm impedance across the frequencies range from 1 GHz to 6 GHz.

Figure 44:
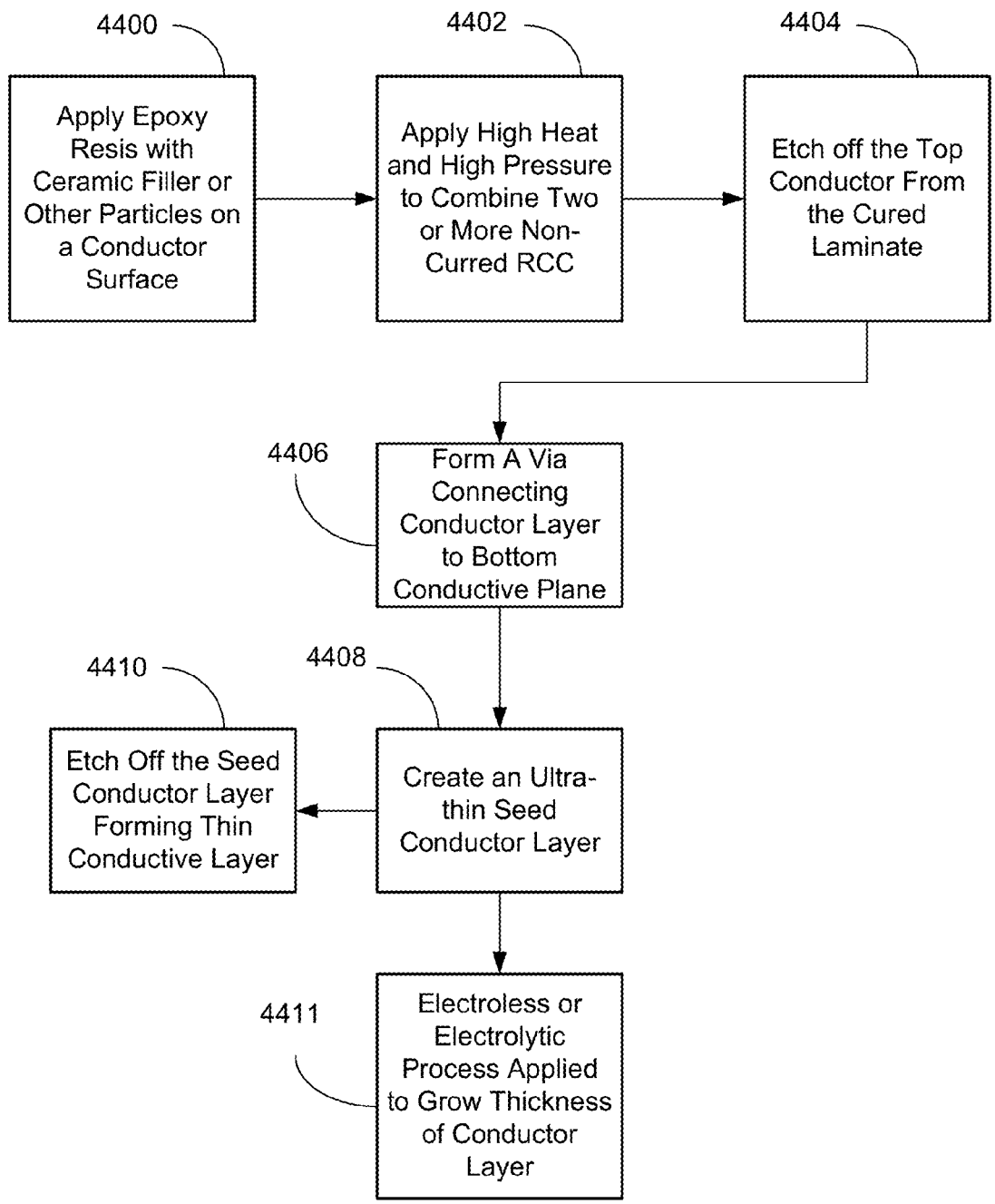

FIG. 44 is a flow chart of steps of the composition and manufacturing method for the metamaterial structure.

Figure 45:
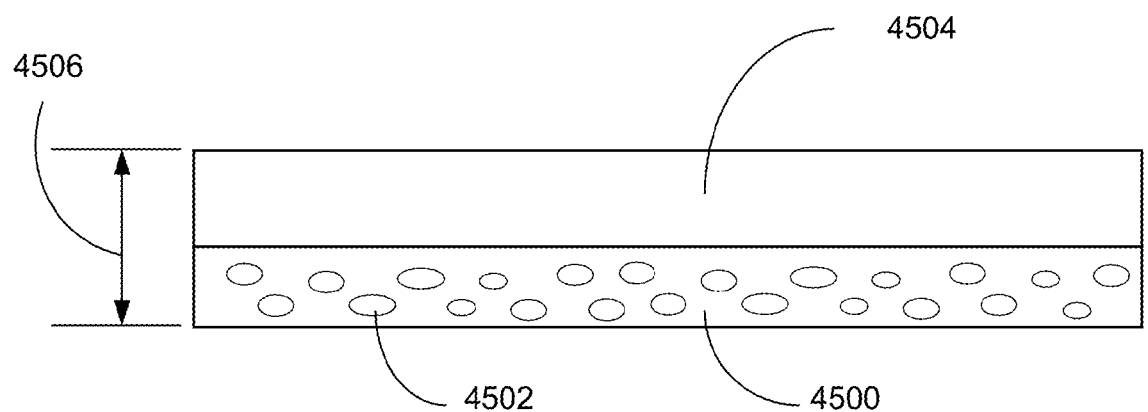

FIG. 45 is a cross sectional view of step first of the composition and manufacturing method for the metamaterial substrate structure.

Figure 46:
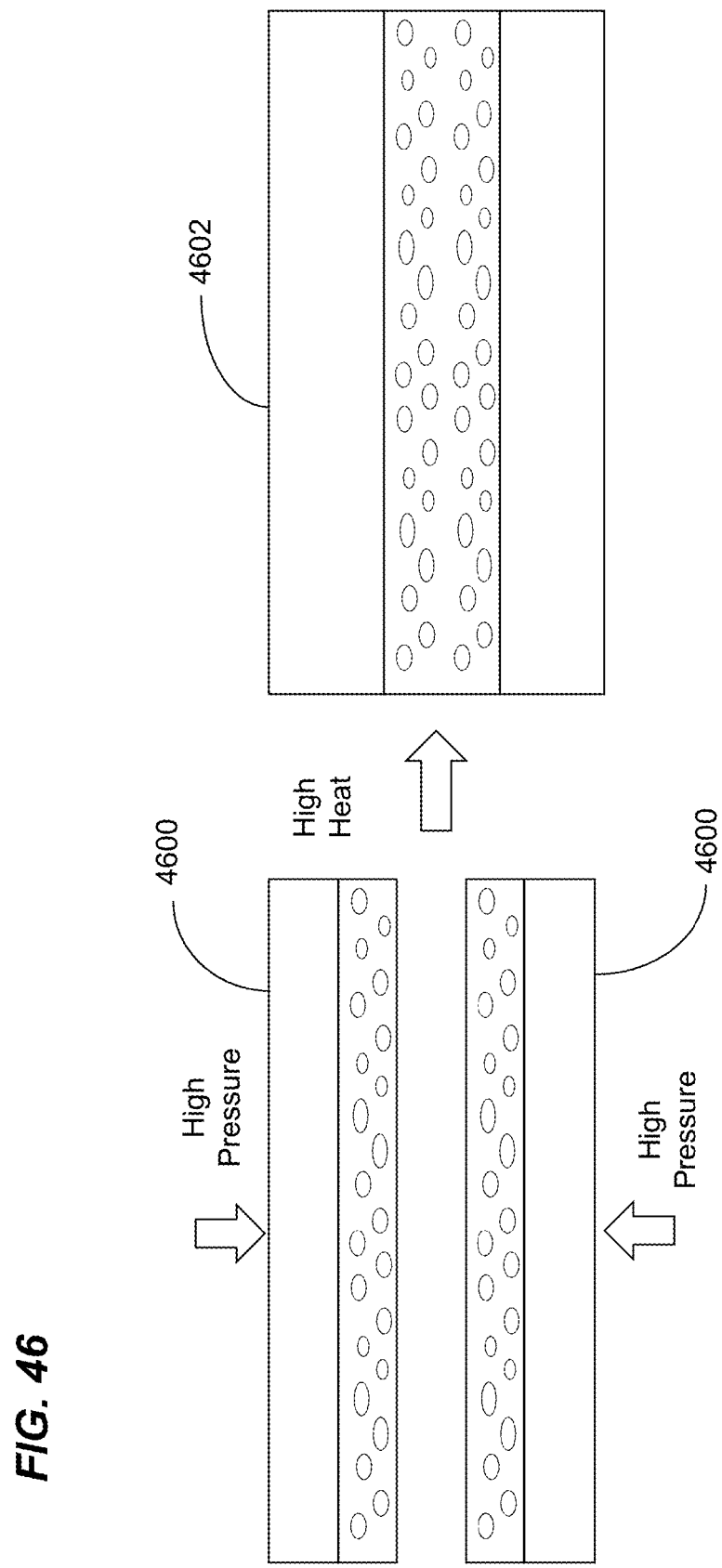

FIG. 46 is a cross sectional view of step two of the composition and manufacturing method for the metamaterial substrate structure.

FIG. 47 is a cross sectional view of step three of the composition and manufacturing method for the metamaterial substrate structure.

Figure 48:
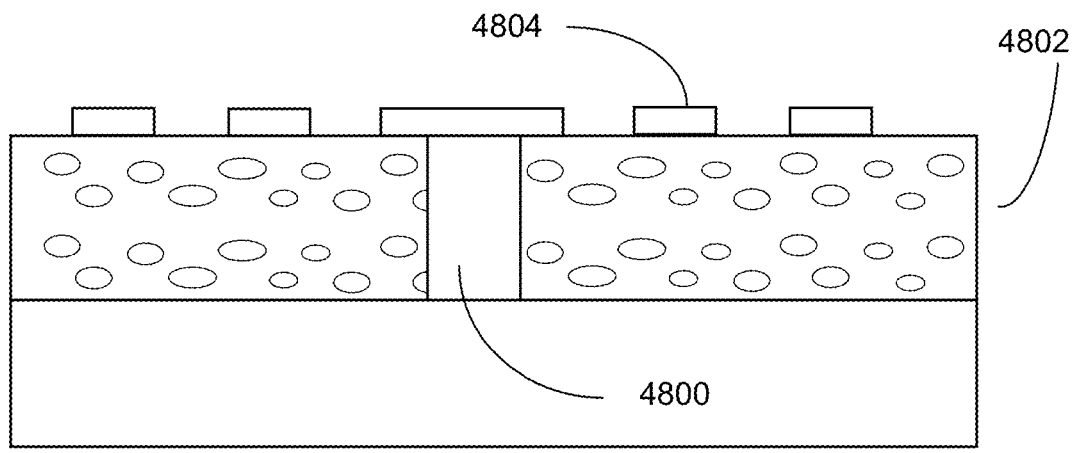

FIG. 48 is a cross sectional view of step four of the composition and manufacturing method for the metamaterial substrate structure.

Figure 49:
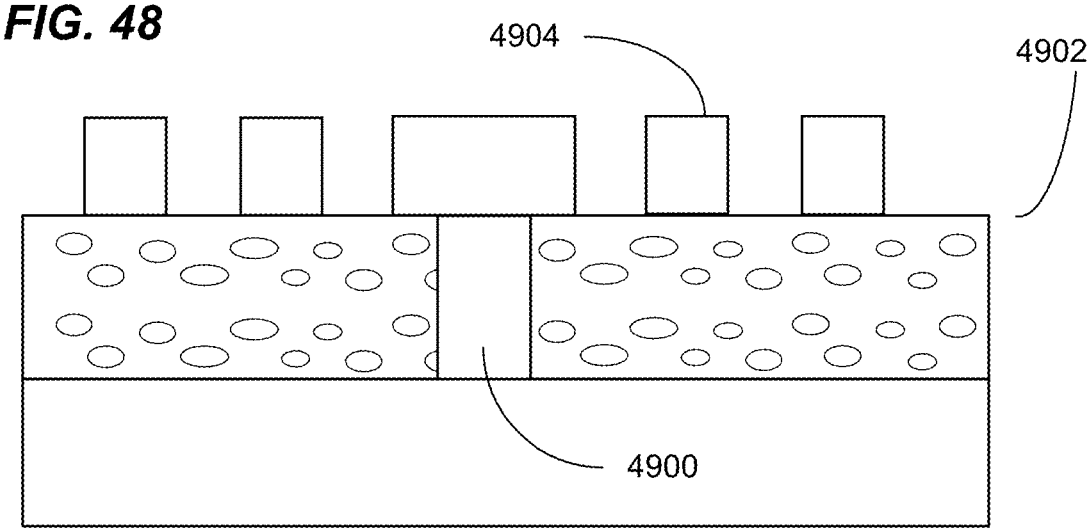

FIG. 49 is a cross sectional view of step five of the composition and manufacturing method for the metamaterial substrate structure.

Figure 50:
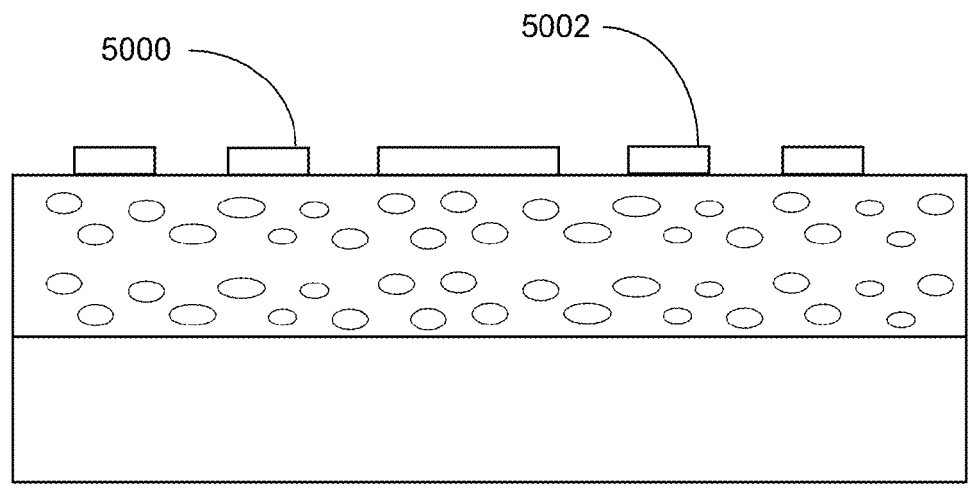

FIG. 50 is a cross sectional view of step six of the composition and manufacturing method for the metamaterial substrate structure.

Figure 51:
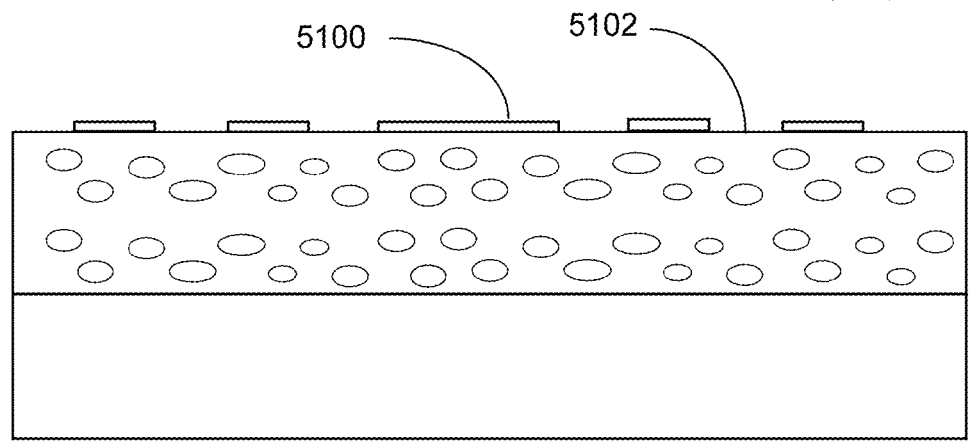

FIG. 51 is a cross sectional view of step seven of the composition and manufacturing method for the metamaterial substrate structure.

Figure 52:
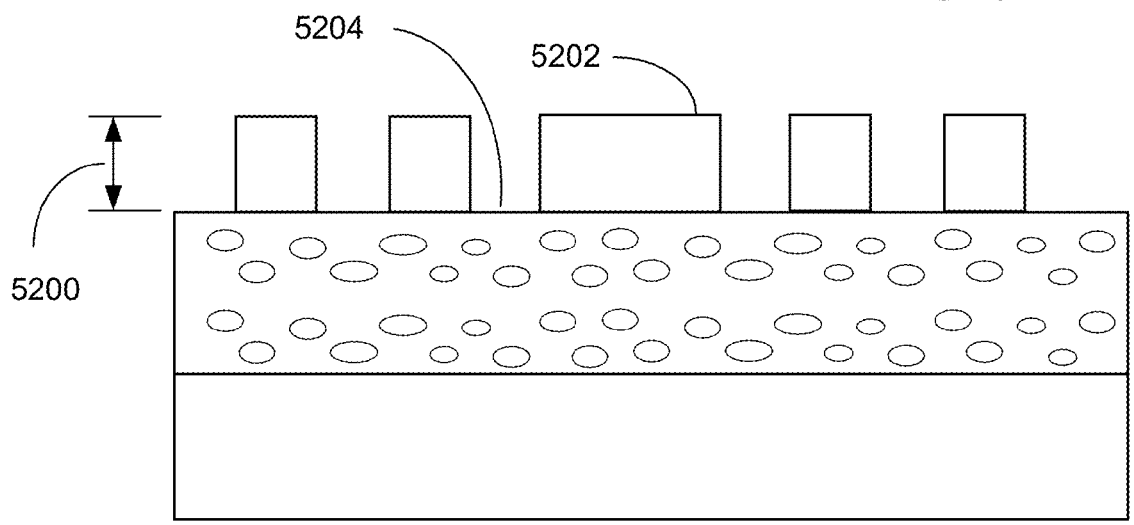

FIG. 52 is a cross sectional view of step eight of the composition and manufacturing method for the metamaterial substrate structure.

DETAILED DESCRIPTION

Metamaterial substrates are a new class of ordered artificial composites that exhibit ultra-thin dielectric thickness with exceptional electromagnetic properties not readily observed in conventional circuit materials that are used as ground, reference, or reflective planes in SiP modules and multilayer PCBs. Their precise shape, geometry, size, orientation, and arrangement can affect electromagnetic waves in a manner that exceeds the capabilities of conventional dielectric materials used in printed circuits. For example, their ultra-thin and ultra-small structure exhibit Electromagnetic Band Gaps ("EBG") which can be integrated in microwave devices and SiP modules to improve performance. They can be used as circuit materials to design amplifiers, filters, power dividers, baluns, etc. They can be used in small outline and large format PCBs to provide reduced losses in transmission line structures. In addition to microwave devices, metamaterial substrates can be used in the design of antennas. Since they can provide EBG, metamaterial substrates can be used to enhance the isolation between closely packed Multiple Input Multiple Output ("MIMO") antenna systems. They are also used to miniaturize antennas and to modify the characteristics of antennas.

In addition, metamaterial substrates can be used to produce materials with a user-designed electromagnetic response at a defined range of operating frequencies. This enables novel electromagnetic behaviors such as negative refractive index, lensing, absorbers, and invisibility cloaks. Such metamaterials can be classified as a Frequency Selective Surface ("FSS") or Artificial Magnetic Conductor ("AMC").

Figure 6:
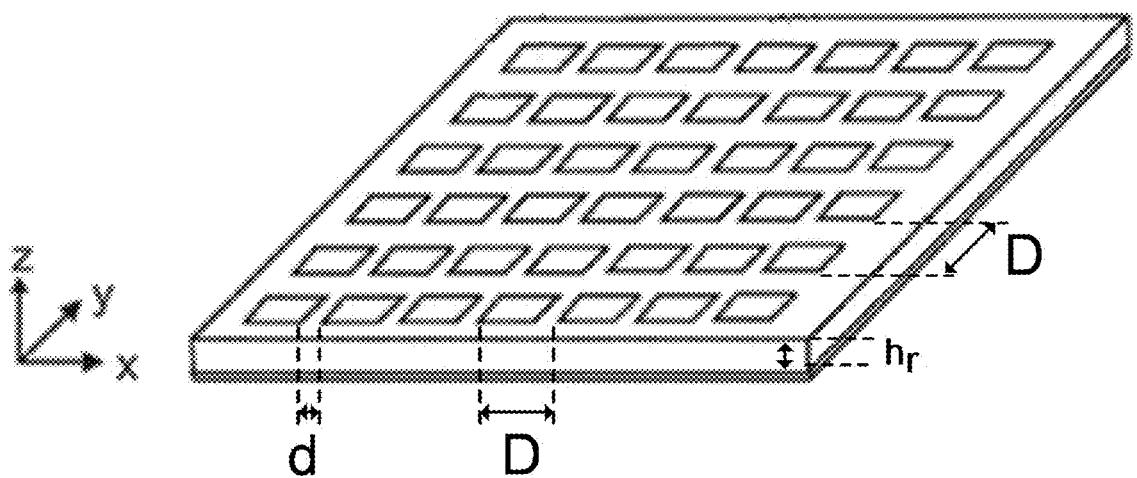
FIG. 6 is a perspective view of a basic structure of a metamaterial substrate comprises with specific structure of periodically arrayed UEs.

Metamaterial substrates can be realized by repeating a basic building block in a specific periodic structure. FIGS. 6 and 10A, B, C & D and 11 illustrate the structure and steps taken in miniaturizing the structure to form a metamaterial substrate or a substantially small sized and thinner EBG structure 1000 in accordance with the present invention. The basic building block of the periodic structure is referred as a substantially small sized and thinner coiled unit element (UE) or coiled UE 1002 in accordance with the present invention, and it defines the basic periodic structure and properties of the metamaterial substrates of the present invention.

The advantages of using metamaterial substrates in antennas include:
1. Provides EBG to modify the characteristics of antennas.
2. Increases antenna efficiency and gain.
3. Antenna miniaturization.
4. Enhance the isolation between closely packed MIMO antenna systems.
5. Reinforces radiation leading to a very highly directive beam.

Combining metamaterial substrates, antenna structures, miniaturization, and heterogeneous 3D integration of electronic circuits forming end-to-end, mixed-signal solutions may achieve antenna to baseband solutions. Thus, the use of metamaterial substrates offers the potential for large-scale adoption of wireless connectivity technologies through integration, size reduction, efficiency improvements and economies of scale and shortens design cycles for compact product designs.

Various applications of metamaterial substrates include:
1. Ultra-thin (e.g. as thin as 17 to 100 μm) metamaterial substrate inspired PCB laminates composite of ultra-small UE that may be combined with electronic circuit component or buried in any layer of multilayer PCBs by conventional lamination processes for circuit designs capable of transmitting, receiving and reflecting electromagnetic energy, altering electromagnetic properties of natural circuit materials, enhancing electrical characteristics of electronic components (such as filters, antennas, baluns, power dividers, transmission lines, amplifiers, power regulators, and printed circuits elements) in systems and sub-systems circuit designs. Ultra small UE may mean from 1 mm×1 mm and up of UE and then arrayed in periodic order with a gap d as shown in FIGS. 6 and 10A B, C & D throughout the entire production panel (for example, 24"×18", 18"×12", 12"×10", etc.) of the metamaterial substrates or in an array of UE (for example, 1×2, 2×2, 3×2, 3×3, etc. to form the metamaterial inspired PCB laminates or substrates with EBG at defined range of operating frequencies.
2. Enabling a practical miniature antennas with small ground plane. Some embodiments may combine the miniature antennas and small ground plane with filters, amplifiers, or other electronic components inside the PCBs by 3D heterogeneous integration in the form of 3D system-in-package (collectively, "3D-SiP") device or a 3D antenna-in-package (collectively, "3D-AiP") for wireless connectivity devices. Small ground plane may mean 5 mm×5 mm for a 2.4 GHz antenna or 13 mm×13 mm for a 1.5 GHz antenna.
3. Metamaterial substrate-inspired 3D-AiP may further be evolved into different configurations with different arrangement of components inside or outside of the PCB, utilizing the 3-dimensional volume of the packaging structure.
4. Magneto dielectric materials as superstrate structure may be combined with the metamaterial substrate-inspired 3D-AiP.

A metamaterial-inspired antenna may be composed with the following elements for antenna performance enhancement and antenna miniaturization. Some embodiments may be implemented as 3D-SiP or 3D-AiP depending on whether electronic components are embedded inside or mounted on the external layers of the PCBs.
1. Ultra-thin and ultra-small UE having practical dimensions for substrate embedding or PCB lamination processes.
2. The ultra-thin and ultra-small UE provides an EBG ground plane or EBG surface at the desired operating frequency.
3. Some embodiments may comprise magneto dielectric materials as a superstrate structure in the metamaterial-inspired antenna. The magneto dielectric materials act as superstrate to enhance permeability (e.g., $\mu_r > 1$) which contributes to antenna miniaturization.
4. The size of the antenna element and antenna ground plane may be tremendously reduced by placing the antenna element on the top of a metamaterial substrate which exhibits EBG ground plane or surface.
5. The EBG surface with and without the combination of the magneto dielectric superstrate can provide a high miniaturization factor ($\sqrt{\in_r \mu_r}$) for antenna miniaturization and enable practical dimensions for 3D-SiP or 3D-AiP device. Practical dimensions of a 3D-SiP or 3D-AiP may mean 25 mm×25 mm or less. Some embodiment of a 3D-SiP or 3D-AiP may be as small as 5 mm×5 mm or less.
6. At least one of a SAW filter, lumped elements filter, and amplifier can be integrated with the metamaterial-inspired antenna to enhance radio cohabitation.

Metamaterial substrates may be realized by repeating a basic building block in a specific periodic pattern. The basic building block is known as the UE, and can define the basic properties of the metamaterial substrates. FIG. 6 is a perspective view of a structure of a metamaterial substrate. Distance D is the period between each UE and "d" is the gap between each UE. Thickness h is the separation between the top conductor and the bottom conductive plane of the UE element. A dielectric thickness h of 0-200 μm may be achieved with this invention.

EBG based metamaterials substrates are also referred to as Artificial Magnetic Conductors ("AMC"). Artificial magnetic materials are a branch of metamaterials which are designed to provide desirable magnetic properties which do not occur naturally. Such artificial structures are designed to provide, for example, either negative or enhanced positive (e.g., higher than one) relative permeability. Enhanced positive relative permeability, $\mu r > 1$, is very useful for antenna miniaturization.

In addition, the reflection phase of an incident wave is a characteristic of the AMC. The phase of the reflected electric field has a normal incidence which is the same phase of the electric field impinging at the interface of the reflecting surface. The variation of the reflection phase is continuous between +180° to −180° relative to the frequency. A zero occurs at one frequency, where resonance occurs. The useful bandwidth of an AMC is generally between +90° to −90° on either side of the central frequency. At this boundary condition, in contrast to the case of a conventional metal ground plane, an AMC surface can function as a new type of ground plane for low-profile wire antennas suitable for wireless communication systems. For example, when a horizontal wire antenna is extremely close to an AMC surface, the current on the antenna and its image current on the ground plane are in-phase, rather than out-of phase, thereby advantageously strengthening the radiation.

Smaller physical size, wider bandwidth, and higher efficiency are desirable parameters for antennas in wireless communications. Considering a patch antenna as an example, the size of the patch is proportional to the wavelength in the substrate which is inversely related to the factor:

$$\sqrt{\mu_r \epsilon_r}$$

where $\epsilon_r$ and $\mu_r$ are the relative permittivity and permeability of the substrate. Therefore, by using high dielectric material (a material with high permittivity, $\epsilon_r$) miniaturization can be achieved by the factor of $\sqrt{\epsilon_r}$. However, since the wave impedance, Z is proportional to the ratio of $\mu r$ and $\epsilon_r$:

$$Z = \sqrt{\frac{\mu}{\epsilon}} = \sqrt{\frac{\mu_r}{\epsilon_r}} Z_0$$

In this case, there can be a high impedance mismatch between the air and the substrate. Due to this mismatch, most of the energy will be trapped in the substrate resulting in narrow bandwidth and low efficiency. To solve this problem, instead of using high dielectric material (e.g., $\epsilon_r > 1$), a substrate with magneto-dielectric material (both $\epsilon_r > 1$, and $\mu_r > 1$) can be used. By choosing moderate values for $\epsilon_r$ and $\mu_r$, a high miniaturization factor (e.g., $\sqrt{\epsilon_r \mu_r}$) can be achieved, while keeping the wave impedance close to that of air leading to less of a mismatch.

Figure 7:
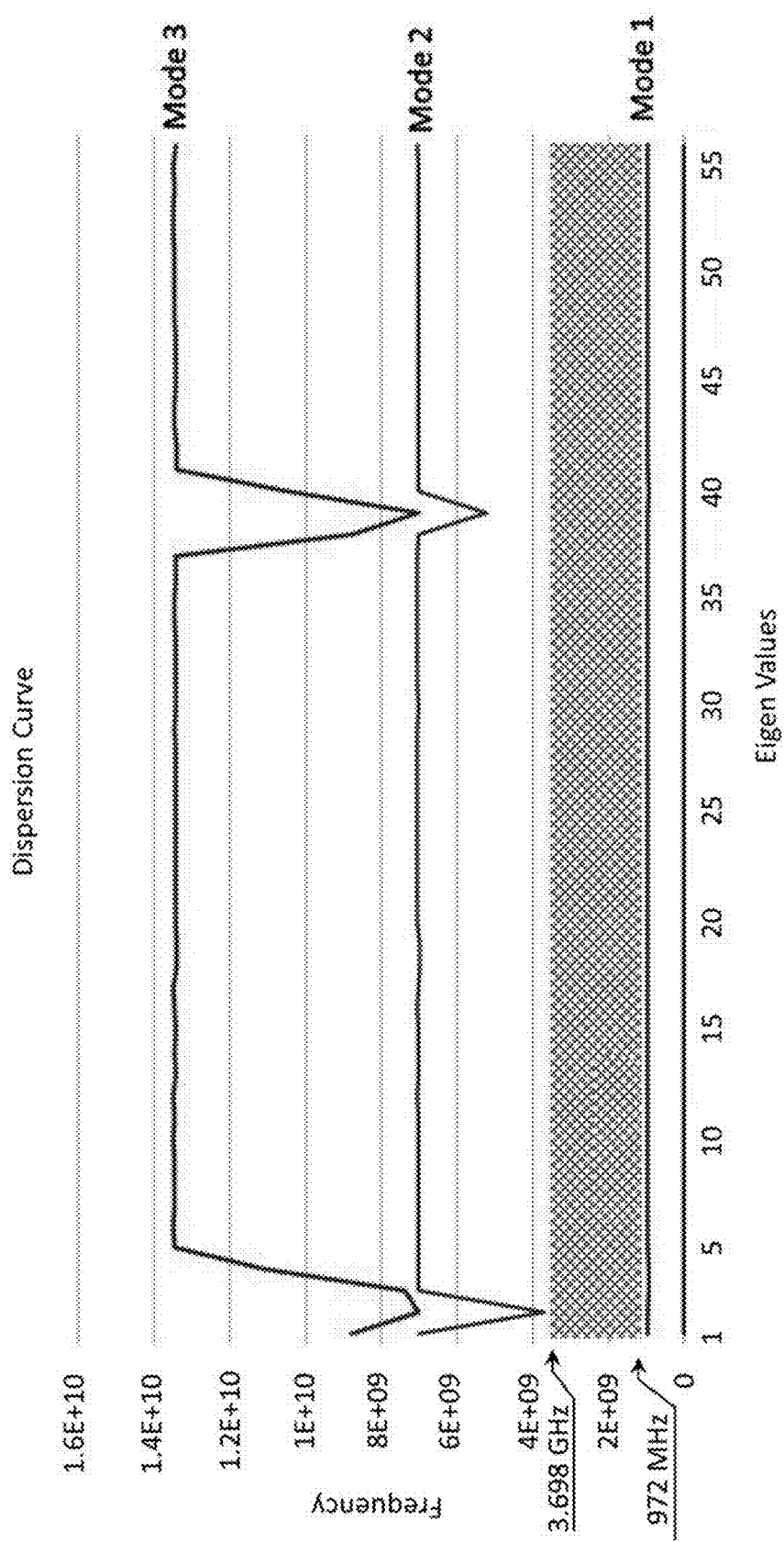
FIG. 7 is a graph of a metamaterial substrate with ultra-thin UE A from Table 2 creating an EBG from 972 MHz to 3.698 GHz.

FIG. 7 is a graph of a metamaterial substrate with ultra-thin and ultra-small UE A from Table 2 creating an EBG from 972 MHz to 3.698 GHz.

Figure 8:
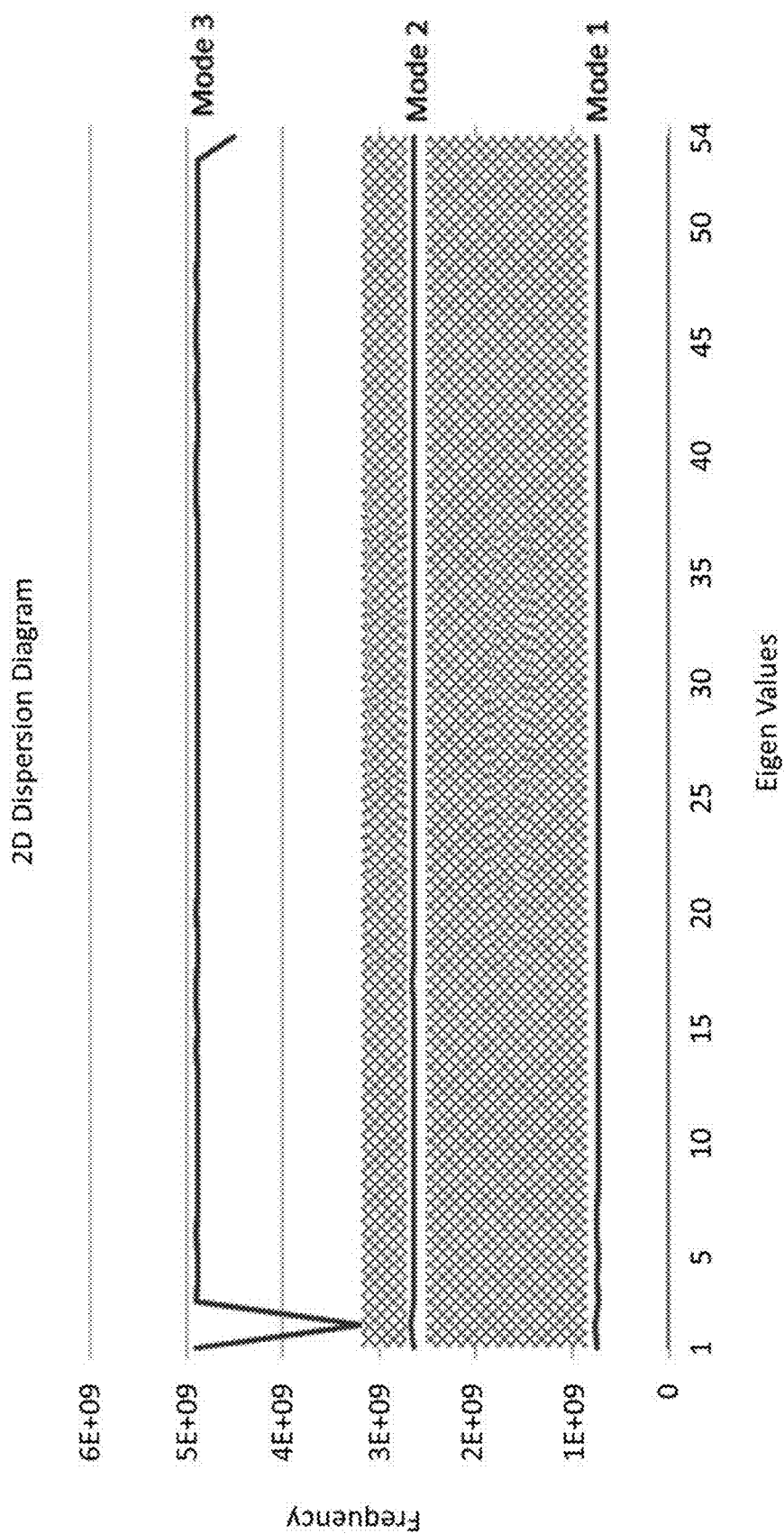
FIG. 8 is a graph of a metamaterial substrate with ultra-thin UE B from Table 2 creating an EBG from 756 MHz to 2.64 GHz.

FIG. 8 is a graph of a metamaterial substrate with ultra-thin and ultra-small UE B from Table 2 creating an EBG from 756 MHz to 2.64 GHz.

Figure 9:
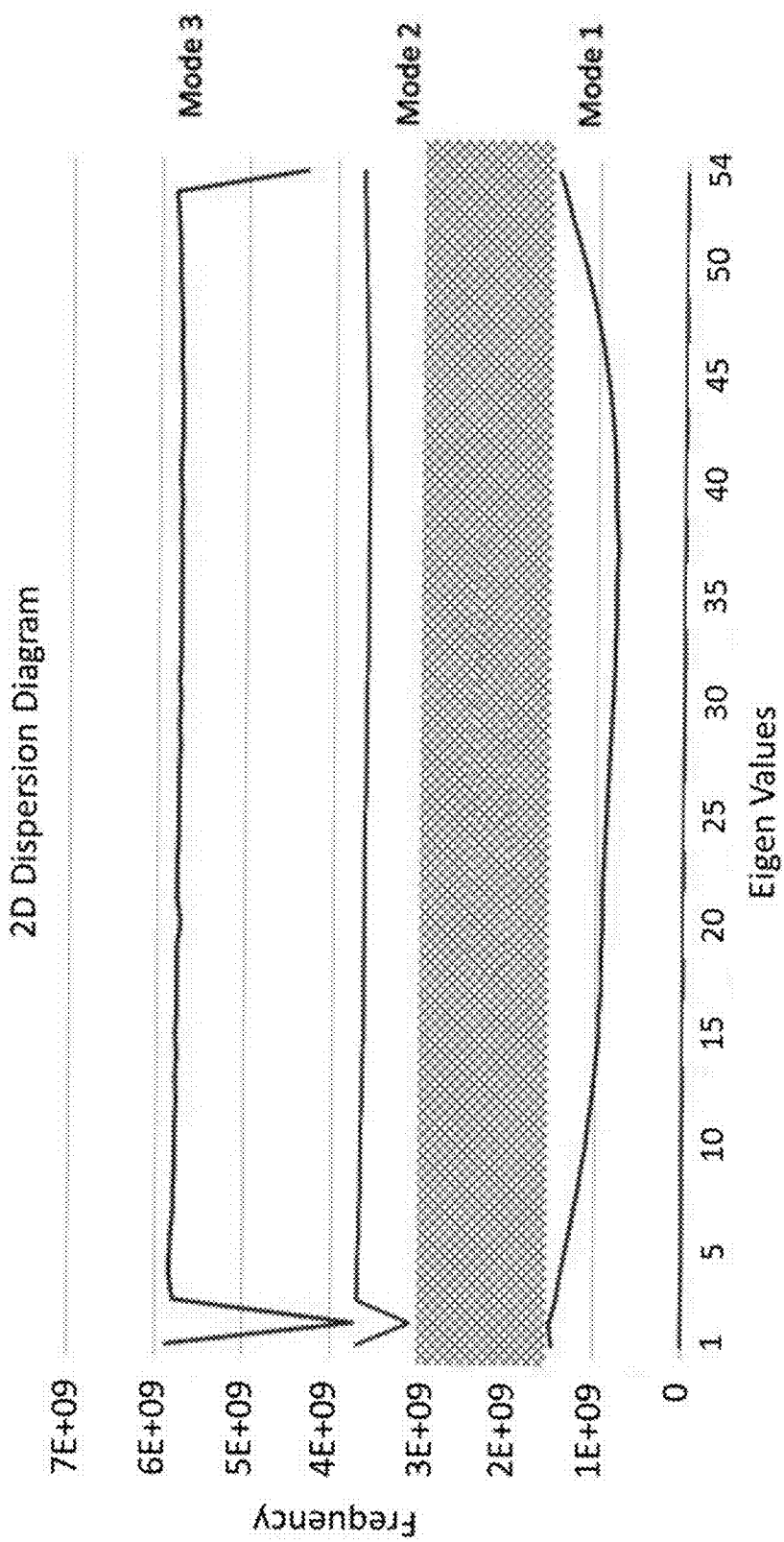
FIG. 9 is a graph of a metamaterial substrate with ultra-thin UE C from Table 2 creating an EBG from 1.5 GHz to 3.1 GHz.

FIG. 9 is a graph of a metamaterial substrate with ultra-thin and ultra-small UE C from Table 2 creating an EBG from 1.5 GHz to 3.1 GHz.

Figure 10C:
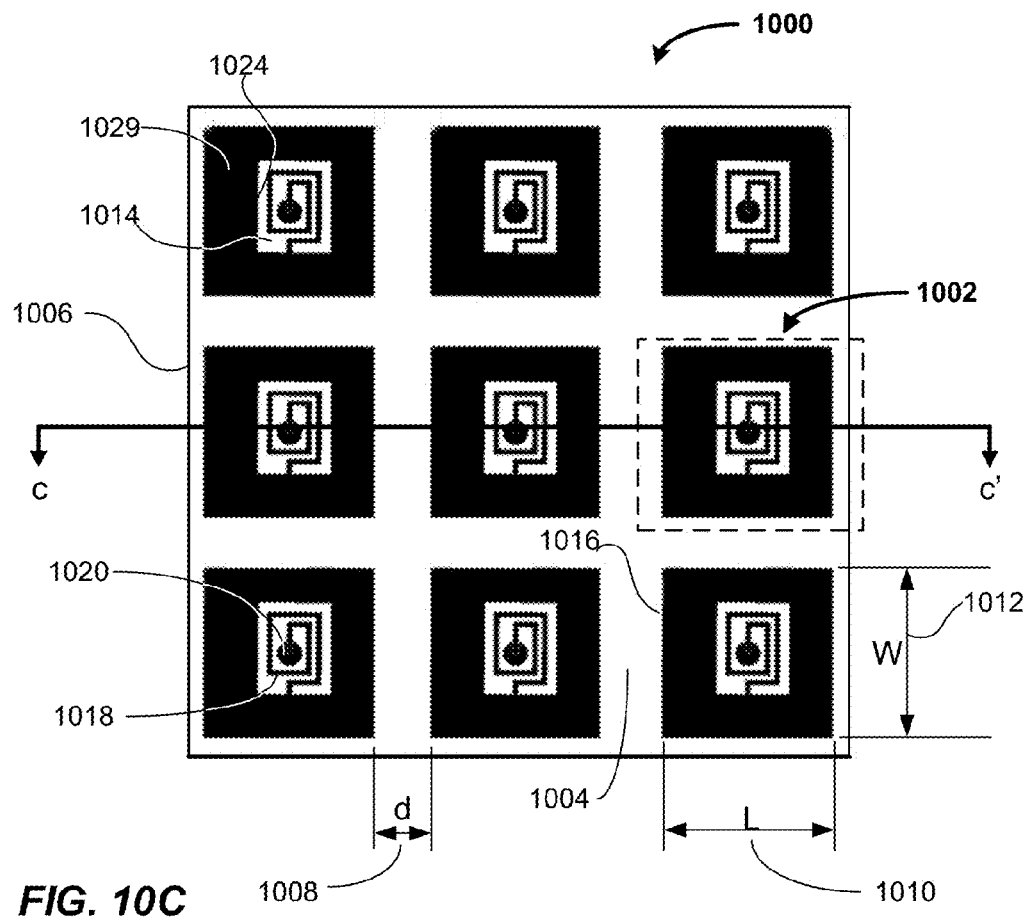
FIGS. 10C and 10D are respectively a top perspective view and cross-sectional view illustrating a substantially small sized and thinner EBG structure formed with periodically arrayed coiled UE in accordance with the present invention.
Figure 10D:
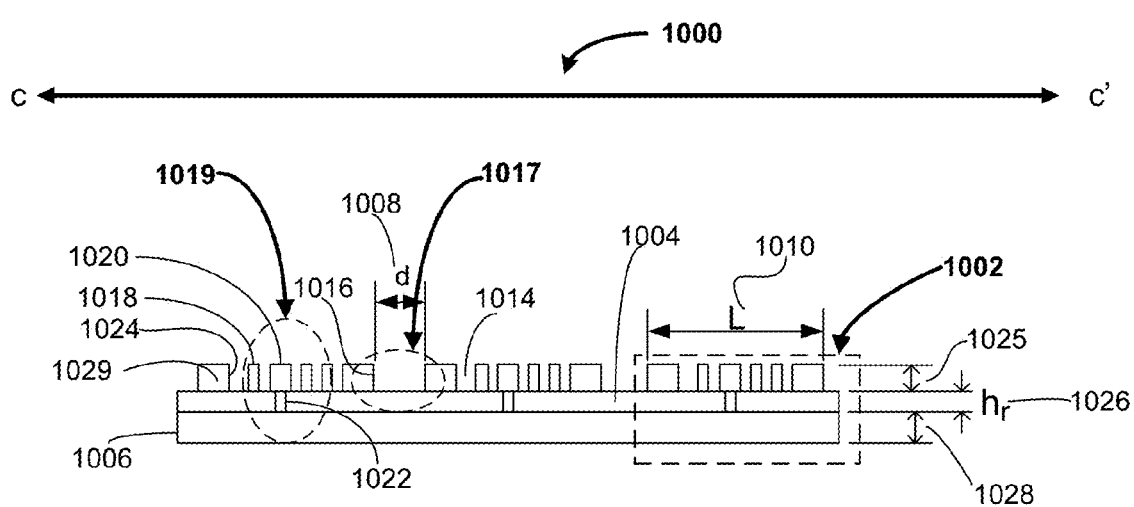

FIG. 10A is a top perspective view and FIG. 10B is a cross-sectional view to illustrate an embodiment of the present invention of a substantially thinner (e.g., $\frac{1}{4000}\lambda_0$ @ 2.45 GHz) and small sized coiled UE 1002 while FIGS. 10C and 10D illustrate an array of the coiled UE 1002 constituting a substantially small sized and thinner metamaterial substrates or electromagnetic band gap (EBG) structure 1000 which can be applied into the construction of 3D-SiP or 3D-AiP devices. The EBG structure 1000 comprises periodically arrayed conductive elements 1029 on first layer 1025, a dielectric material with thickness $h_r$ on second layer 1026, and a contiguous conductive plane 1006 on third layer 1028. Each of the coiled UE 1002 has a conductive area 1024 defined by its outer perimeter 1016 with a length L 1010 and width W 1012. The conductive area 1024 surrounds an opening 1014; a coplanar inductive element 1018 is created inside the opening 1014. The coplanar inductive element 1018 is connected to the conductive area 1024 and to a conductive pad 1020. The inductive element 1018 can substantially increase the left-handed shunt inductance $L_L$ when it is electrically coupled to the bottom contiguous conductive plane 1006 through a conductive post 1022 which connected with the pad 1020, inductive element 1018 and the contiguous conductive plane 1006 provides an inductive connection means 1019. The spacing gap d 1008 between the juxtaposed edges of the outer perimeter 1006 of conductive elements 1029 on or within the dielectric 1004 comprise a capacitive surface means 1017.

Referring back to FIG. 4 and FIG. 5, single arm coiled UEs 1002 as shown in FIGS. 10A and 10C can be created to increase the left-handed shunt inductance $L_L$. FIGS. 10C and 10D are respectively a top perspective view and cross-sectional view illustrating an array of the coiled UE 1002 illustrating a substantially small sized and thinner 3×3 periodic EBG structure 1000 while FIG. 10A is a top perspective view of the substantially thinner and small sized coiled UE 1002 that comprises one of the UEs of FIGS. 10C and 10D. The spacing gap d 1008 between the coiled UEs 1002 may range between 0-500 μm with spacing gap d 1008 of 175 μm under current known parameters.

FIGS. 10A, B, C & D illustrates the use of very small and thin printed wire inductive element 1018 with illustrative linewidth of 50 μm and spaces between the lines of 50 μm or smaller that can be created inside the opening 1014 of the coiled UE 1002 structure using an ultra-thin (≤30μ) dielectric 1004 having a high (e.g., on the order of 17~25) relative permittivity $\epsilon_r$, also commonly known as "Dielectric Constant" ("Dk") thereby increasing the required left-handed inductance $L_L$ for the desired operating frequencies. In contrast, prior art UEs use the via on a thicker dielectric material to create the required $L_L$.

Metamaterial substrates are artificial circuit materials, and may be referred to as Left-Handed Metamaterials ("LHM"). In some embodiments, the metamaterial substrates are ultra-small and ultra-thin and designed for use in mass-produced, low-cost products. As an example of practical dimensions, some embodiments may be practically constructed with organic PCB prepregs (e.g., sheets of B-staged resin with reinforcing fabric) having a thickness of 30 μm to 300 μm. In some embodiments, a copper conducting layer having a thickness of 5 to 18 μm is possible. Ultra-thin EBG surface or metamaterial substrates can be manufactured using one-layer of PCB laminate. Each layer of PCB laminate in a multi-layer PCB may typically have a thickness of 30-200 μm. Ultra-thin EBG surface or metamaterial substrates manufactured using one-layer of dielectric material may be integrated into 3D-SiP or 3D-AiP SiP or integrated into a multi-layer PCB.

By way of example and not a limitation, the size (x, y, z or W, L, $h_r$) of conventional UE may be in the scale of a few millimeters or even greater than 10 mm, however larger sizes may not be practical for 3D-SiP, 3D-AiP, and multi-layer PCB lamination process. As illustrated in FIGS. 10A and 10C, practical dimensions for substantially small sized and thinner coiled UE 1002 manufactured using one-layer of dielectric 1004 material may be 1.75 mm-2.4 mm in L 1010 and W 1012 dimensions. As illustrated in FIG. 10B, the thickness (z or hr) 1026 may be 0-200 μm. Dimensions greater than this, while within the scope of the present invention, may not be practical in the cited applications. The above dimensions are described in relation to Tables 1 and 2.

As illustrated in FIG. 10C, in the case of a coiled UE 1002 having illustrative dimensions of 1.75×1.75 mm, a 3×3 array would be 6.5×6.5 mm Such a 3×3 array may be a practical size to structure an EBG ground plane or surface in a 3D-SiP or 3D-AiP device, or standard multi-layer PCBs (e.g., for a compact application). A 6.5×6.5 mm EBG ground plane enables the design of a miniature antenna on the top of this surface. An antenna may be integrated into a 3D-SiP design or a multi-layer PCB (e.g., of a highly compact application). The antenna size and the antenna ground plane may be approximately the size of the 3D-SiP or 3D-AiP device.

Metamaterial substrates may have high effective values of relative permittivity and permeability. These characteristics enable a higher miniaturization factor (see e.g., the equation for miniaturization factor). Metamaterial substrates may permit reductions in physical lengths of electrically conducting elements such as antennas and filter and transmission line elements, because of the higher miniaturization factor. Some embodiments improve radiation efficiencies by reducing or even eliminating internal reflections (e.g., surface wave) between antenna elements and an EBG ground plane. Metamaterial substrate structures additionally may provide a very high Q-factor to electrically conducting elements. Metamaterial substrate structures may provide frequency band filtering functions that, for example, would normally be provided by other components typically found in an RF front-end. The high Q-factor to the electrically conducting elements may provide almost lossless transmission line elements such that the loss in the operating frequency range is extremely small.

With the increased left-handed shunt inductance, $L_L$, formed by the inductive element 1018, the W 1012 and L 1010 of the coiled UE 1002 may be reduced to create a miniaturized coiled UE 1.75 mm×1.75 mm, as shown in FIG. 10A. The juxtaposed edges of the outer perimeter 1016 between each coiled UE 1002 form the left-handed series capacitance $C_L$ as explained in relation to FIG. 1, FIG. 2, FIG. 4 and FIG. 5. The left-handed capacitance $C_L$ is significantly reduced due to ultra-small dimensions in W 1012 and L 1010 of the miniaturized coiled UE 1002. The increase in inductance $L_L$ can compensate for the decrease in $C_L$. Alternatively, or in addition to, dielectric 1004 material with higher relative dielectric permittivity ($\in_r$), can be used to increase the $C_L$. In some embodiments, a dielectric 1004 material with $\in_r$ 17-25 may be used. However, the dielectric thickness $h_r$ 1026 may be needed to be ultra-thin on the scale of 200 μm or less but not with the scale of 1 mm or up as with conventional UE. And the spacing gap d 1008 between each miniaturized coiled UE 1002 should be ultra-small on the scale of 500 μm or less but not with the scale of 1 mm or up with conventional UE.

FIG. 10B is the cross sectional side view of a substantially small sized and thinner coiled UE 1002 as illustrated in the FIG. 10A where the conductive elements 1029 on first layer 1025 is placed on top of a dielectric 1004 structure. A conductive post or via 1022 connects the conductive pad 1020 to the contiguous conductive plane 1006 provides an inductive connection means 1019. As a result, thickness $h_r$ 1026 of the dielectric 1004 can be reduced. As an illustrative embodiment of the present invention, the dielectric thickness $h_r$ 1026 may be as thin as 0-200 μm with thickness $h_r$ of 23 μm, 25 μM, and 30 μm under current known parameters. The coiled UE 1002 may be as small as 1/70λo in W 1012 and L 1010, and the thickness $h_r$ may be less than 1/4000λo. As an illustrative embodiment of the present invention, the λo is the free space wavelength referred to operating frequency at 2.45 GHz. The dielectric 1004 may also include quantities of barium titanate $BaTiO_3$ or other micro- and nanograin organic filler 1030 for permittivity adjustment.

Different illustrative embodiments in the dimensions of various sample coiled UEs 1002 and corresponding miniaturization ratios compared to a free space wavelength $\lambda_o$, are shown in Table 2. The substantially small sized and thinner coiled UEs 1002 can create substantially small sized and thinner EBG structures 1000 with band gap of about 1-3 GHz.

TABLE 2

| $\lambda_o$ @ 2.45 GHz = 122.4 mm (122400 μm) | UE Size (W 1012 & L 1010) (mm) | Gap (d) 1008(mm) | Dielectric Thickness ($h_r$) 1026(μm) | Band-gap (GHz) | Q Factor |
|---|---|---|---|---|---|
| (prior art with conventional UE, ratio delta = d/$h_r$ < 1) | | | | | |
| Prior Art with Conventional UE | 15 | 1.5 | 3000 | 2~3 | |
| Ratios compare to free space wavelength $\lambda_o$ | beta 0.1 $\lambda_o$ (1/8 $\lambda_o$) | gamma 0.01 $\lambda_o$ (1/80 $\lambda_o$) | alpha 0.02 $\lambda_o$ (1/40 $\lambda_o$) | | |
| (with coiled UE A 1002, ratio delta = d/$h_r$ > 1) | | | | | |
| Coiled UE A 1002 with Dielectric thickness $h_r$: 30 μm | 1.75 | 0.5 | 30 | 972 MHz~3.698 GHz | 200 |
| $\in_r$ = 17 Ratios compare See FIG. to free space 11 wavelength $\lambda_o$ Reduction | beta 0.01 $\lambda_o$ (1/70 $\lambda_o$) 10 fold | gamma 0.004 $\lambda_o$ (1/245 $\lambda_o$) 3 fold | alpha 0.00025 $\lambda_o$ (1/4080 $\lambda_o$) 100 fold | | |
| (with coiled UE AA 1002, ratio delta = d/$h_r$ > 1) | | | | | |
| Coiled UE AA 1002 (an alternative to A) with dielectric thickness $h_r$: 23 μm or 25 μm | 1.75 | 0.175 | 23 or 25 | 1 GHz~3 GHz | |
| $\in_r$ = 18 Ratios compare See FIG. to free space 11 wavelength $\lambda_o$ Reduction | beta 0.01 $\lambda_o$ (1/70 $\lambda_o$) 10 fold | gamma 0.0014 $\lambda_o$ (1/699 $\lambda_o$) 7 fold | alpha 0.0002 $\lambda_o$ (1/5321 $\lambda_o$) 133 fold | | |

TABLE 2-continued

| $\lambda_o$ @ 2.45 GHz = 122.4 mm (122400 µm) | UE Size (W 1012 & L 1010) (mm) | Gap (d) 1008(mm) | Dielectric Thickness ($h_r$) 1026(µm) | Band-gap (GHz) | Q Factor |
|---|---|---|---|---|---|
| (with coiled UE B 1002, ratio delta = d/$h_r$ > 1) | | | | | |
| Coiled UE B 1002 ($h_r$ = 50 µm) | 2.4 | 0.2 | 50 | 756 MHz~2.64 GHz | 71 |
| $\epsilon_r$ = 10  Ratios compare | beta | gamma | alpha | | |
| See FIG. to free space | 0.02 $\lambda_o$ | 0.0016 $\lambda_o$ | 0.0004 $\lambda_o$ | | |
| 11  wavelength $\lambda_o$ | (1/51 $\lambda_o$) | (1/612 $\lambda_o$) | (1/2448 $\lambda_o$) | | |
|  Reduction | 6 fold | 8 fold | 60 fold | | |
| (with coiled UE C 1002, ratio delta = d/$h_r$ > 1) | | | | | |
| Coiled UE C 1002 ($h_r$ = 127 µm) | 2.4 | 0.2 | 127 | 1.5 GHz~3.1 GHz | 423 |
| $\epsilon_r$ = 10  Ratios compare | beta | gamma | alpha | | |
| See FIG. to free space | 0.02 $\lambda_o$ | 0.0016 $\lambda_o$ | 0.001 $\lambda_o$ | | |
| 11  wavelength $\lambda_o$ | (1/51 $\lambda_o$) | (1/612 $\lambda_o$) | (1/964 $\lambda_o$) | | |
|  Reduction | 6 fold | 8 fold | 24 fold | | |
| (with coiled UE D 1002, ratio delta = d/$h_r$ > 1) | | | | | |
| Coiled UE D 1002 ($h_r$ = 30 µm) | 2.4 | 0.2 | 30 | 1~3 GHz | 24 |
| $\epsilon_r$ = 4.4  Ratios compare | beta | gamma | alpha | | |
| See FIG. to free space | 0.02$\lambda_o$ | 0.0016$\lambda_o$ | 0.00025$\lambda_o$ | | |
| 11  wavelength $\lambda_o$ | (1/51 $\lambda_o$) | (1/612 $\lambda_o$) | (1/4000 $\lambda_o$) | | |
|  Reduction | 6 fold | 8 fold | 100 fold | | |

In FIG. 11, the flow diagram summarizes the miniaturization means and steps taken in miniaturizing the coiled UE 1002 and EBG structure 1000 which have been described in the corresponding paragraphs, FIGS. 10A-10D and Table 2 in accordance with the invention. Steps 1102 and 1104 summarize how a first miniature means and a first ratio alpha are constructed and associated with the dielectric 1004 with thickness $h_r$ 1026. In step 1104, the first ratio alpha compares the thickness $h_r$ 1026 to a predetermined free space wavelength $\lambda_o$ as shown in the Table 2. Steps 1106 and 1108 summarize how a second miniature means, a second ratio beta and a third ratio gamma are constructed and associated with the length L 1010, width W 1012, the gap d 1008 and the relative dielectric permittivity $\in_r$ of the dielectric 1004 with each of the coiled UE 1002. In step 1108, the second ratio beta compares the L 1010 or W 1012 to a predetermined free space wavelength $\lambda_o$, as shown in the Table 2; and the third ratio gamma compares the gap d 1008 to a predetermined free space wavelength $\lambda_o$ as shown in the Table 2. Step 1110 summarizes how a third miniature means and a fourth ratio delta are constructed and associated with the EBG structure 1000 to distinguish the present invention of the EBG structure 1000 from prior art with conventional UE. In step 1100, the fourth ratio delta compares the gap d 1008 to the dielectric thickness $h_r$ 1026. In prior art with conventional UE, the ratio delta is less than 1 (i.e. d/$h_r$<1). In the contrast, the ratio delta in accordance to the present invention is larger than 1 (i.e. d/$h_r$>1), which provides good miniaturization results to a substantially small sized and thinner EGB structure 1000.

Metamaterial substrates exhibiting EBGs operating in the desired frequency bands, from the lowest of 756 MHz to the highest of 3.698 GHz, are illustrated in the dispersion diagrams shown in FIG. 7 to FIG. 9. This type of EBG ground plane or surface is useful for antenna miniaturization design for the applications of GPS at 1.5 GHz and ISM band transceiver at 2.4 GHz, and WLAN at 3.2 GHz.

In one embodiment, the band gap of EBG 1000 created with the coiled UE 1002 A and AA described in Table 2 is shown in FIG. 7. In another embodiment, the band gap of EBG 1000 created with the coiled UE 1002 B described in Table 2 is shown in FIG. 8. In another embodiment, the band gap of EBG 1000 created with the coiled UE 1002 C described in Table 2 is shown in FIG. 9. The attributes of width (W) 1012, length (L) 1010, gap (d) 1008, coil wiring width and space, dielectric thickness $h_r$ 1026, and relative dielectric permittivity $\in_r$ that can be altered to adjust the operating frequency of the band gap and the Q factor.

In some embodiments, two separate coils of the UE turn in the opposite direction to increase the inductance $L_L$. Such an arrangement is shown in FIG. 13 where the copper coil 1300 lays on top of a high Dk and ultra-thin dielectric substrate 1302. In FIG. 14, symmetrical four-arm looped coil UE 1400 has a plurality of copper loops 1402 coming from a via 1404 and overlaying a high Dk and ultra-thin dielectric substrate 1406 which split from the center and rotate outwards. FIG. 15 is a top view of a curved spiral coil UE with the curved spiral coil UE starting at a via and the copper coil radiating outward laying on a high Dk and ultra-thin dielectric substrate.

Two coiled UEs turning in the opposite direction may be stacked to form the double-layer coiled UE, as shown in FIG. 16. FIG. 16 is a perspective view of a double layered coil UE where the upper layer is a right hand oriented coil 1600. A high Dk and ultra-thin dielectric substrate 1602 separates the upper layer right hand oriented coil 1600 from a left hand oriented copper coil 1604. A via 1606 connects the upper layer right hand oriented coil 1600 from a left hand oriented copper coil 1604. FIG. 17 is a cross sectional side view of the double layered coil UE shown in FIG. 16.

A surface mount chip inductor embedded inside the PCB may be used to replace the coil structure as shown in FIG. 18 to provide the sufficient $L_L$ for the UE. A mushroom UE is illustrated with a chip inductor embedded inside the PCB. A square conductive patch of UE 1800 is positioned over a high Dk and ultra-thin dielectric material ($\in_r$>10, h<200 µm) 1802. In turn, the high Dk and ultra-thin dielectric 1802 over lays the additional conductive layer of 1804 and dielectric structure 1806. A shorting post via 1808 connects the square conductive patch UE 1800 through an opening on the conductive plane 1804 to the chip inductor embedded inside the PCB within layer 1806. The other side of the chip inductor is connected to the conductive plane 1804. FIG. 19 is a top view of the UE as illustrated in the FIG. 18 showing the top coiled element pattern that is replaced by a square conductive patch pattern.

FIG. 20 depicts an antenna of 4.8×5.5 mm operating at a frequency of 2.6 GHz. In some embodiments, the antenna of FIG. 20 may be reduced to about 3×3 mm, depending on the antenna and the EBG ground plane design.

A patch antenna 2000 with geometry of about 5 mm×5 mm may be overlaid on the top of the EBG ground plane or surface 2102 as shown in FIG. 20 and FIG. 21. When a small 5×5 mm antenna 2100 is constructed with a conventional ground plane 2102, the antenna cannot operate at 2 GHz as shown in the solid line 2300 of FIG. 23. After the small 5×5 mm antenna 2100 is positioned on top of a metamaterial substrate having an EBG ground plane or surface 2102, the small antenna 2100 resonates at about 1.87 GHz with more than 14 dB return loss as shown in the dotted line 2302 of FIG. 23. Various embodiments may be implemented for constructing a desired metamaterial substrate inspired antenna which enables practical antenna-in-package integration for wireless connectivity SiP devices.

In contrast, a comparable conventional miniature antenna design would necessarily be much larger to operate at 2.4 GHz. The reduction in antenna size over conventional antennas may be over 80-90%, in relation to the antenna body itself. A conventional miniature antenna needs a large ground plane to operate, for example, a ground plane of 50×50 mm. So, if the size of the ground plane is also taken into consideration, the reduction in antenna size is over 98% in this example. Small antenna constructed over the metamaterial substrate can practically, in size and thickness, be integrated into a 3DSiP or 3D-AiP, or be integrated into a compact PCBs with other embedded electronic circuits and components.

FIG. 22 is a perspective view of a small antenna element 2200 that is overlaid on an ultra-thin and ultra-small metamaterial substrate which provides an EBG ground plane or surface. The ultra-thin and ultra-small metamaterial substrate is constructed with a conductive ground plane 2206 which is positioned on the bottom side of a high Dk dielectric material 2202. A 3×3 array of coiled UE 2204 is positioned on the top of the ultra-thin and high Dk dielectric material 2202 to provide the EBG ground plane at desired operating frequency bands for the small antenna element 2200 at the top FIG. 24 is a cross sectional side view of a metamaterial antenna made with the coiled metamaterial substrate. The top layer may be used for an antenna, filter or transmission line 2400. Below the top layer 2400 lies a FR4 or other dielectric ($\epsilon_r$=1 to 17) 2402. Below the dielectric material 2402 lies the coiled EGB ground plane or metamaterial substrate 2404 that may further comprise coiled EBG UE(s) 2406; via(s) 2408; a high Dk and ultra-thin (h<200 µm) dielectric material ($\epsilon_r$>10) 2410; and a conductive layer 2412. The structure may also comprise a FR4 dielectric 2414 as well as another conductive layer 2416.

FIG. 25 is a cross sectional side view of a metamaterial antenna made with embedded chip inductor metamaterial substrates as illustrated in the FIG. 18 and FIG. 19. The top layer may be used for an antenna, filter or transmission line 2500. Below the top layer 2500 lies a FR4 or other dielectric ($\epsilon_r$=1 to 17) 2502. Below the dielectric material 2502 lies the coiled EBG ground plane or metamaterial substrate 2504 that may further comprise coiled EBG UE(s) 2506; via(s) 2508; a high Dk and ultra-thin (h<200 µm) dielectric material ($\epsilon_r$>10) 2510; a chip inductor(s) 2518 and a conductive layer 2512. The structure may also comprise a FR4 dielectric 2514, as well as another conductive layer 2516.

Combinations and permutations of the 3D embedded technology and integration of a miniaturized metamaterial substrate (e.g., EBG ground plane or surface) provide a Metamaterial-inspired 3D-AiP (Meta-AiP). Meta-AiP may enhance radio cohabitation, because of the increased isolation due to the intrinsic nature of metamaterial antennas and the integration of at least one of embedded filter(s), balun, and high linearity LNA with the metamaterial antenna inside of the Meta-AiP.

By way of example and not limitation, various methods of constructing metamaterial AiPs are illustrated below. For example, FIG. 26 shows that the structure is in the form of inverted BGA. This eliminates the conventional encapsulation method performed with resin on the top layer for many SiP devices. This is suitable for highly compact wireless system integration from the antenna to the baseband module. The baseband module is typically the largest chipset and can be attached to the bottom where the Meta-AiP is a mixed-signal device.

Other combinations are possible. For example, the structure in FIG. 26 may be modified, as shown in FIG. 27 and FIG. 28. The package type selected is based at least in part on the complexity and function of the application. In addition, the metamaterial substrates may comprise miniaturized coiled UE(s) as illustrated in FIG. 24 and/or miniaturized embedded inductor UE as illustrated in FIG. 25. For simplicity, the diagrams in FIGS. 27-29 are simplified and generalized as Meta-AiP.

FIG. 26 is a cross sectional side view of an inverted BGA Meta-AiP module with integrated metamaterial antenna. Advantages of the Inverted-BGA include:
1. Eliminates packaging and manufacturing process costs by omitting the post assembly for plastic encapsulation or metal shield.
2. RF shielding may be embedded inside the 3D structure during the PCB fabrication process.
3. Metamaterial antenna may be embedded on the top surface of the package.
4. All passives, filters, crystal, and active components may be embedded.
5. Excellent RF performance.
6. Ease SMT process with readymade solder balls.
7. Smallest footprint in the x-y dimensions.

FIG. 26 has a top layer that may be used for an antenna, filter or transmission line 2600. Below the top layer 2600 lies a FR4 or other dielectric ($\epsilon_r$=1 to 17) 2602. Below the dielectric material 2602 lies the coiled EBG ground plane or metamaterial substrate 2604 that may further comprise coiled EBG UE(s) 2606; via(s) 2608; a high Dk and ultra-thin (h<200 µm) dielectric material ($\epsilon_r$>10) 2610; and a conductive layer 2612. The top layer 2600 may have a solder resist covering 2614. Another dielectric or resin layer 2616 may exist along with other components 2618, an integrated circuit 2620 and solder balls 2622.

FIG. 27 depicts an LGA package Meta-AiP with a metamaterial antenna arranged at the top. This package is suitable for, but not limited to, active antenna modules such as Global Navigation Satellite System ("GNSS") antennas and wireless Front End Modules ("FEMs") such as Bluetooth Low Energy ("BLE")/WiFi FEMs).

Advantages of a Land Grid Array ("LGA") package Meta-AiP with an antenna at the top of the module include:
1. Eliminates packaging and manufacturing process costs (no post assembly for plastic encapsulation or metal shield).
2. RF shielding may be embedded inside the 3D structure during the PCB fabrication process.
3. Metamaterials antenna may be embedded on the top surface of the package.
4. LNA, SAW, filters, antenna switch, and passives can be embedded.
5. Excellent RF performance.
6. Smallest footprint in the x-y dimensions.
7. Low profile from, for example, 0.6 mm~1 mm.

FIG. 27 is a cross sectional side view of a LGA package Meta-AiP. FIG. 27 has a top layer that may be used for an antenna, filter or transmission line 2700. Below the top layer 2700 lies a FR4 or other dielectric ($\in_r$=1 to 17) 2702. Below the dielectric material 2702 lies the coiled EBG ground plane or metamaterial substrate 2704 that may further comprise coiled EBG UE(s) 2706; via(s) 2708; a high Dk and ultra-thin (h<200 μm) dielectric material ($\in_r$>10) 2710; and a conductive layer 2712. The top layer 2700 may have a solder resist covering 2714. Below the metamaterial substrate 2704 lies a FR4 or other dielectric ($\in_r$=1 to 17) 2716. Another dielectric or resin layer 2717 may exist along with other components 2718, an integrated circuit 2720.

FIG. 28 depicts a Hybrid LGA Meta-AiP with a metamaterial antenna arranged laterally. The metamaterial antenna may be integrated on one side and the embedded components may be integrated on the other side. The EBG ground plane or surface may be placed at the lowest layer while the antenna may be placed at the topmost layer. The increased separation between the EBG ground plane and the antenna helps to modify the antenna parameters. The Hybrid LGA Meta-AiP may be used for all type of complete wireless SiP modules, active antenna modules, and wireless FEMs.

Advantages of the Hybrid LGA Meta-AiP with lateral antenna include:
1. The thickness of metamaterials antenna may be increased to enhance performance.
2. Optional wireless chipset and cover can be added to the top to form a complete wireless module.
3. RF shielding can be embedded for internal structure during the PCB fabrication process.
4. LNA, SAW, filters, antenna switch, and passives can be embedded.
5. Excellent RF performance.
6. Low profile can be, for example, from 0.6 mm~1 mm for active antenna and FEM applications.

FIG. 28 is a cross sectional side view of a hybrid LGA Meta-AiP with a lateral antenna structure with the components on the top layer. FIG. 28 has a top layer that may be used for an antenna, filter or transmission line 2800. The top layer 2800 may include more than one layer as shown in FIG. 28. Below the top layer 2800 lies a FR4 or other dielectric ($\in_r$=1 to 17) 2802. Below the dielectric material 2802 lies the coiled EBG ground plane or metamaterial substrate 2804 that may further comprise coiled EBG UE(s) 2806; via(s) 2808; a high Dk and ultra-thin (h<200 μm) dielectric material ($\in_r$>10) 2810; and a conductive layer 2812. The top layer 2800 may have a solder resist covering 2814. Another FR4 or other dielectric ($\in_r$=1 to 17) layer 2816 may exist along with other embedded components 2818. Solder pads 2820 may connect to internal layers by via 2822. An integrated circuit 2824 may be encapsulated 2826.

FIG. 29 is a cross sectional side view of a hybrid LGA Meta-AiP with a lateral antenna structure without the components on the top layer. FIG. 29 has a top layer that may be used for an antenna, filter or transmission line 2900. The top layer 2900 may include more than one layer as shown in FIG. 29. Below the top layer 2900 lies a FR4 or other dielectric ($\in_r$=1 to 17) 2902. Below the dielectric material 2902 lies the coiled EBG ground plane or metamaterial substrate 2904. The coiled EGB ground plane 2904 may further comprise coiled EBG UE(s) 2906; via(s) 2908; a high K dielectric ($\in_r$>10) 2910; and a conductive layer 2912. The top layer 2900 may have a solder resist covering 2914. Another FR4 or other dielectric ($\in_r$=1 to 17) layer 2916 may exist along with other embedded components 2918. Solder pads 2920 may connect to internal layers by via 2922.

Magneto dielectric materials can also be integrated as a superstrate with the Meta-AiP as shown in FIGS. 30-33 for various type of Meta-AiP structures. The magneto dielectric material provides a high miniaturization factor ($\sqrt{\in_r \mu_r}$) with relative permittivity $\in_r$ of 2-12 and a relative permeability $\mu_r$ of 2-8. The miniaturization factor ($\sqrt{\in_r \mu_r}$) may have values ranging from 4 to 10. The magneto dielectric superstrate may further enhance the parameters of the metamaterial antenna by altering at least one property such as the antenna's gain, bandwidth, and/or efficiency.

FIG. 30 is a cross sectional side view illustrating an inverted BGA Meta-AiP integrated with a top layer magneto dielectric superstrate 3024. Below the magneto dielectric superstrate 3024 lay another layer that may be used for an antenna, filter or transmission line 3000. The layer 3000 may include more than one layer. Below the layer 3000 lies a FR4 or other dielectric ($\in_r$=1 to 17) 3002. Below the dielectric material 3002 lies the coiled EBG ground plane or metamaterial substrate 3004 that may further comprise coiled EBG UE(s) 3006; via(s) 3008; a high Dk and ultra-thin (h<200 μm) dielectric material ($\in_r$>10) 3010; and a conductive layer 3012. The top of layer 3000 may have a solder resist covering 3014. Another FR4 or other dielectric ($\in_r$=1 to 17) layer 3016 may exist along with other embedded components 3018. Solder pads 3020 may connect to internal layers by via 3022, an integrated circuit 3026 and solder balls 3028.

FIG. 31 is a cross sectional side view of a LGA Meta-AiP integrated with a top layer of magneto dielectric superstrate structure 3124. Below the magneto dielectric superstrate 3124 lies another layer that may be used for an antenna, filter or transmission line 3100. The layer 3100 may include more than one layer. Below the layer 3100 lies a FR4 or other dielectric ($\in_r$=1 to 17) 3102. Below the dielectric material 3102 lies the coiled EBG ground plane or metamaterial substrate 3104 that may further comprise coiled EBG UE(s) 3106; via(s) 3108; a high Dk and ultra-thin (h<200 μm) dielectric material ($\in_r$>10) 3110; and a conductive layer 3112. The top of layer 3100 may have a solder resist covering 3114. Another FR4 dielectric or other dielectric ($\in_r$=1 to 17) layer 3116 may exist along with other embedded components 3118. Solder pads 3120 may connect to internal layers by via 3122. A magneto dielectric material superstrate 3124 is positioned on top of the top solder resist material 3114.

FIG. 32 is a cross sectional side view of a hybrid LGA Meta-AiP integrated with a top layer of magneto dielectric superstrate structure 3224 and with components on the top layer. Below the magneto dielectric superstrate 3224 lies another layer that may be used for an antenna, filter or transmission line 3200. The layer 3200 may include more than one layer. Below the layer 3200 lies a FR4 or other dielectric ($\in_r=1$ to 17) 3202. Below the dielectric material 3202 lies the coiled EBG ground plane or metamaterial substrate 3204 that may further comprise coiled EBG UE(s) 3206; via(s) 3208; a high Dk and ultra-thin (h<200 μm) dielectric material ($\in_r>10$) 3210; and a conductive layer 3212. The top of layer 3200 may have a solder resist covering 3214. Another FR4 or other dielectric ($\in_r=1$ to 17) layer 3216 may exist along with other embedded components 3218. Solder pads 3220 may connect to internal layers by via 3222. A magneto dielectric material superstrate 3224 is positioned on top of the top solder resist material 3214. An integrated circuit 3226 may be encapsulated 3228.

FIG. 33 is a cross sectional side view of a hybrid LGA Meta-AiP integrated with a top layer of magneto dielectric material structure 3324 and with components on the top layer. Below the magneto dielectric superstrate 3324 lies another layer that may be used for an antenna, filter or transmission line 3300. The layer 3300 may include more than one layer as shown in FIG. 33. Below the layer 3300 lies a FR4 or other dielectric material ($\in_r=1$ to 17) 3302. Below the dielectric material 3302 lies the coiled EBG ground plane or metamaterial substrate 3304 that may further comprise coiled EBG UE(s) 3306; via(s) 3308; a high Dk and ultra-thin (h<200 μm) dielectric material ($\in_r>10$) 3310; and a conductive layer 3312. The top of layer 3300 may have a solder resist covering 3314. Another FR4 dielectric or other dielectric ($\in_r=1$ to 17) layer 3316 may exist along with other embedded components 3318. Solder pads 3320 may connect to internal layers by via 3322. A magneto dielectric material superstrate 3324 is positioned on top of the top solder resist material 3314.

FIG. 34 is a perspective view of a microstrip transmission line that carries 1 GHz to 6 GHz signals constructed on a conductive ground plane. A transmission line 3400 operating from 1 GHz to 6 GHz lays on a low loss dielectric substrate 3402 with a bottom layer of conductive ground plane 3404.

FIG. 35 is a cross sectional view of the microstrip transmission line that carries 1 GHz to 6 GHz signals constructed on a conductive ground plane. The transmission line 3500 is positioned on top of a low loss dielectric substrate 3502 with a bottom layer of conductive ground plane 3504. FIG. 36 is a graphical plot illustrating a S21 transmission coefficient plot of the power loss of the regular microstrip transmission line ranging from −0.07 dB to −0.14 dB.

FIG. 37 is a graph of a Smith Chart of the S11 reflection coefficient of the regular microstrip transmission line where the S11 has a dispersion impedance near the center of 50 Ohms across the 1 GHz to 6 GHz frequency range such that it would not be perfectly at 50 Ohm impedance across the frequency range.

FIG. 38 is a perspective view of a five-layer structure of microstrip transmission line that carries 1 GHz to 6 GHz constructed on a buried metamaterial substrates or substantially small sized and thinner EBG structure according to the invention.

FIG. 39 is a cross sectional view of the five-layer microstrip transmission line that carries 1 GHz to 6 GHz signals constructed on a buried metamaterial substrates or substantially small sized and thinner EBG structure 3906 according to the invention. The transmission line 3900 is positioned on top of the dielectric substrate 3902 which may comprise FR4 or some other low Dk and low dielectric loss material which in turn is positioned above a metamaterial substrate or substantially small sized and thinner EBG structure 3906 that may further comprise coiled EBG UE(s) 3904; via(s) 3908; a high Dk and ultra-thin (h<200 μm) dielectric material ($\in_r>10$) 3910; and a conductive layer 3912 according to the invention.

FIG. 40 are alternative configurations of cross sectional view of the seven-layer stripline with one side of the ground replaced by the metamaterial substrate or substantially small sized and thinner EBG structure 4014 according to the invention. FIG. 40 is a cross sectional view of the single EBG backed seven-layer stripline transmission line. In the single EBG 4014 backed stripline (four layer structure), the stripline 4000 is embedded within a substrate 4002 with a conductive plane 4004 positioned on top of the substrate 4002. An ultra-fine patterned coiled UE 4006 is positioned in the substrate 4002 and on top of an ultra-thin, high $\in_r$ dielectric material 4008. A shortening post or via 4010 connects the ultra-fine patterned coiled UE 4006 to a conductive plane 4012 by passing through the ultra-thin, high $\in_r$ dielectric material 4008. The metamaterial substrate is shown as the layers 4014 in accordance with the present invention.

FIG. 41 is a cross sectional view of the double EBG 4122 backed nine-layer stripline transmission line according to the invention. In this nine-layer embodiment, the stripline 4100 is embedded within a substrate 4102 with an ultra-fine patterned coiled UE 4104 positioned in the substrate 4102. On top of the substrate 4102 is an ultra-thin, high $\in_r$ dielectric material 4106. A shortening post or via 4108 connects the ultra-fine patterned coiled UE 4104 to a conductive plane 4110 by passing through the ultra-thin, high $\in_r$ dielectric material 4106. Likewise on the bottom of the substrate 4102, an ultra-fine patterned coiled UE 4112 is positioned in the substrate 4102 and on top of an ultra-thin, high $\in_r$ dielectric material 4120. A shortening post or via 4116 connects the ultra-fine patterned coiled UE 4112 to a conductive plane 4118 by passing through the ultra-thin, high $\in_r$ dielectric material 4120. The metamaterial substrate is shown as the layers 4122 in accordance with the present invention.

FIG. 42 is a graph illustrating the power loss of the new structure of 3-layer microstrip transmission line with the coiled metamaterial substrate at the bottom conductive plane instead of a conventional conductive ground plane. The metamaterial substrate backed microstrip transmission line shows almost lossless performance ranging from −0.009 to −0.03 dB. The improvement is more than five times lower than the regular microstrip transmission line.

The EBG-backed or 3-layer microstrip transmission line backed with the metamaterial substrate may be used to connect between an antenna element and other circuit elements, such as one or more of a balun, filter, or active semiconductor chip, in a circuit design. Such a configuration may reduce the power loss between each interconnection and to improve the overall system performance and power efficiency.

FIG. 43 is a Smith Chart of the S11 reflection coefficient of the three-layer structure of microstrip transmission line backed with the metamaterial substrate that the S11 coefficient centered at 50 Ohm impedance across the frequencies range from 1 GHz to 6 GHz. Please note the lack of dispersion shown in this Smith Chart.

FIG. 44 is a flow chart of steps of the composition and manufacturing method for the metamaterial substrate structure. In a broad sense, the steps are to first form a dielectric layer having conductive sheets or carrier foils on typically both sides, although an embodiment of the invention may consist of a dielectric layer and a single conductive or carrier sheet. The dielectric layer is formed from typically epoxy resin which may contain fillers for modification of dielectric properties, although other resins known in the art (such as polyimide, PTFE, cyanate ester, etc.) may be used. Second, the combination of foil and dielectric is formed into a foil-clad laminate under heat and pressure. Third, the upper conductive sheet or carrier may then be removed, exposing a rough surface suitable for electroless copper adhesion. Fourth, openings are then formed in the dielectric using laser or other appropriate processing, providing blind holes from the unclad surface down to the bottom side conductive sheet. Fifth, forming a via connecting the conductor layer to the bottom of the conductive plane 4406. Sixth, the drilled laminate may be coated with an ultra-thin seed conductor layer 4408. As an option, the seed conductor layer may be selectively patterned using e.g., a photosensitizer for selective catalyzation of the seed layer followed by removal of background catalyst forming a thin, insulated conductive pattern 4410. Sixth, the structure may be immersed in an electroless or electrolytic copper deposition bath to grow the thickness of the conductor layer 4412.

FIG. 45 is a cross sectional view of step one of the composition and manufacturing method for the metamaterial substrate structure. In step one, an epoxy resin 4500 with barium titanate BaTiO$_3$ in micro- and nanograins filler or other particles 4502 and with half of the desired dielectric thickness, excluding the conductor 4504, is coated on a conductive surface 4504. For example, if the desired dielectric thickness is 25 µm, a thickness of about 13 µm of the epoxy resin is coated on the conductor sheet as a non-cured resin coated conductor sheet 4506.

FIG. 46 is a cross sectional view of step two of the composition and manufacturing method for the metamaterial substrate structure. In step two, the non-cured resin coated conductor sheet 4600 is combined under high heat and high pressure to form a cured laminate 4602. The advantage of this method is to achieve much better control in thickness tolerance of the high $\in_r$ dielectric layer of the metamaterial substrate. For example, less than five (5%) percent of the thickness tolerance in the range of 0-50 µm dielectric layer creates a cured laminate 4602.

FIG. 47 is a cross sectional view of step three of the composition and manufacturing method for the metamaterial substrate structure. In step three, the top conductor 4700 can be etched off from the cured laminate achieving the desired dielectric thickness of the epoxy resin with tolerance of less than five (5%) percent.

FIGS. 48 and 49 are a cross sectional view of optional step four of the composition and manufacturing method for the metamaterial substrate structure. In step four, a shorting post or via 4800 is be formed from the etched substrate surface 4802 to connect the top coiled patterns formed in steps five to six below 4804 to the bottom conductive plane thus creating an ultra-thin and ultra-small metamaterial substrate. This metamaterial structure can further be buried into any layer of PCBs in conventional lamination processes or can be combined with electronic components.

FIG. 50 is a cross sectional view of step five of the composition and manufacturing method for the metamaterial substrate structure. In step five, an ultra-thin seed conductor layer 5000 of the coiled patterns 5002 on the epoxy resin is applied by using a coating process, e.g., spray, dip, roller, curtain, screen, or other appropriate process. The thickness of the seed conductor layer 5000 may be from 0 to 2 µm. And the seed conductor layer 5000 may form a covalent or other molecular bond with the epoxy resin if the seed conductor layer 5000 consists of a palladium or other suitable metal catalyst for electroless copper deposition. But the seed conductor layer 5000 does not need to be formed by a metal, but could be other conductive material like graphene or other conductive materials which adequately wet and penetrate the resin surface providing acceptable levels of adhesion. The benefit of this process is to achieve higher control in line and space tolerances of the coiled UE, e.g. less than five (5%) percent whereas prior art metamaterials with coiled UE are typically in the twenty (20%) percent tolerance range for in line and space tolerances.

FIG. 51 is a cross sectional view of optional step six of the composition and manufacturing method for the metamaterial substrate structure. In step six, the seed conductor layer 5100 may be selectively photosensitized and then removed as an optional step leaving only an extremely thin conductive coiled pattern on the top of the epoxy resin 5102. The remaining conductive coiled pattern may be less than 1 µm thickness (ranging from 0-1 µm) or as thin as one or a few atomic layers measured in Angstroms. The amount remaining after removal of non-photosensitized areas may form a covalent or other molecular bond to the surface of the epoxy resin for adequate adhesion of the conductive layer. Thus, the benefit of this process achieves improved control of line and space tolerances of the coiled UE, e.g. less than five (5%) percent whereas prior art of metamaterial with coiled UEs typically have twenty (20%) in line and space tolerances.

FIG. 52 is a cross sectional view of step seven of the composition and manufacturing method for the metamaterial substrate structure. In step seven, the seed conductor pattern formed in steps five and six may be immersed in a copper or other suitable electroless or electroplating solution in order to grow the thickness 5200 of the conductive coiled patterns 5202 on the top of the epoxy resin 5204 while at the same time depositing copper or other suitable conductive material in the vias formed in step four. This helps to maintain the line and space tolerance of the coiled UE, e.g. less than five (5%) percent whereas the prior art metamaterial with coiled UE typically experiences twenty (20%) percent in line and space tolerances.

While various embodiments of the invention have been described, it will be apparent to those of ordinary skill in the art that many more embodiments and implementations are possible that are within the scope of this invention.

What is claimed is:

1. An apparatus comprising a substantially small sized and thinner electromagnetic band gap structure for a predetermined band gap frequency band, said apparatus comprising:
   a. coplanar conductive unit elements that are periodically arrayed with an edge to edge spacing d between each of the adjacent said coplanar conductive unit elements forming a first layer,
   b. a dielectric having a thickness h$_r$ and a relative dielectric permittivity $\in_r$ forming a second layer,
   c. a contiguous conductive plane forming a third layer,
   d. a capacitive surface means arranged in part by the length of the outer perimeter of each of said coplanar conductive unit elements, in part by the spacing d between each of the adjacent said coplanar conductive unit elements and in part by said relative dielectric permittivity $\in_r$ of said dielectric for enabling a substantially increased distributed capacitance being electrically coupled in series between each of the adjacent said coplanar conductive unit elements in the array on said first layer,
   e. an inductive connection means arranged beside said capacitive surface means for enabling a substantially increased distributed inductance being electrically coupled in shunt between each of said coplanar conductive unit elements in the array on said first layer and said contiguous conductive plane on said third layer and with said dielectric therein, f. a composite reference plane comprising said first layer, second layer and third layer, forming a sufficient resonance circuit with said predetermined band gap frequency band including said capacitive surface means and said inductive connection means, g. a first miniature means originated from said inductive connection means for enabling a first ratio, alpha, of said thickness $h_r$ to the free space wavelength of at least one use frequency falling within said predetermined band gap frequency band, to be such that as to minimize said thickness $h_r$ while providing said sufficient resonance circuit of said composite reference plane, and h. a second miniature means originated from said capacitive surface means for enabling a second ratio, beta, of the length of at least one side of the outer perimeter of each of said coplanar conductive unit elements to the free space wavelength of at least one use frequency falling within said predetermined band gap frequency band, and a third ratio, gamma, of the spacing d to the free space wavelength of at least one use frequency falling within said predetermined band gap frequency band, to be such that as to minimize the length of the outer perimeter and the spacing d while providing said sufficient resonance circuit of said composite reference plane, whereby the electromagnetic band gap structure can be made substantially thinner and smaller in overall dimensions to integrate readily and practically with electrical circuits and microelectronic devices that have constraints in dimensions and thickness.

2. The apparatus of claim 1 further comprising a third miniature means made up with the spacing d of said second miniature means and said thickness $h_r$ of said first miniature means for establishing a fourth ratio, delta, of the spacing d to said thickness $h_r$, said ratio delta being substantially greater than 1.

3. The apparatus of claim 1 wherein each of said coplanar conductive unit elements further comprises a coplanar contiguous conductive area inside which surrounds an opening.

4. The apparatus of claim 3 wherein said opening contains at least one coplanar inductive element inside and at least one coplanar terminal electrode being centrally positioned in said opening, and wherein said coplanar contiguous conductive area and said coplanar terminal electrode are electrically connected in series by said coplanar inductive element.

5. The apparatus of claim 4 wherein said coplanar inductive element is made with at least one coplanar conductive wire structure originating from a centrally positioned origin.

6. The apparatus of claim 4 wherein said coplanar terminal electrode is electrically connected by a conductive post to said contiguous conductive plane.

7. The apparatus of claim 4 wherein said coplanar terminal electrode is a means for constituting an electrical coupling to said contiguous conductive plane through said second layer, of said dielectric, therein.

8. The apparatus of claim 1 wherein said inductive connection means comprises an opening, at least one coplanar inductive element and at least one coplanar terminal electrode inside each of said coplanar conductive unit elements on said first layer, and wherein said coplanar inductive element is positioned inside said opening and electrically connected in series between the perimeter of said opening and said coplanar terminal electrode, and wherein said coplanar terminal electrode is centrally positioned inside said opening and is a means for constituting an electrical coupling from said coplanar inductive element to said contiguous conductive plane through said dielectric therein.

9. The apparatus of claim 8 wherein said coplanar inductive element is made with at least one coplanar conductive wire structure originating from a centrally positioned origin.

10. The apparatus of claim 8 further comprises a conductive post connected between said coplanar terminal electrode and said contiguous conductive plane.

11. The apparatus of claim 1 wherein said inductive connection means comprises a terminal opening on said third layer inside said contiguous conductive plane so as to correspond to each of said coplanar conductive unit elements, a conductive post and a chip inductor, wherein said conductive post is arranged orthogonal and electrically connected between each of said coplanar conductive unit elements and either of terminals of said chip inductor at said terminal opening, and the other terminal of said chip inductor is connected to said contiguous conductive plane.

12. The apparatus of claim 1 wherein said first miniature means associated with said thickness $h_r$ is arranged to provide said first ratio alpha of less than 0.02.

13. The apparatus of claim 1 wherein said first miniature means associated with said thickness $h_r$ is arranged to provide said first ratio alpha of approximately from 0.001 to 0.0001.

14. The apparatus of claim 1 wherein said first miniature means associated with said thickness $h_r$ is arranged to provide said first ratio alpha of approximately 0.0002.

15. The apparatus of claim 1 wherein said second miniature means associated with the length of the outer perimeter is arranged to provide said second ratio beta of less than 0.1.

16. The apparatus of claim 1 wherein said second miniature means associated with the length of the outer perimeter is arranged to provide said second ratio beta of approximately from 0.01 to 0.02.

17. The apparatus of claim 1 wherein said second miniature means associated with the spacing d is arranged to provide said third ratio gamma of less than 0.01.

18. The apparatus of claim 1 wherein said second miniature means associated with the spacing d is arranged to provide said third ratio gamma of approximately from 0.001 to 0.004.

19. A signal transmission device comprising at least one conductor forming a first layer, a top dielectric forming a second layer, and a third layer that is a composite reference plane constituted by said apparatus according to claim 1, wherein the dielectric thickness $h_r$ of said composite reference plane of said third layer is equal or less than the dielectric thickness of said top dielectric of said second layer.

20. The signal transmission device of claim 19 wherein said conductor of said first layer is a transducer.

21. The signal transmission device of claim 19 wherein said conductor of said first layer is an antenna, whereby said antenna is enabled to resonate at a substantially lowered frequency band in a constrained area which is constituted by said substantially small sized and thinner electromagnetic band gap structure which provides a means to integrate with electrical circuits and microelectronic devices that have constraints in dimensions and thickness and means practical for antenna miniaturization and antenna in package devices.

22. The signal transmission device of claim 21 further comprising a magneto dielectric materials positioned on top of said antenna.

23. The signal transmission device of claim 19 wherein said conductor is a transmission line, whereby a substantially close to 50 Ohm impedance transmission line is constituted over said substantially small sized and thinner electromagnetic band gap structure which provides a means for enabling substantially lowered transmission loss, substantially lowered impedance variation and substantially lowered reflection at either terminals of said signal transmission device.

24. The signal transmission device of claim 23 further comprising an upper dielectric positioned on top of said transmission line and a contiguous conductive plane being positioned on top of said upper dielectric.

25. The signal transmission device of claim 23 further comprising an upper dielectric positioned on top of said transmission line and an upper composite reference plane being positioned on top of said upper dielectric, wherein said upper composite reference plane is a vertically flipped replication of said composite reference plane of said signal transmission device.

26. A 3D system-in-package device comprising at least one of said apparatus according to claim 1 as a composite reference plane.

27. The 3D system-in-package device of claim 26 wherein said 3D system-in-package device contains a device selected from the group consisting of antennas, transmission lines, transducers, glass substrates, silicon substrates, ceramic substrates, dielectric substrates, active silicon devices, passive components, filters, conductors and printed circuits.

28. A method of making a substantially small sized and thinner electromagnetic band gap structure for a predetermined band gap frequency band, comprising:
   a. providing an array of coplanar conductive unit elements which are periodically arrayed with an edge to edge spacing d between each of the coplanar conductive unit elements to form a first layer,
   b. providing a dielectric having a thickness $h_r$ and a relative dielectric permittivity $\in_r$ which forms a second layer,
   c. providing a contiguous conductive plane which forms a third layer,
   d. providing a capacitive surface means which is arranged in part by the length of the outer perimeter of each of the coplanar conductive unit elements, in part by the spacing d between each of the adjacent coplanar conductive unit elements and in part by said relative dielectric permittivity $\in_r$ of said dielectric for enabling a substantially increased distributed capacitance being electrically coupled in series between each of the adjacent coplanar conductive unit elements in the array on said first layer,
   e. providing an inductive connection means which is arranged beside said capacitive surface means for enabling a substantially increased distributed inductance being electrically coupled in shunt between each of the coplanar conductive unit elements in the array on said first layer and said contiguous conductive plane on said third layer and with said dielectric therein,
   f. providing a composite reference plane comprising said first layer, second layer and third layer, forming a sufficient resonance circuit with said predetermined band gap frequency band including said capacitive surface means and said inductive connection means,
   g. providing a first miniature means which is originated from said inductive connection means for enabling a first ratio, alpha, of said thickness $h_r$ to the free space wavelength of at least one use frequency falling within said predetermined band gap frequency band, to be such that as to minimize said thickness $h_r$ while providing said sufficient resonance circuit of said composite reference plane, and
   h. providing a second miniature means which is originated from said capacitive surface means for enabling a second ratio, beta, of the length of at least one side of the outer perimeter of each of the coplanar conductive unit elements to the free space wavelength of at least one use frequency falling within said predetermined band gap frequency band, and a third ratio, gamma, of the spacing d to the free space wavelength of at least one use frequency falling within said predetermined band gap frequency band, to be such that as to minimize the length of the outer perimeter and the spacing d while providing said sufficient resonance circuit of said composite reference plane,
whereby the electromagnetic band gap structure can be made substantially thinner and smaller in overall dimensions to integrate readily and practically with electrical circuits and microelectronic devices that have constraints in dimensions and thickness.

29. The method of claim 28 wherein said inductive connection means comprises an opening, at least one coplanar inductive element and at least one coplanar terminal electrode inside each of the coplanar conductive unit elements on said first layer, and wherein said coplanar inductive element is positioned inside said opening and electrically connected in series between the perimeter of said opening and said coplanar terminal electrode, and wherein said coplanar terminal electrode is centrally positioned inside said opening and is a means for constituting an electrical coupling from said coplanar inductive element to said contiguous conductive plane through said dielectric therein.

30. The method of claim 29 wherein said coplanar inductive element is made with at least one coplanar conductive wire structure originating from a centrally positioned origin.

31. The method of claim 29 further providing a conductive post which connects said coplanar terminal electrode and said contiguous conductive plane.

32. The method of claim 28 wherein said inductive connection means comprises a terminal opening on said third layer inside of said contiguous conductive plane so as to correspond to each of the coplanar conductive unit elements, a conductive post and a chip inductor, wherein said conductive post is arranged orthogonal and electrically connected between each of the coplanar conductive unit elements and either of terminals of said chip inductor at said terminal opening, and the other terminal of said chip inductor is connected to said contiguous conductive plane.

33. The method of claim 28 wherein said first miniature means associated with said thickness $h_r$ is arranged to provide said first ratio alpha of less than 0.02.

34. The method of claim 28 wherein said first miniature means associated with said thickness $h_r$ is arranged to provide said first ratio alpha of approximately from 0.001 to 0.0001.

35. The method of claim 28 wherein said second miniature means associated with the length of the outer perimeter is arranged to provide said second ratio beta of less than 0.1.

36. The method of claim 28 wherein said second miniature means associated with the length of the outer perimeter is arranged to provide said second ratio beta of approximately from 0.01 to 0.02.

37. The method of claim 28 wherein said second miniature means associated with the spacing d is arranged to provide said third ratio gamma of less than 0.01.

38. The method of claim 28 wherein said second miniature means associated with the spacing d is arranged to provide said third ratio gamma of approximately from 0.001 to 0.004.

39. The method of claim 28 further comprising a third miniature means made up with the spacing d of said second miniature means and said thickness $h_r$ of said first miniature means for establishing a fourth ratio, delta, of the spacing d to said thickness $h_r$, said ratio delta being substantially greater than 1.

40. A method of making a substantially thinner and more compact signal transmission device that has at least one substantially thinner and small sized composite reference plane, wherein the composite reference plane is a three layers structure with a predetermined band gap frequency band, comprising:
  a. providing at least one conductor which forms a first layer,
  b. providing a first dielectric which has a thickness h1 and a relative dielectric permittivity $\in_1$ to form a second layer,
  c. providing an array of coplanar conductive unit elements which are periodically arrayed with an edge to edge spacing d between each of the adjacent coplanar conductive unit elements to form a third layer,
  d. providing a base dielectric having a thickness $h_r$ and a relative dielectric permittivity $\in_r$ which forms a fourth layer,
  e. providing a contiguous conductive plane which forms a fifth layer,
  f. providing a capacitive surface means which is arranged in part by the length of the outer perimeter of each of the coplanar conductive unit elements, in part by the spacing d between each of the adjacent coplanar conductive unit elements and in part by said relative dielectric permittivity $\in_r$ of said base dielectric for enabling a substantially increased distributed capacitance being electrically coupled in series between each of the adjacent coplanar conductive unit elements in the array on said third layer,
  g. providing an inductive connection means which is arranged beside said capacitive surface means for enabling a substantially increased distributed inductance being electrically coupled in shunt between each of the coplanar conductive unit elements in the array on said third layer and said contiguous conductive plane on said fifth layer and with said base dielectric therein,
  h. providing at least one composite reference plane which is arranged by a three layers structure comprising said third layer, fourth layer and fifth layer, forming a sufficient resonance circuit with said predetermined band gap frequency band including said capacitive surface means and said inductive connection means,
  i. providing a first miniature means which is originated from said inductive connection means for enabling a first ratio, alpha, of said thickness $h_r$ to the free space wavelength of at least one use frequency falling within said predetermined band gap frequency band of said composite reference plane, to be such that as to minimize thickness $h_r$ while providing said sufficient resonance circuit of said composite reference plane, and
  j. providing a second miniature means which is originated from said capacitive surface means for enabling a second ratio, beta, of the length of at least one side of the outer perimeter of each of the coplanar conductive unit elements to the free space wavelength of at least one use frequency falling within said predetermined band gap frequency band, and a third ratio, gamma, of the spacing d to the free space wavelength of at least one use frequency falling within said predetermined band gap frequency band of said composite reference plane, to be such that as to minimize the length of the outer perimeter and the spacing d while providing said sufficient resonance circuit of said composite reference plane.

41. The method of claim 40 wherein said thickness $h_r$ of said base dielectric is equal or less than said thickness h1 of said first dielectric of said second layer.

42. The method of claim 40 wherein said inductive connection means comprises an opening, at least one coplanar inductive element and at least one coplanar terminal electrode inside each of the coplanar conductive unit elements on said third layer, and wherein said coplanar inductive element is positioned inside said opening and electrically connected in series between the perimeter of said opening and said coplanar terminal electrode, and wherein said coplanar terminal electrode is centrally positioned inside said opening and is a means for constituting an electrical coupling from said coplanar inductive element to said contiguous conductive plane through said base dielectric therein.

43. The method of claim 42 wherein said coplanar inductive element is made with at least one coplanar conductive wire structure originating from a centrally positioned origin.

44. The method of claim 42 further providing at least one conductive post which connects said coplanar terminal electrode and said contiguous conductive plane.

45. The method of claim 40 wherein said first miniature means associated with said thickness $h_r$ is arranged to provide said first ratio alpha of less than 0.02.

46. The method of claim 40 wherein said first miniature means associated with said thickness $h_r$ is arranged to provide said first ratio alpha of approximately from 0.001 to 0.0001.

47. The method of claim 40 wherein said second miniature means associated with the length of the outer perimeter is arranged to provide said second ratio beta of less than 0.1.

48. The method of claim 40 wherein said second miniature means associated with the length of the outer perimeter is arranged to provide said second ratio beta of approximately from 0.01 to 0.02.

49. The method of claim 40 wherein said second miniature means associated with the spacing d is arranged to provide said third ratio gamma of less than 0.01.

50. The method of claim 40 wherein said second miniature means associated with the spacing d is arranged to provide said third ratio gamma of approximately from 0.001 to 0.004.

51. The method of claim 40 wherein said conductor of said first layer is a transducer.

52. The method of claim 40 wherein said conductor of said first layer is an antenna, whereby said antenna is enabled to resonate at a substantially lowered frequency band in a constrained area which is constituted by said substantially thinner and more compact signal transmission device with said predetermined band gap frequency band which provides a means to integrate with electrical circuits and microelectronic devices that have constraints in dimensions and thickness and means practical for antenna miniaturization and antenna in package devices.

53. The method of claim 52 further providing a magneto dielectric materials positioned on top of said antenna.

54. The method of claim 40 wherein said conductor of said first layer is a transmission line, whereby a substantially close to 50 Ohm impedance transmission line is constituted over said substantially thinner and more compact signal transmission device with said predetermined band gap frequency band which provides a means for enabling substantially lowered transmission loss, substantially lowered impedance variation and substantially lowered reflection at either terminals of said signal transmission device.

55. The method of claim 54 further providing an upper dielectric positioned on top of said transmission line and a contiguous conductive plane positioned on top of said upper dielectric.

56. The method of claim 54 further providing an upper dielectric positioned on top of said transmission line and an upper composite reference plane positioned on top of said upper dielectric, wherein said upper composite reference plane is a vertically flipped replication of said composite reference plane of the signal transmission device.

57. The method of claim 40 further comprising a third miniature means made up with the spacing d of said second miniature means and said thickness $h_r$ of said first miniature means for establishing a fourth ratio, delta, of the spacing d to said thickness $h_r$, said ratio delta being substantially greater than 1.

* * * * *